US007330050B2

(12) United States Patent
Redgrave

(10) Patent No.: US 7,330,050 B2
(45) Date of Patent: Feb. 12, 2008

(54) STORAGE ELEMENTS FOR A CONFIGURABLE IC AND METHOD AND APPARATUS FOR ACCESSING DATA STORED IN THE STORAGE ELEMENTS

(75) Inventor: Jason Redgrave, Mountain View, CA (US)

(73) Assignee: Tabula, Inc., Santa Clara, CA (US)

( * ) Notice: Subject to any disclaimer, the term of this patent is extended or adjusted under 35 U.S.C. 154(b) by 214 days.

(21) Appl. No.: 11/082,203

(22) Filed: Mar. 15, 2005

(65) Prior Publication Data

US 2007/0241775 A1   Oct. 18, 2007

Related U.S. Application Data

(60) Provisional application No. 60/626,322, filed on Nov. 8, 2004.

(51) Int. Cl.
*G06F 7/38* (2006.01)
*H03K 19/173* (2006.01)

(52) U.S. Cl. ............... 326/38; 326/37; 326/41; 326/47; 327/57; 365/189.02; 365/230.02

(58) Field of Classification Search ............ 326/37–41, 326/47; 327/51–57; 365/189.02, 189.05, 365/230.02, 230.03
See application file for complete search history.

(56) References Cited

U.S. PATENT DOCUMENTS

| 4,873,459 | A | 10/1989 | El Gamal et al. |
|---|---|---|---|
| 5,245,575 | A | 9/1993 | Sasaki et al. |
| 5,349,250 | A | 9/1994 | New |
| 5,357,153 | A | 10/1994 | Chiang et al. |
| 5,365,125 | A | 11/1994 | Goetting et al. |
| 5,369,622 | A | 11/1994 | McLaury |
| 5,426,378 | A | 6/1995 | Ong |
| 5,521,835 | A | 5/1996 | Trimberger |
| 5,532,958 | A | 7/1996 | Jiang et al. |
| 5,552,721 | A | 9/1996 | Gould |
| 5,610,829 | A | 3/1997 | Trimberger |
| 5,631,578 | A | 5/1997 | Clinton et al. |
| 5,646,544 | A | 7/1997 | Iadanza |
| 5,659,484 | A | 8/1997 | Bennett et al. |
| 5,682,107 | A | 10/1997 | Tavana et al. |
| 5,692,147 | A | 11/1997 | Larsen et al. |
| 5,694,057 | A | 12/1997 | Gould |
| 5,719,889 | A | 2/1998 | Iadanza |

(Continued)

OTHER PUBLICATIONS

U.S. Appl. No. 11/081,859, filed Mar. 15, 2006, Tieg.
U.S. Appl. No. 11/081,855, filed Mar. 15, 2006, Schmit.
U.S. Appl. No. 11/082,230, filed Mar. 15, 2006, Redgrave.
U.S. Appl. No. 11/081,877, filed Mar. 15, 2006, Teig.
U.S. Appl. No. 11/082,196, filed Mar. 15, 2006, Teig.

(Continued)

*Primary Examiner*—Rexford Barnie
*Assistant Examiner*—Jason Crawford
(74) *Attorney, Agent, or Firm*—Adeli & Tollen LLP

(57) ABSTRACT

Some embodiments provide a circuit for accessing stored data in a configurable IC that includes several configurable circuits. The IC also includes several storage circuits. Each storage circuit has (1) several storage elements for storing data for the configurable circuits, and (2) output circuitry for outputting data stored in the storage elements. The output circuitry includes a first set of interconnects for receiving at least a first repeating periodic signal and for periodically outputting data from at least two storage elements to the configurable circuits.

28 Claims, 35 Drawing Sheets

U.S. PATENT DOCUMENTS

| | | |
|---|---|---|
| 5,732,246 A | 3/1998 | Gould et al. |
| 5,737,235 A | 4/1998 | Kean et al. |
| 5,745,422 A | 4/1998 | Iadanza |
| 5,745,734 A | 4/1998 | Craft et al. |
| 5,764,954 A | 6/1998 | Fuller et al. |
| 5,768,178 A | 6/1998 | McLaury |
| 5,777,360 A | 7/1998 | Rostoker et al. |
| 5,802,003 A | 9/1998 | Iadanza et al. |
| 5,815,726 A | 9/1998 | Cliff |
| 5,889,411 A | 3/1999 | Chaudhary |
| 5,914,616 A | 6/1999 | Young et al. |
| 5,914,906 A | 6/1999 | Iadanza et al. |
| 6,002,991 A | 12/1999 | Conn, Jr. |
| 6,023,421 A | 2/2000 | Clinton et al. |
| 6,038,192 A | 3/2000 | Clinton et al. |
| 6,044,031 A | 3/2000 | Iadanza et al. |
| 6,054,873 A | 4/2000 | Laramie |
| 6,069,490 A | 5/2000 | Ochotta et al. |
| 6,075,745 A | 6/2000 | Gould et al. |
| 6,086,631 A | 7/2000 | Chaudhary et al. |
| 6,091,263 A | 7/2000 | New et al. |
| 6,091,645 A | 7/2000 | Iadanza |
| 6,107,821 A | 8/2000 | Kelem et al. |
| 6,110,223 A | 8/2000 | Southgate et al. |
| 6,118,707 A | 9/2000 | Gould et al. |
| 6,130,854 A | 10/2000 | Gould et al. |
| 6,134,154 A | 10/2000 | Iwaki et al. |
| 6,140,839 A | 10/2000 | Kaviani et al. |
| 6,150,838 A | 11/2000 | Wittig et al. |
| 6,163,168 A | 12/2000 | Nguyen et al. |
| 6,172,521 B1 | 1/2001 | Motomura |
| 6,173,379 B1 | 1/2001 | Poplingher et al. |
| 6,175,247 B1 | 1/2001 | Scalera et al. |
| 6,184,707 B1 | 2/2001 | Norman et al. |
| 6,184,709 B1 | 2/2001 | New |
| 6,205,076 B1 | 3/2001 | Wakayama |
| 6,233,191 B1 | 5/2001 | Gould et al. |
| 6,275,064 B1 | 8/2001 | Agrawal et al. |
| 6,292,019 B1 | 9/2001 | New et al. |
| 6,326,807 B1 | 12/2001 | Veenstra et al. |
| 6,346,824 B1 | 2/2002 | New |
| 6,348,813 B1 | 2/2002 | Agrawal et al. |
| 6,381,732 B1 | 4/2002 | Burnham et al. |
| 6,411,128 B2 * | 6/2002 | Maeda ..................... 326/125 |
| 6,430,736 B1 | 8/2002 | Levi et al. |
| 6,469,540 B2 | 10/2002 | Nakaya |
| 6,469,553 B1 | 10/2002 | Sung et al. |
| 6,487,709 B1 | 11/2002 | Keller et al. |
| 6,490,707 B1 | 12/2002 | Baxter |
| 6,496,918 B1 | 12/2002 | Dehon et al. |
| 6,515,509 B1 | 2/2003 | Baxter |
| 6,526,559 B2 | 2/2003 | Schiefele et al. |
| 6,529,040 B1 | 3/2003 | Carberry et al. |
| 6,545,501 B1 | 4/2003 | Bailis et al. |
| 6,593,771 B2 | 7/2003 | Bailis et al. |
| 6,601,227 B1 | 7/2003 | Trimberger |
| 6,603,330 B1 | 8/2003 | Snyder |
| 6,629,308 B1 | 9/2003 | Baxter |
| 6,636,070 B1 | 10/2003 | Altaf |
| 6,642,744 B2 | 11/2003 | Or-Bach et al. |
| 6,650,142 B1 | 11/2003 | Agrawal et al. |
| 6,667,635 B1 | 12/2003 | Pi et al. |
| 6,668,361 B2 | 12/2003 | Bailis et al. |
| 6,675,309 B1 | 1/2004 | Baxter |
| 6,714,041 B1 | 3/2004 | Darling et al. |
| 6,732,068 B2 * | 5/2004 | Sample et al. ................. 703/24 |
| 6,806,730 B2 | 10/2004 | Bailis et al. |
| 6,809,979 B1 | 10/2004 | Tang |
| 6,831,479 B2 | 12/2004 | Lo |
| 6,838,902 B1 | 1/2005 | Elftmann et al. |
| 6,894,527 B1 | 5/2005 | Donlin et al. |
| 6,911,842 B1 * | 6/2005 | Ghia et al. ..................... 326/41 |
| 6,920,627 B2 | 7/2005 | Blodget et al. |
| 6,924,663 B2 | 8/2005 | Masui et al. |
| 6,937,535 B2 | 8/2005 | Ahn et al. |
| 6,956,399 B1 | 10/2005 | Bauer |
| 6,992,505 B1 | 1/2006 | Zhou |
| 6,998,872 B1 | 2/2006 | Chirania et al. |
| 7,010,667 B2 | 3/2006 | Vorbach et al. |
| 7,028,281 B1 | 4/2006 | Agrawal et al. |
| 7,061,941 B1 * | 6/2006 | Zheng ........................ 370/535 |
| 7,075,333 B1 | 7/2006 | Chaudhary et al. |
| 7,088,136 B1 | 8/2006 | Lewis |
| 7,126,372 B2 | 10/2006 | Vadi et al. |
| 7,126,856 B2 | 10/2006 | Sun et al. |
| 7,129,746 B1 | 10/2006 | Balasubramanian et al. |
| 2001/0007428 A1 | 7/2001 | Young et al. |
| 2002/0008541 A1 | 1/2002 | Young et al. |
| 2002/0113619 A1 | 8/2002 | Wong |
| 2002/0125910 A1 | 9/2002 | New et al. |
| 2002/0125914 A1 | 9/2002 | Kim |
| 2002/0161568 A1 * | 10/2002 | Sample et al. ................. 703/25 |
| 2002/0163357 A1 | 11/2002 | Ting |
| 2003/0042931 A1 | 3/2003 | Ting |
| 2003/0080777 A1 | 5/2003 | Baxter |
| 2003/0110430 A1 | 6/2003 | Bailis et al. |
| 2004/0010767 A1 | 1/2004 | Agrawal et al. |
| 2004/0103265 A1 | 5/2004 | Smith |
| 2004/0196066 A1 | 10/2004 | Ting |
| 2004/0233758 A1 | 11/2004 | Kim et al. |
| 2005/0007155 A1 | 1/2005 | Young |
| 2005/0134308 A1 | 6/2005 | Okada et al. |
| 2006/0250168 A1 | 11/2006 | Starr et al. |

OTHER PUBLICATIONS

U.S. Appl. No. 11/082,201, filed Mar. 15, 2006, Schmit.

IBM, "Cell Broadband Engine Architecture, Version 1.0," Aug. 8, 2005, pp. 1-319.

"Design for Low Power in Actel Antifuse FPGAs", Actel Application Note, 2000 Actel Corporation, Sep. 2000, pp. 1-8.

Cong. J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.

Snider, G., "Performance-Constrained Pipelining of Software Loops onto Reconfigurable Hardware," *FPGA '02*, Feb. 24-26, 2002, pp. 177-186, ACM, Monterey, California, USA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Singh, A., et al., "Interconnect Pipelining in a Throughput-Intensive FPGA Architecture," *FPGA 2001*, Feb. 11-13, 2001, pp. 153-160, ACM, Monterey, CA, USA.

Markovskiy, Y., et al., "Analysis of Quasi-Static Scheduling Techniques in a Virtualized Reconfigurable Machine," *FPGA '02*, Feb. 24-26, 2002, ACM, Monterey, California, USA.

Caspi, E., et al., "Stream Computations Organized for Reconfigurable Executiion (SCORE): Introduction and Tutorial," Aug. 25, 2000, pp. 1-31, Version 1.0.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, California.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California.

Plunkett, B., "In Search of the SDR Holy Grail," *A Technology Application Whitepaper*, Apr. 28, 2004 but © 2003, pp. 1-7, QuickSilver Technology, Inc., San Jose, California.

Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, California.

Master, P., "The Next Big Leap in Reconfigurable Systems," *A Technology Vision Whitepaper*, Apr. 28, 2004 but © 2003, pp. 1-8, QuickSilver Technology, Inc., San Jose, California.

QuickSilver Technology, Inc., "Adapt2000 ACM System Platform," Apr. 2004, pp. 1-39, QuickSilver Technology, Inc., San Jose, California.

Gayasen, A., et al., "Reducing Leakage Energy in FPGAs Using Region-Constrained Placement," *FPGA '04*, Feb. 22-24, 2004, pp. 51-58, ACM, Monterey, California USA.

Davare, A., et al., "The Best of Both Worlds: The Efficient Asynchronous Implementation of Synchronous Specifications," *DAC '04*, Jun. 7-11, 2004, ACM, San Diego, California, USA.

Morris, K., "Rationalizing Reconfigurability: The Importance of Being Programmable," *FPGA and Structured ASIC Journal*, Sep. 27, 2005.

Tom, M., et al., "Logic Block Clustering of Large Designs for Channel-Width Constrained FPGAs," *DAC 2005*, Jun. 13-17, 2005, pp. 726-731, ACM, Anaheim, California, USA.

Nelson, B.E., "Reconfigurable Computing: An Introduction and Overview," Sep. 23, 1998, pp. 1-43.

Dehon, A., "The Density Advantage of Configurable Computing," Apr. 2000, pp. 41-49, IEEE.

Hofstee, H.P., "Cell Broadband Engine Architecture from 20,000 Feet," Aug. 24, 2005, pp. 1-6.

IBM, "SPU C/C++ Language Extensions, Version 2.0" *CBEA JSRE Series*, Aug. 1, 2005, pp. iv-84, USA.

IBM, "Synergistic Processor Unit Instruction Set Architecture, Verison 1.0," Aug. 1, 2005, pp. 1-257, USA.

IBM, "SPU Assembly Language Specification, Version 1.2," *CBEA JSRE Series*, Aug. 1, 2005, pp. iii-22, USA.

Backus, J., "Can Programming be Liberated from the Von Neumann Style? A Functional Style and its Algebra of Programs," *Communications of the ACM*, Aug. 1978, pp. 613-641, vol. 21, No. 8, ACM.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Weaver, N., et al., "The SFRA: A Corner-Turn FPGA Architecture," *FPGA '04*, Feb. 22-24, 2004, ACM, Monterey, California, USA.

Xilinx, Inc., "Virtex-4 Family Overview," *Advance Product Specification*, Sep. 10, 2004, pp. 21-30, v1.1, Xilinx, Inc.

Schmit, H., et al., "FPGA Switch Block Layout and Evaluation," *FPGA '02*, Feb. 24-26, 2002, ACM, Monterey, California, USA.

Lemieux, G., et al., "Using Sparse Crossbars within LUT Clusters," *FPGA 2001*, Feb. 11-13, 2001, ACM, Monterey, CA.

Caspi, E., et al., "A Streaming Multi-Threaded Model," *MSP-3*, Dec. 2, 2001, pp. 1-23.

Altera Corp., "6. DSP Blocks in Stratix II Devices," *SII52006-1.0*, Feb. 2004, pp. 1-32.

Altera, "Stratix II DSP Performance," *White Paper*, Feb. 2004, pp. 1-9, ver. 1.0, Altera Corporation, San Jose, CA.

Dehon, A., et al., "DPGA-Coupled Microprocessors: Commodity ICs for the Early 21st Century," *FCCM '94-IEEE Workshop on FPGAs for Custom Computing Machines*, Apr. 10-13.

Compton, K., et al., "Reconfigurable Computing: A Survey of Systems and Software," *ACM Computing Surveys*, Jun. 2002, pp. 171-210, vol. 34, No. 2, ACM, New York, NY.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

Tau, E., et al., "Transit Note #114: A First Generation DPGA Implementation," *M.I.T. Transit Project*, Jan. 1995, pp. 1-8.

Dehon, A., "Transit Note #121: Notes on Programmable Interconnect," *M.I.T. Transit Project*, Feb. 1995, pp. 1-13.

Perissakis, S., et al., "Embedded DRAM for a Reconfigurable Array," *Proceedings of the 1999 Symposium on VLSI Circuits*, Jun. 1999.

Dehon, A., Balancing Interconnect and Computation in a Reconfigurable Computing Array (or, why don't you really want 100% LUT utilization). pp. 1-10. (Applicants believe that this article also appears in *Proceedings of the International Symposium on Field Programmable Gate Arrays*, Feb. 1999, pp. 125-134).

Tsu, W., et al., "HSRA: High-Speed, Hierarchical Synchronous Reconfigurable Array," pp. 1-10, ( Applicants believe that this also appears in *Proceedings of the International Symposium on Field Programmable Gate Arrays*, Feb. 1999, pp. 69-78.).

Dehon, A., "Dynamically Programmable Gate Arrays: A Step Toward Increased Computational Density," *Proceedings of the Fourth Canadian Workshop on Field-Programmable Devices*, May 1996, pp. 47-54.

Mirsky, E., et al., "MATRIX: A Reconfigurable Computing Architecture with Configurable Instruction Distribution and Deployable Resources," *Proceedings of the IEEE Workshop on FPGAs for Custom Computing Machines*, Apr. 1996.

Tau, E., et al., "A First Generation DPGA Implementation," *Proceedings of the Third Canadian Workshop on Field-Programmable Devices*, May 1995, pp. 138-143.

Dehon, A., et al., "Design Patterns for Reconfigurable Computing," *Proceedings of the IEEE Symposium on Field-Programmable Custon Computing Machines*, Apr. 2004.

Wawrzynek, J., "EECS150-Digital Design: Lecture 5—Field Programmable Gate Arrays (FPGAs)," Feb. 4, 2002, pp. 1-4, slides 1-20, multiple slides per page.

"The Xilinx Virtex Series FPGA," Jan. 22, 2001, slides 1-22.

Dehon, A., "Reconfigurable Architectures for General-Purpose Computing," *A.I. Technical Report No. 1586*, Oct. 1996, pp. i-353.

U.S. Appl. No. 11/081,859, filed Mar. 15, 2005, Teig, et al., Non-Final Rejection mailed Oct. 2, 2006 of Related Application.

U.S. Appl. No. 11/081,855, filed Mar. 15, 2005, Schmit, et al., Non-Final Rejection mailed Nov. 16, 2006 of Related Application.

U.S. Appl. No. 11/082,230, filed Mar. 15, 2005, Redgrave, Non-Final Rejection mailed Oct. 3, 2006 of Related Application.

U.S. Appl. No. 11/082,196, filed Mar. 15, 2005, Teig, et al., Non-Final Rejection mailed Nov. 21, 2006 of Related Application.

U.S. Appl. No. 11/081,859, filed Mar. 15, 2005, Teig, et al.

U.S. Appl. No. 11/081,877, filed Mar. 15, 2005, Teig, et al.

"§3 Programmable Logic Devices," *Digital System Design*, 2001 Month N/A, slides 3.1-3.28.

"The Effect of SRAM Table Sharing and Cluster Size on FPGA Area", NPL Date Unknown, pp.1-10.

"Unifying Sequential and Spatial Computing with a Single Instruction Set Architecture," *ISCA '04*, Jun. 19-23, 2004, ACM. Munchen. Oberbayern, Germany.

Agrawal, O., et al., "An Innovative, Segmented High Performance FPGA Family with Variable-Grain-Agriculture, and Wide-gating Functions," *FPGA 99*, Feb. 1999, pp. 17-26, ACM, Monterey, California, USA.

Ahmed, E., et al., "The Effect of LUT and Cluster Size on Deep-Submicron FPGA Performance and Density," *FPGA 2000*, Feb. 2000, ACM, Monterey, California, USA.

Amerson, R., et al., "Plasma: An FPGA for Million Gate Systems," *Proceedings of the 1996 ACM 4 th International Symposium on FPGAs*, Feb. 11-13, 1996, pp. 10-16, Monterey, California, USA.

Barker, R., "QuickSilver ACM SilverStream Design Methodology with the Inspire SDK Tool set," *A Technology Application Whitepaper*, Jan. 26, 2004, pp. 1-8, QuickSilver Technology, Inc., San Jose, California, USA.

Butts, M., "Future Directions of Dynamically Reprogrammable Systems," *IEEE 1995 Custom Integrated Circuits Conference*, May 1995, pp. 487-497, IEEE.

Camposano, R., "The Growing Semiconductor Zoo: ASICs CSSP, ASSP, ASIP, Structured Arrays, FPGAs Processor Arrays, Platforms...and Other Animalia," Aug. 29, 2003, pp. 1-74, Synopsys, Inc.

Compton, K., et al., "An Introduction to Reconfigurable Computing", *IEEE Computer*, Apr. 2000.

Dehon, A., "DPGA Utilization and Application," *Proceedings of the 1996 ACM Fourth International Symposium on Field-Programmable Gate Arrays FPGA*, Feb. 11-13, 1996, Monterey, California, USA.

Dehon, A., et al., "Reconfigurable Computing: What, Why, and Implications for Design Automation," *DAC 1999*, Jun. 1999, ACM, New Orleans, Louisiana.

Enzler, R., et al., "Virtualizing Hardware with Multi-Context Reconfigurable Arrays," *Lecture Notes in Computer Science*, Sep. 2003, pp. 151-160.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California, Berkeley*, Fall 2000 Month N/A, pp. 1-190.

Giraud-Carrier, C., "A Reconfigurable Data Flow Machine for Implementing Functional Programming Lanuages," *SIGPLAN Notices*, Sep. 1994, vol. 29 (9): 22-28.

Goldstein, S.C., et al., "PipeRench: A Coprocessor for Streaming Multimedia Acceleration," *International Symposium on Computer Architecture (ISCA)*. May 1999, pp. 28-39.

Goldstein, S.C., et al., "PipeRench: A Reconfigurable Architecture and Compiler," Apr. 2000, pp. 70-77, IEEE.

Hauck, S., et al., "Montage: An FPGA for Synchronous and Asynchronous Circuits," *Field Programmable Gate Arrays: Architectures and Tools for Rapid Protoyping*, 1993 Month N/A, Springer-Verlag, Berlin.

Hauck, S., et al., "Totem: Domain-Specific Reconfigurable Logic," *IEEE Transactions on VLSI Systems*, 2006 Month N/A, pp. 1-25.

IBM, "SPU Application Binary Interface Specification, Version 1.3," *CBEA JSRE Series*, Aug. 1, 2005, pp. iv-26, USA.

Kaviani, A., et al., "Computational Field Programmable Architecture," *Custom Integrated Circuits Conference, Proceedings of the IEEE 1998*, May 11-14, 1998.

Kaviani, A., et al., "Hybrid FPGA Architecture," *Proceedings of the 1996 ACM Fourth International Symposium on Field-Programmable Gate Arrays*. Feb. 11-13, 1996, pp. 3-9, Monterey, California, USA.

Keutzer, K., "Overview of "configurable"architectures," Feb. 28, 2002, slides 1-29.

Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.

Lehn, D.I., et al., "Evaluation of Rapid Context Switching on a CSRC Device, " *Proceedings of the International Conference on Engineering of Reconfigurable Systems and Algorithms*, Jun. 24-27, 2002.

Lemieux, G., et al., "Generating Highly-Routable Sparse Crossbars for PLDs, " *FPGA 2000*, Feb. 2000, ACM, Monterey, California, USA.

Lertora, F., et al., "Handling Different Computational Granularity by a Reconfigurable IC Featuring Embedded FPGAs and a Network-On-Chip," *13th Annual IEEE Symposium on Field-Programmable Custom Computing Machines (FCCM 2005) 2005*. Apr. 18-20, 2005.

Lewis, D., et al., "The Stratix-II Routing and Logic Architecture," *Proceedings of the 2005 ACM/SIGDA 13th International Symposium on Field-Programmable Gate Arrays*, Feb. 20-22, 2005, pp. 1-22, Monterey, California, USA.

Ling, A., "The Search for the Optimal FPGA Logic Block," 2001 Month N/A, ACM.

M2000, "FlexEOS Embedded FPGA Cores," 2003 Month N/A. M2000.

Mathstar, Inc., "MathStar FPOA Architecture: A New Approach to High Throughput, Scalable, and Reprogrammable Design," *Technology Overview*, 2003 Month N/A, MathStar, Inc.

Mirsky, E., et al., "Matrix: A Reconfigurable Computing Device with Configurable Instruction Distribution (Extended Abstract)," *Hot chips Symposium 1997*, Aug. 1997.

Morris, K., "Lattice Launches XP: Non-Volatility at the Forefront of FPGA," *FPGA and Programmable Logic Journal*, Mar. 1, 2005, pp. 1-5, Techfocus Media, Inc.

Niedzielski, D., "An Overview of Reconfigurable Computing," NPL Date Unknown.

Ochotta, E. S., et al., "A Novel Predictable Segmented FPGA Routing Architecture," *FPGA 98*, Feb. 1998, pp. 3-11, ACM, Monterey, California, USA.

Parhami, B., "Part IV: low-Diameter Architectures," *ECE 254B: Advanced Computer Architecture: Parallel Processing. UCSB*, Spring 2005 Month N/A, slides 1-93, Behrooz Parhami, Santa Barbara, California, USA.

Pedram, M., et al., "A New Design for Double Edge Triggered Flip-flops," Feb. 10-13, 1998.

Pedram, M., "IEEE Circuits and Systems Society Distinguished Lecturer Program," NPL Date Unknown.

Perissakis, S., et al., "Embedded DRAM for a Reconfigurable Array, " *Proceedings of the 1999 Symposium on VLSI Circuits*, Jun. 1999, slides 1-24.

Plunkett, B., et al., "Adapt2400 ACM Architecture Overview," *Technology Whitepaper*, 2004 Month N/A, pp. 1-9, QuickSliver Technology, Inc.

QuickLogic Corp., "Ultra-Low Power FPGA Combining Performance, Density, and Embedded RAM," *Eclipse II Family Data Sheet*, Nov. 2005, pp. 1-92, QuickLogic Corporation, USA.

Quicksilver Technology, Inc., "InSpire SDK Tool Set," *Product Brief*, 2004Month N/A QuickSilver Technology, Inc., San Jose, California, USA.

Quicksilver Technology, Inc., "QS2412 Adaptive Computing Machine," *Product Brief*, 2004 Month N/A; QuickSilver Technology, Inc.. San Jose, California, USA.

Rose, J., "Hard vs Soft: The Central Question of Pre-Fabricated Silicon," *34th International Symposium on Multiple-Valued Logic (ISMVL '04)*, May 2004, pp. 2-5.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont, P., et al., "Quick Safari Through the Reconfiguration Jungle," *38th Design Automation Conference*, Jun. 2001, pp. 172-177, Las Vegas, Nevada, USA.

Schmit, H., "Extra-Dimensional Island-Style FPGAs," *Field Programmable Logic and Application (FPL 2003)*, sep. 2003, pp. 406-415.

Schmit, H., "Extra-dimensional Island-Style FPGAs," *Proceedings of the 5th IEEE Symposium on FPGA-Based custom Computing Machines*, Apr. 16-18, 1997.

Schmit, H., "Incremental Reconfiguration for Pipelined Applications," *Proceedings of the 5th IEEE Symposium on FPGA-Based Custom Computing Machines*, Apr. 16-18, 1997.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002.

Sharma, A., et al., "Accelerating FPGA Routing Using Architecture-Adaptive A" *Proceedings of the IEEE Conference on Field-Programmable Technology 2005*, Dec. 11-14, 2005.

Slade, A.L., et al., "Reconfigurable Computing Application Frameworks," *11th Annual IEEE Symposium on Field-Programmable Custom Computer Machines*, Apr. 9-11, 2003.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, ACM, Monterey, California, USA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs," *Univsersity of British Columbia Department of Electrical and Computer Engineering*, Jun. 2005, slides 1-39, Vancouver, British Columbia, Canada.

Trimberger, S., "Effects of FPGA Architecture of FPGA Routing," *32nd ACM/IEEE Design Automation Conference*, Jun. 1995, ACM.

Wilton, S.J.E., "Memory-to-Memory Connection Structures in FPGA s with Embedded Memory Arrays," FPGA 97, Feb. 1997, pp. 10-16, ACM, Monterey, California, USA.

Zilic, Z. et al., "Using BDDs to Design ULM for FPGAs" *Proceedings of the 1996 ACM Fourth International Symposium on Field-Programmable Gate Arrays (FPGA '96)*, Feb. 11-13, 1996, pp. 1-10, Monterey, California, USA.

Zuchowski, P.S., "A Hybrid ASIC and FPGA Architecture," 2002 Month N/A, IEEE.

* cited by examiner

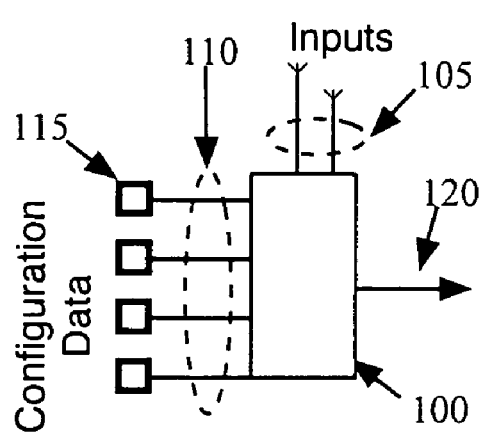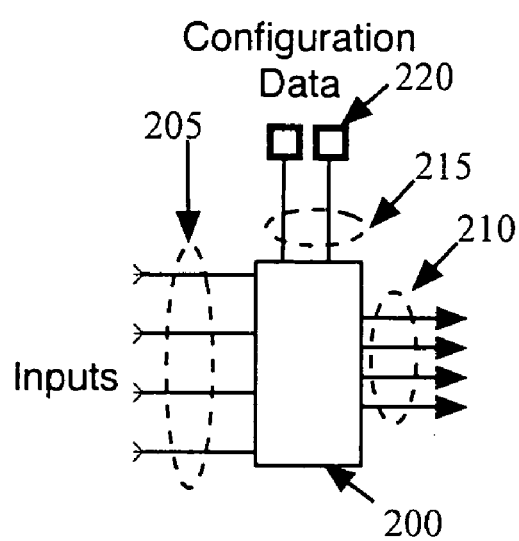
*Figure 1*
*Prior Art*
*Figure 2*
*Prior Art*

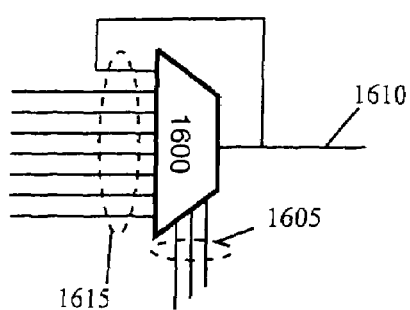
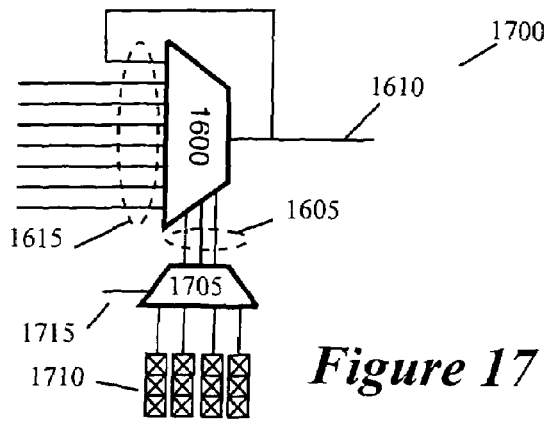
*Figure 16*
*Figure 17*
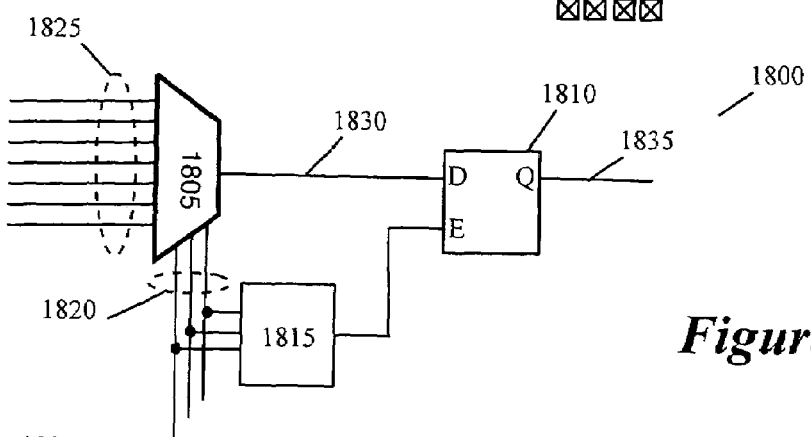
*Figure 18*
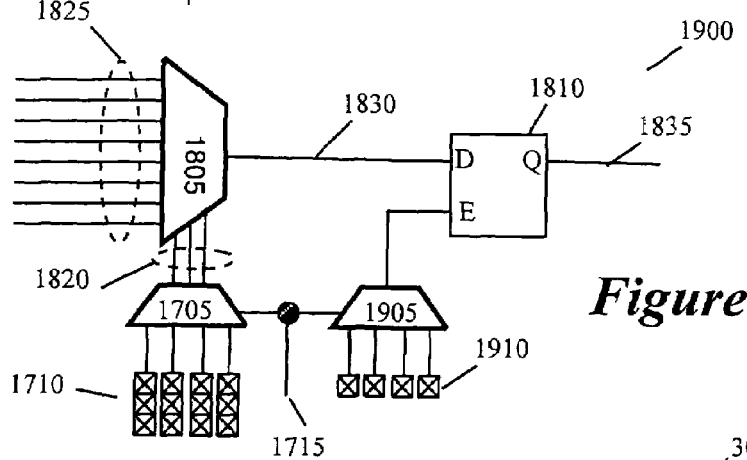
*Figure 19*
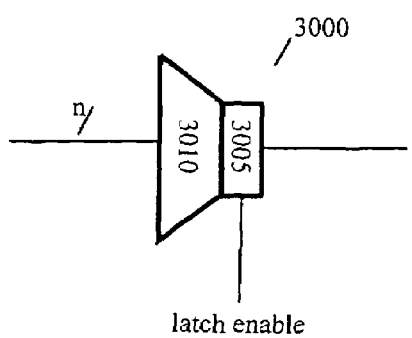
*Figure 30*

⊠—Interconnect/Storage Circuit

STORAGE ELEMENTS FOR A CONFIGURABLE IC AND METHOD AND APPARATUS FOR ACCESSING DATA STORED IN THE STORAGE ELEMENTS

CLAIM OF BENEFIT TO PRIOR APPLICATION

This Application claims benefit of an earlier-filed U.S. Provisional Patent Application 60/626,322, entitled "Configurable Circuits, IC's and Systems," filed Nov. 8, 2004, which is incorporated herein by reference.

CROSS REFERENCE TO RELATED APPLICATIONS

This Application is related to the following applications with the same filing date: U.S. patent application Ser. No. 11/081,855, filed Mar. 15, 2005; U.S. patent application Ser. No. 11/082,230, filed Mar. 15, 2005; U.S. patent application Ser. No. 11/081,877, filed Mar. 15, 2005; U.S. patent application Ser. No. 11/082,196, filed Mar. 15, 2005; U.S. patent application Ser. No. 11/082,201, filed Mar. 15, 2005; and U.S. patent application Ser. No. 11/081,859, filed Mar. 15, 2005.

FIELD OF THE INVENTION

The present invention is directed towards storage elements for a configurable IC, and method and apparatus for accessing data stored in the storage elements.

BACKGROUND OF THE INVENTION

The use of configurable integrated circuits ("IC's") has dramatically increased in recent years. One example of a configurable IC is a field programmable gate array ("FPGA"). An FPGA is a field programmable IC that often has logic circuits, interconnect circuits, and input/output (i/o) circuits. The logic circuits (also called logic blocks) are typically arranged as an internal array of circuits. These logic circuits are typically connected together through numerous interconnect circuits (also called interconnects). The logic and interconnect circuits are often surrounded by the I/O circuits.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set is stored in a set of SRAM cells 115. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

FIG. 2 illustrates an example of a configurable interconnect circuit 200. This interconnect circuit 200 connects a set of input data 205 to a set of output data 210. This circuit receives configuration data bits 215 that are stored in a set of SRAM cells 220. The configuration bits specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

FIG. 3A illustrates a portion of a prior art configurable IC 300. As shown in this figure, the IC 300 includes an array of configurable logic circuits 305 and configurable interconnect circuits 310. The IC 300 has two types of interconnect circuits 310a and 310b. Interconnect circuits 310a connect interconnect circuits 310b and logic circuits 305, while interconnect circuits 310b connect interconnect circuits 310a to other interconnect circuits 310a.

In some cases, the IC 300 includes numerous logic circuits 305 and interconnect circuits 310 (e.g., hundreds, thousands, hundreds of thousands, etc. of such circuits). As shown in FIG. 3A, each logic circuit 305 includes additional logic and interconnect circuits. Specifically, FIG. 3A illustrates a logic circuit 305a that includes two sections 315a that together are called a slice. Each section includes a look-up table (LUT) 320, a user register 325, a multiplexer 330, and possibly other circuitry (e.g., carry logic) not illustrated in FIG. 3A.

The multiplexer 330 is responsible for selecting between the output of the LUT 320 or the user register 325. For instance, when the logic circuit 305a has to perform a computation through the LUT 320, the multiplexer 330 selects the output of the LUT 320. Alternatively, this multiplexer selects the output of the user register 325 when the logic circuit 305a or a slice of this circuit needs to store data for a future computation of the logic circuit 305a or another logic circuit.

FIG. 3B illustrates an alternative way of constructing half a slice in a logic circuit 305a of FIG. 3A. Like the half-slice 315a in FIG. 3A, the half-slice 315b in FIG. 3B includes a look-up table (LUT) 320, a user register 325, a multiplexer 330, and possibly other circuitry (e.g., carry logic) not illustrated in FIG. 3B. However, in the half-slice 315b, the user register 325 can also be configured as a latch. In addition, the half-slice 315b also includes a multiplexer 350. In half-slice 315b, the multiplexer 350 receives the output of the LUT 320 instead of the register/latch 325, which receives this output in half-slice 315a. The multiplexer 350 also receives a signal from outside of the half-slice 315b. Based on its select signal, the multiplexer 350 then supplies one of the two signals that it receives to the register/latch 325. In this manner, the register/latch 325 can be used to store (1) the output signal of the LUT 320 or (2) a signal from outside the half-slice 315b.

The use of user registers to store such data is at times undesirable, as it typically requires data to be passed at a clock's rising edge or a clock's fall edge. In other words, registers often do not provide flexible control over the data passing between the various circuits of the configurable IC. In addition, the placement of a register or a latch in the logic circuit increases the signal delay through the logic circuit, as it requires the use of at least one multiplexer 330 to select between the output of a register/latch 325 and the output of a LUT 320.

Accordingly, there is a need for a configurable IC that has a more flexible approach for storage data and passing the data. More generally, there is a need for better data accessing, data operations, and clock distribution in a configurable or reconfigurable IC.

SUMMARY OF THE INVENTION

Some embodiments provide a circuit for accessing stored data in a configurable IC that includes several configurable circuits. The IC also includes several storage circuits. Each storage circuit has (1) several storage elements for storing data for the configurable circuits, and (2) output circuitry for outputting data stored in the storage elements. The output circuitry includes a first of interconnects for receiving at least a first repeating periodic signal and for periodically outputting data from at least two storage elements to the configurable circuits.

BRIEF DESCRIPTION OF THE DRAWINGS

The novel features of the invention are set forth in the appended claims. However, for purpose of explanation, several embodiments of the invention are set forth in the following figures.

FIG. 1 illustrates an example of a configurable logic circuit.

FIG. 2 illustrates an example of a configurable interconnect circuit.

FIG. 16 illustrates an interconnect circuit configured as a latch.

FIG. 17 illustrates an interconnect circuit configured as a latch that includes a multiplexer.

FIG. 18 illustrates an interconnect circuit that is formed by a seven-to-one multiplexer, a latch and a logic gate.

FIG. 19 illustrates an interconnect circuit that includes the multiplexer and latch of FIG. 18, as well as two reconfiguration multiplexers.

FIG. 30 illustrates a circuit representation of a storage/interconnect circuit.

DETAILED DESCRIPTION OF THE INVENTION

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

Some embodiments of the invention are configurable IC's that have (1) logic circuits, (2) interconnect circuits, and (3) storage elements for storing data computed by the logic circuits and routed between the logic circuits by the interconnect circuits. Some or all of the storage elements are located at the interconnect circuits in some embodiments. The interconnect circuits are the storage elements in some embodiments, while they contain the storage elements in other embodiments.

The storage elements in some embodiments are asynchronous storage elements that are responsive to asynchronous control signals. The use of asynchronous circuits allows these embodiments to store and retrieve data flexibly from the storage elements without restrictions that are due to synchronizing clock signals. The storage elements in some embodiments are level-sensitive storage elements, instead of edge-sensitive (i.e., transition sensitive) storage elements. In some embodiments, some or all the asynchronous. Level-sensitive state elements are latches. Some embodiments build these latches in the output stage of some or all of the interconnect circuits. Latches have less overhead for setup and hold than transition-sensitive state elements, like user registers. Before describing several such embodiments, several terms and concepts are described in Section I.

I. Terms and Concepts

A. Latches and Registers

Figure 3A:
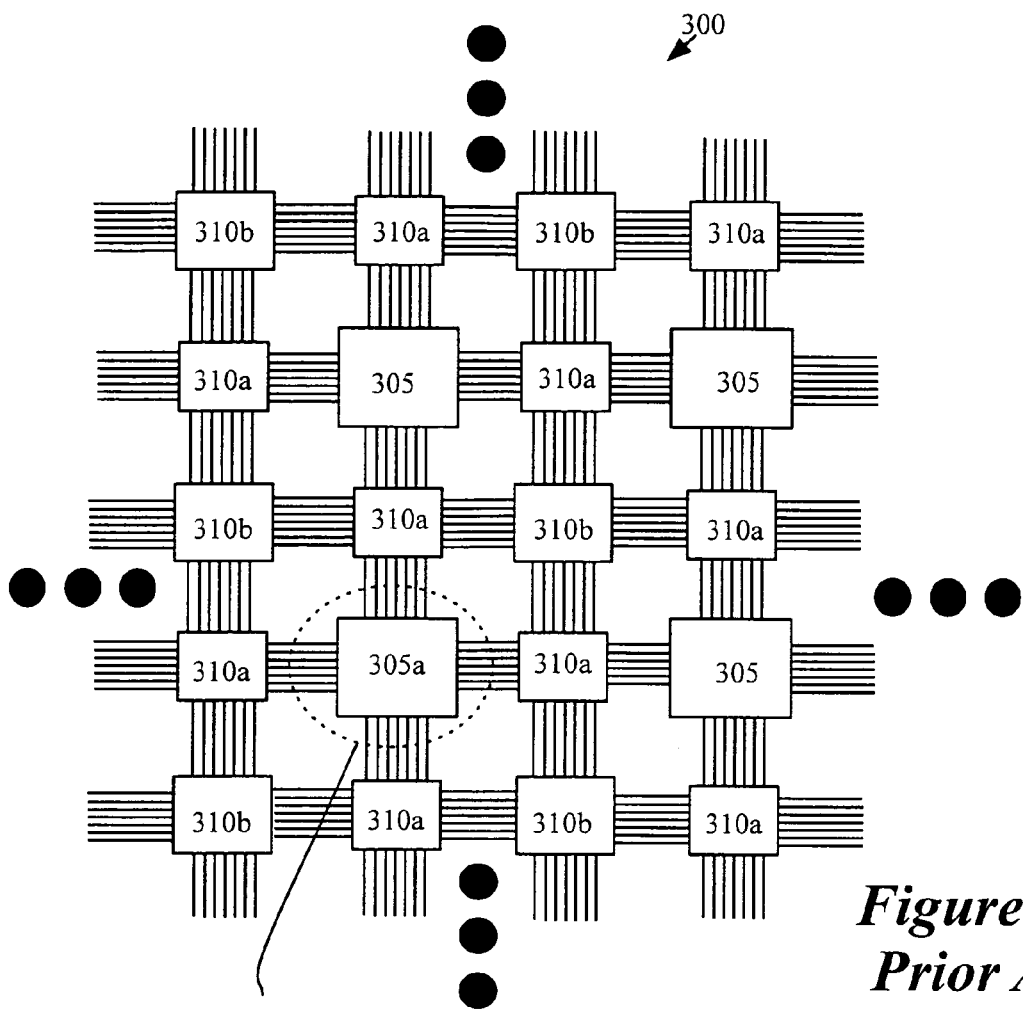
FIG. 3A illustrates a portion of a prior art configurable IC.
Figure 3A:
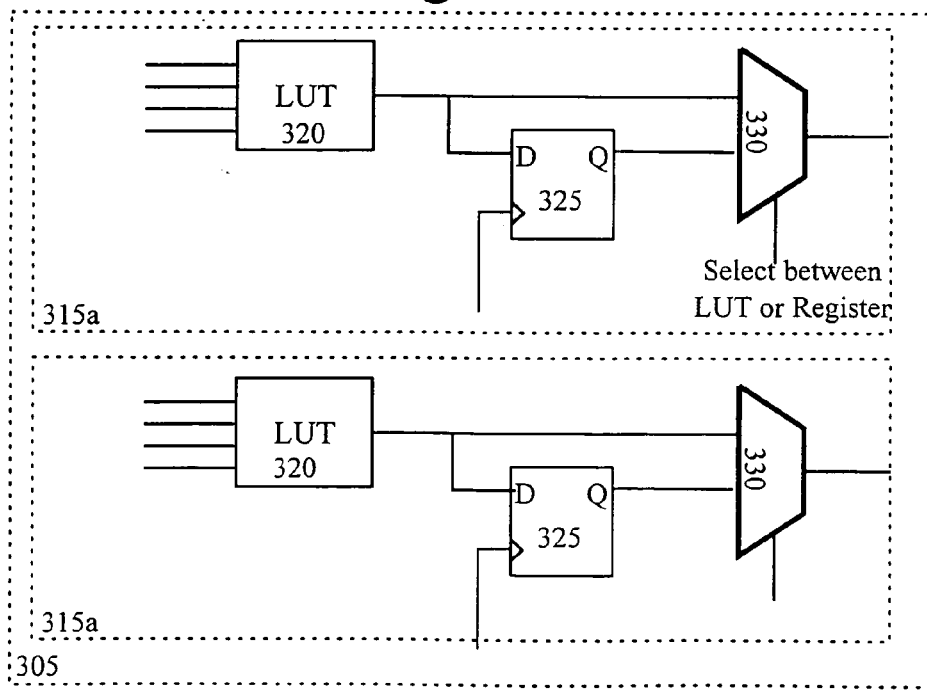
Figure 3B:
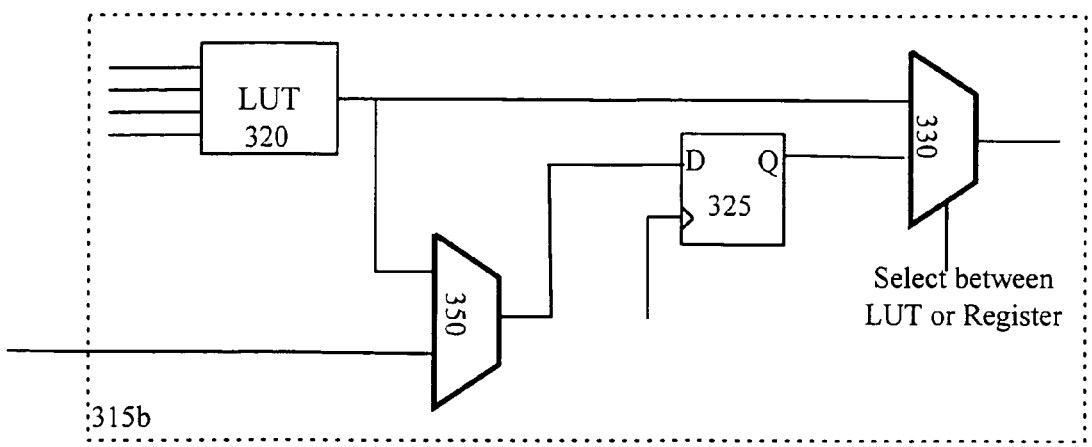
FIG. 3B illustrates an alternative way of constructing half a slice in a logic circuit of FIG. 3A.
Figure 4:
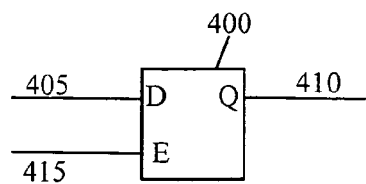
FIG. 4 illustrates an example of a D-latch.

A latch is one type of a storage element. FIG. 4 illustrates an example of a D-latch 400. As shown in this figure, the latch 400 has an input terminal 405, an output terminal 410, and an enable terminal 415. Based on the signal on the enable terminal 415, the latch either holds its output constant (i.e., is closed) or passes its input to its output (i.e., is open). For instance, the latch 400 (1) might pass the signal on its input terminal 405 to its output terminal 410 when the enable signal is not active (e.g., when the signal on the enable terminal 415 is low), and (2) might store a value and hold its output constant at this value when the enable signal is active (e.g., when the signal is high). Such a latch typically stores the value that it was receiving when the enable signal transitions from its inactive state (e.g., low) to its active state (e.g., high).

Figure 5:
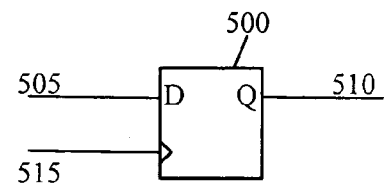
FIG. 5 illustrates an example of a register, which is a D flip flop.

A register is a storage element that operates based on a clock. FIG. 5 illustrates an example of a register 500, which is a D flip flop. As shown in this figure, the register 500 includes an input terminal 505, an output terminal 510, and a clock terminal 515. Based on the signal on the clock terminal 515, the register either holds its output constant or passes its input to its output. For instance, when the clock makes a transition (e.g., goes from low to high), the register 500 samples its input. Next, when the clock is constant or makes the other transition, the register 500 provides at its output 510 the value that it most recently sampled at its input. In a register, the input data typically must be present a particular time interval before and after the active clock transition.

Figure 6:
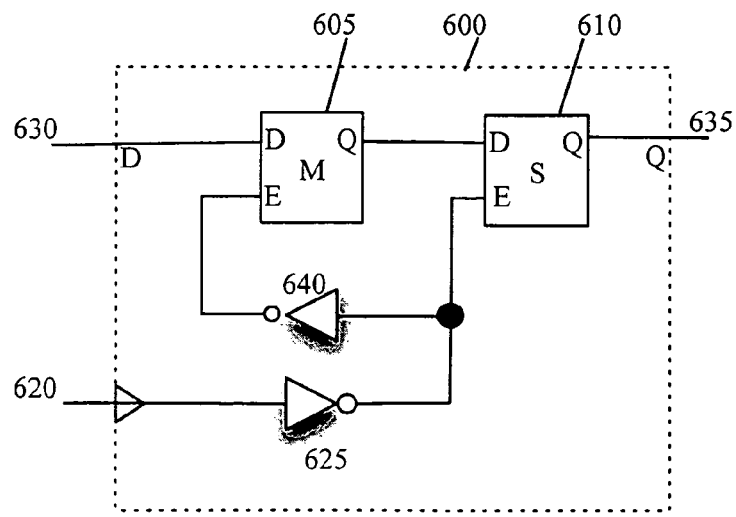
FIG. 6 illustrates a prior art implementation of a register with a pair of latches.

FIG. 6 illustrates a prior art implementation of a register 600 with a pair of latches 605 and 610. In this arrangement, the first latch 605 is referred to as the master latch, while the second latch 610 is referred to as the slave latch. The master and slave receive a clock signal 620 as their enable signals, but they receive the clock signal at opposite polarities because of the inverter 640.

Assuming that the latches 605 and 610 are enable-high latches, the register 600 operates as follows. Initially, when the clock signal 620 is low, the master latch 605 is open, while the slave latch 610 is closed. When the clock signal 620 then goes high, the slave latch 610 opens and the master latch 605 closes. This, in turn, causes the slave latch 610 to output the signal that was appearing at the input line 630 of the master latch right before the master latch closed. Next, when the clock signal 620 transitions low, the slave latch 610 closes before the master latch 605 opens. This causes the slave latch 610 to hold the value that it was outputting before the clock transitioned low, during the period that the clock remains low. This value (that is being held by the slave latch 610) is the value that the master latch 605 was receiving before the prior low-to-high transition of the clock signal 620.

B. Configurable and Reconfigurable IC's

A configurable IC is an IC that has configurable circuits. In some embodiments, a configurable IC includes configurable computational circuit (e.g., configurable logic circuits) and configurable routing circuits for routing the signals to and from the configurable computation units. In addition to configurable circuits, a configurable IC also typically includes non-configurable circuits (e.g., non-configurable logic circuits, interconnect circuits, memories, etc.).

A configurable circuit is a circuit that can "configurably" perform a set of operations. Specifically, a configurable circuit receives "configuration data" that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

Figure 7:
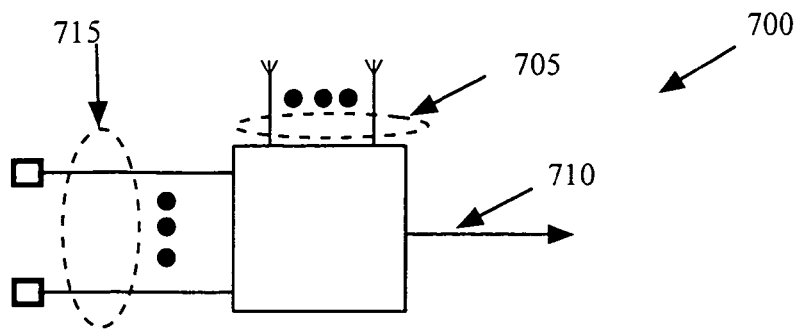
FIG. 7 illustrates an example of a configurable logic circuit that can perform a set of functions.

FIG. 7 illustrates an example of a configurable logic circuit 700 that can perform a set of functions. As shown in this figure, the logic circuit 700 has a set of input terminals 705, a set of output terminals 710, and a set of configuration terminals 715. The logic circuit 700 receives a set of configuration data on its configuration terminals 715. Based on the configuration data, the logic circuit performs a particular function within its set of functions on the input data that it receives on its input terminals 705. The logic circuit then outputs the result of this function as a set of output data on its output terminal set 710. The logic circuit 700 is said to be configurable as the configuration data set "configures" the logic circuit to perform a particular function.

Figure 8:
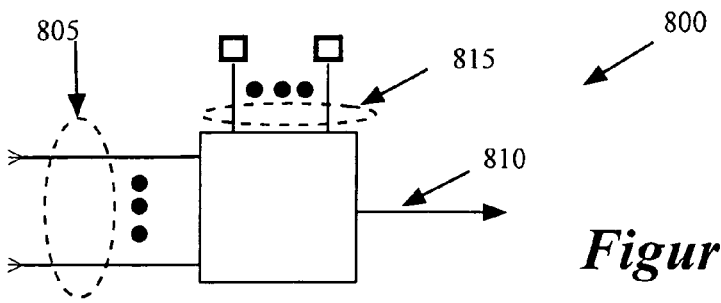
FIG. 8 illustrates an example of a configurable interconnect circuit.

A configurable interconnect circuit is a circuit that can configurably connect an input set to an output set in a variety of manners. FIG. 8 illustrates an example of a configurable interconnect circuit 800. This interconnect circuit 800 connects a set of input terminals 805 to a set of output terminals 810, based on a set of configuration data 815 that the interconnect circuit receives. In other words, the configuration data specify how the interconnect circuit should connect the input terminal set 805 to the output terminal set 810. The interconnect circuit 800 is said to be configurable as the configuration data set "configures" the interconnect circuit to use a particular connection scheme that connects the input terminal set to the output terminal set in a desired manner.

An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

Reconfigurable IC's are one type of configurable IC's. A reconfigurable IC is a configurable IC that can reconfigure during runtime. A reconfigurable IC typically includes reconfigurable logic circuits and/or reconfigurable interconnect circuits. A reconfigurable logic or interconnect circuit is a configurable logic or interconnect circuit that can reconfigure more than once at runtime. A configurable logic or interconnect circuit is said to reconfigure when it receives a different set of configuration data.

Figure 9:
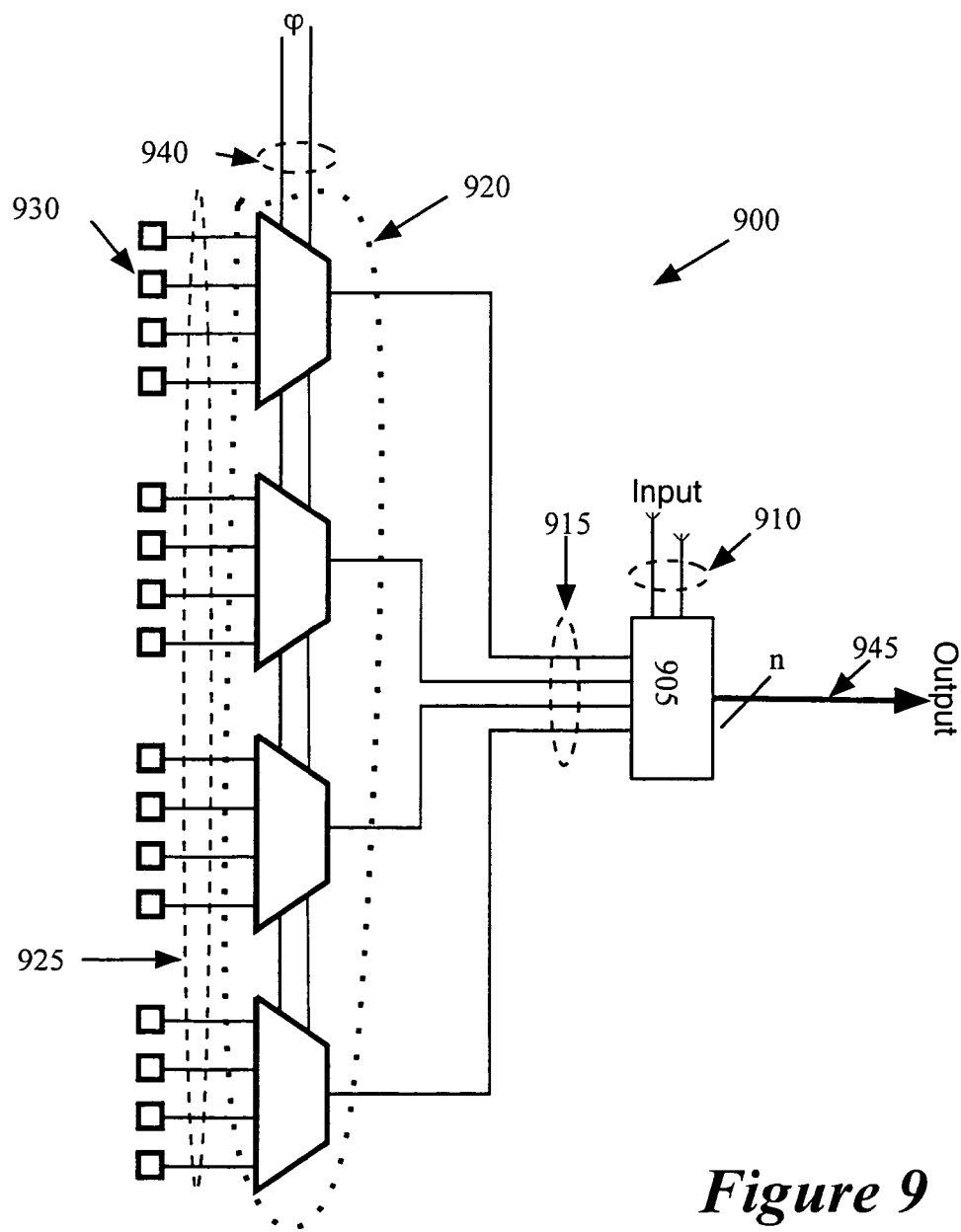
FIG. 9 illustrates an example of a reconfigurable logic circuit.

FIG. 9 illustrates an example of a reconfigurable logic circuit 900. This logic circuit includes a core logic circuit 905 that can perform a variety of functions on a set of input data 910 that it receives. The core logic circuit 905 also receives a set of four configuration data bits 915 through a switching circuit 920. The switching circuit receives a larger set of sixteen configuration data bits 925 that are stored in a set of storage elements 930 (e.g., a set of memory cells, such as SRAM cells). This switching circuit is controlled by a two-bit reconfiguration signal φ through two select lines 940. Whenever the reconfiguration signal changes, the switching circuit supplies a different set of configuration data bits to the core logic circuit 905. The configuration data bits then determine the function that the logic circuit 905 performs on its input data. The core logic circuit 905 then outputs the result of this function on the output terminal set 945.

Any number of known logic circuits (also called logic blocks) can be used in conjunction with the invention. Examples of such known logic circuits include look-up tables (LUT's), universal logic modules (ULM's), sub-ULM's, multiplexers, and PAL's/PLA's. In addition, logic circuits can be complex logic circuits formed by multiple logic and interconnect circuits. Examples of simple and complex logic circuits can be found Architecture and CAD for Deep-Submicron FPGAs, Betz, et al., ISBN 0792384601, 1999, and Design of Interconnection Networks for Programmable Logic, Lemieux, et al., ISBN 1-4020-7700-9, 2003. Other examples of reconfigurable logic circuits are provided in U.S. patent application Ser. No. 10/882,583, entitled "Configurable Circuits, IC's, and Systems," filed on Jun. 30, 2004. This Application is incorporated in the present application by reference.

Figure 10:
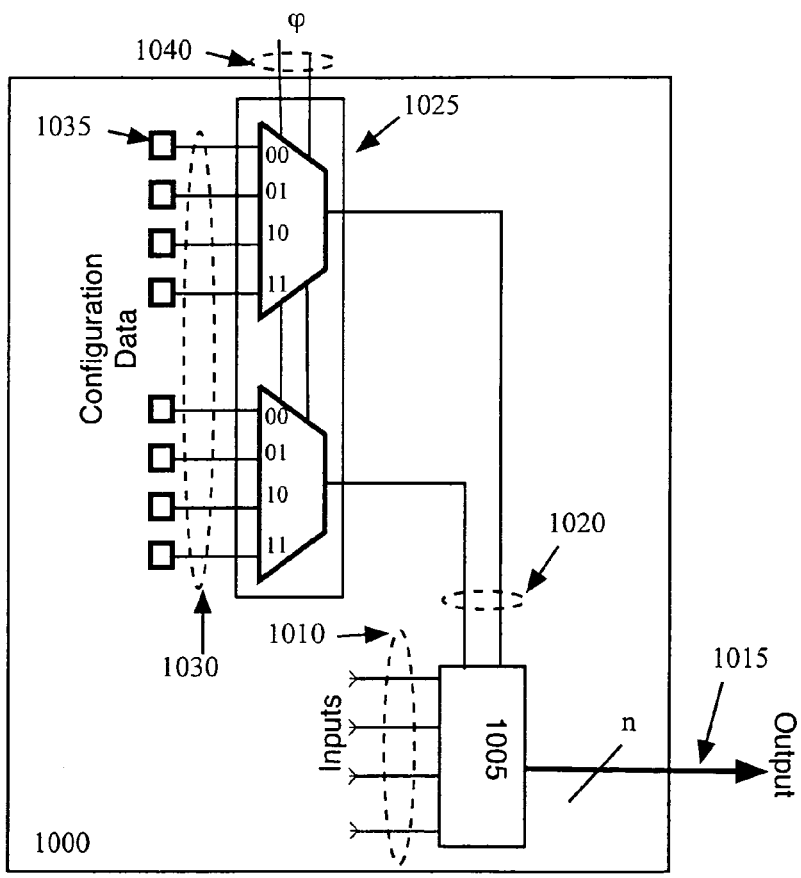
FIG. 10 illustrates an example of a reconfigurable interconnect circuit.

FIG. 10 illustrates an example of a reconfigurable interconnect circuit 1000. This interconnect circuit includes a core interconnect circuit 1005 that connects an input data terminals 1010 to an output data terminal set 1015 based on a configuration data set 1020 that it receives from a switching circuit 1025. The switching circuit 1025 receives a larger set of configuration data bits 1030 that are stored in a set of storage elements 1035 (e.g., a set of memory cells, such as SRAM cells). This switching circuit is controlled by a two-bit reconfiguration signal φ through two select lines 1040. Whenever the reconfiguration signal changes, the switching circuit supplies a different set of configuration data bits to the core interconnect circuit 1005. The configuration data bits then determine the connection scheme that the interconnect circuit 1005 uses to connect the input and output terminals 1010 and 1015.

Any number of known interconnect circuits (also called interconnects or programmable interconnects) can be used in conjunction with the invention. Examples of such interconnect circuits include switch boxes, connection boxes, switching or routing matrices, full- or partial-cross bars, etc. Such interconnects can be implemented using a variety of known techniques and structures. Examples of interconnect circuits can be found Architecture and CAD for Deep-Submicron FPGAs, Betz, et al., ISBN 0792384601, 1999, and Design of Interconnection Networks for Programmable Logic, Lemieux, et al., ISBN 1-4020-7700-9, 2003. Other examples of reconfigurable interconnect circuits are provided in the U.S. application Ser. No. 10/882,583.

As mentioned above, the logic and interconnect circuits 900 and 1000 each receive a reconfiguration signal φ. In some embodiments, this signal is a sub-cycle signal that allows the circuits 900 and 1000 to reconfigure on a sub-cycle basis, i.e., to reconfigure one or more times within a cycle of a primary clock. The primary clock might be a design clock for which the user specifies a design. For instance, when the design is a Register Transfer Level (RTL) design, the design clock rate can be the clock rate for which the user specifies his or her design in a hardware definition language (HDL), such as VHDL or Verilog. Alternatively, the primary clock might be an interface clock that defines the rate of input to and/or output from the IC (e.g., the rate that the fastest interface circuit of the IC passes signals to and/or receives signals from circuits outside of the IC).

Figure 11:
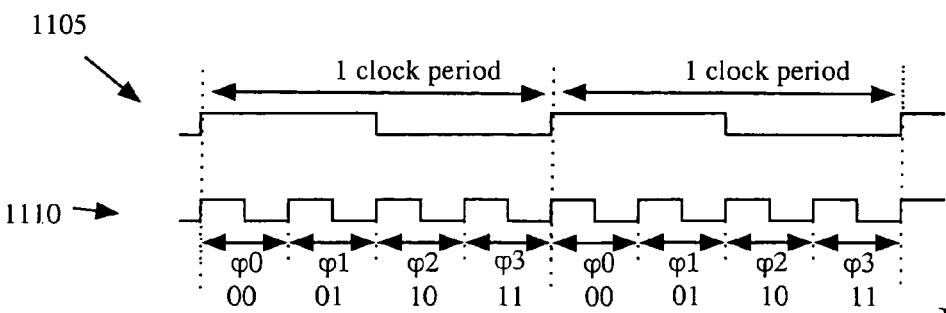
FIG. 11 illustrates an example of a primary clock signal and a sub-cycle clock signal.

In some embodiments, a primary clock's cycle is broken into several sub-cycles. FIG. 11 illustrates an example of a primary clock signal 1105 and a sub-cycle clock signal 1110. As shown in this figure, the primary clock's cycle can be broken into four sub-cycles, which in this case have an equal duration. In some of these embodiments, each sub-cycle that falls within a particular cycle of the primary clock is referred to as a "phase." In FIG. 11, the four phases are referred to as φ0, φ1, φ2, φ3, and these four phases can be presented by two bits (i.e., the phases can be represented as 00, 01, 10, and 11).

Even though FIG. 11 shows the phases as changing sequentially, these phases change in a non-sequential manner in some embodiments. Also, in some embodiments, the order of the phases in each period of the received clock can differ, e.g., in one clock period the phase bits might appear as 00, 10, 11, 01, and in the next clock period the phase bits might appear as 11, 10, 01, 00. Moreover, in some or all primary cycles, not all possible phase bit permutations might be used or one or more phase bit permutations might be used more than once. Furthermore, different encoding schemes (e.g., a Gray code encoding scheme, a one-hot encoding scheme, etc.) might be used to generate the phase bits.

A primary cycle might be divided into more or fewer than four sub-cycles. Also, the rising and/or falling edges of a primary clock might not coincide with the rising and/or falling edges of the sub-cycle signal or signals. Moreover, the primary clock cycle might not correspond to an integer number of sub-cycles. For instance, in some embodiments, the sub-cycle signals have rates that share a common non-even multiple with the rate of the primary clock.

For some embodiments of the invention, the switching circuits 920 and 1025 and the phase signal φ of FIGS. 9-11 presents one way of providing configuration data to configurable logic or interconnect circuits on a sub-cycle basis. Other embodiments, however, use alternative switching circuitry and clock distribution schemes for providing configuration data to configurable logic or interconnect circuits at certain desired rates. Several such embodiments are described further below.

C. Circuit Arrays and Arrangements

Figure 12:
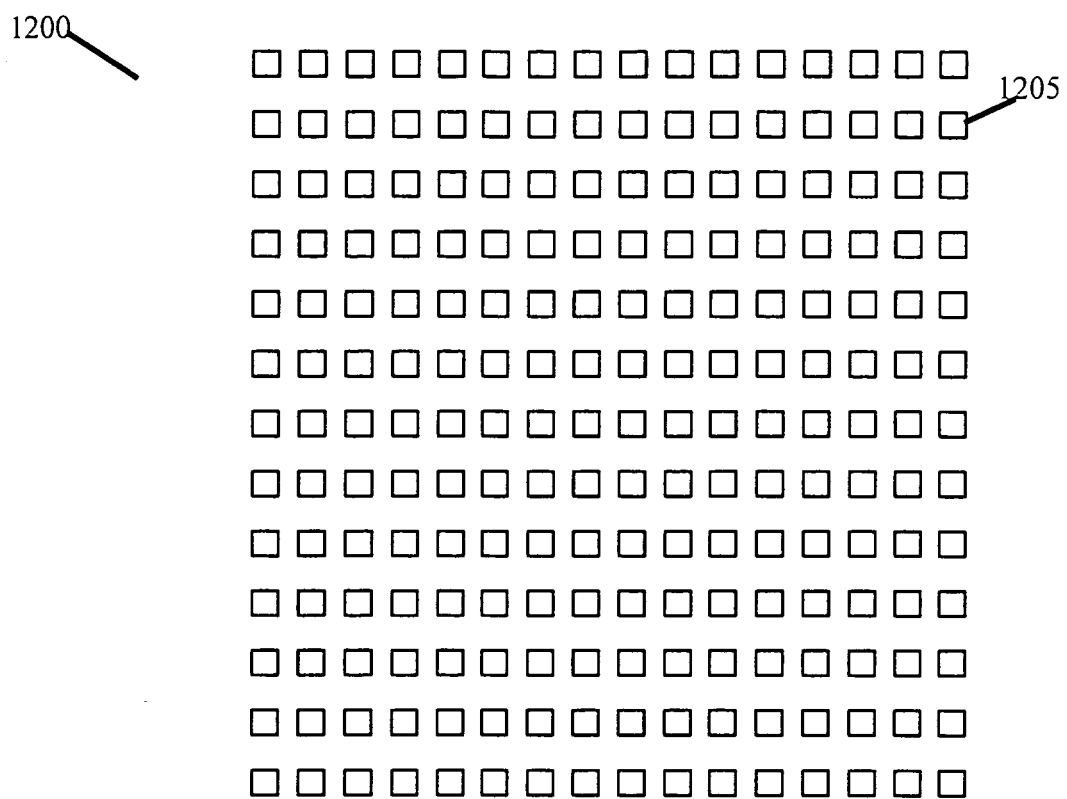
FIG. 12 illustrates an example of a configurable node array that includes configurable nodes that are arranged in rows and columns.

A circuit array is an array with several circuit elements that are arranged in several rows and columns. One example of a circuit array is a configurable node array, which is an array where some or all the circuit elements are configurable circuits (e.g., configurable logic and/or interconnect circuits). FIG. 12 illustrates an example of a configurable node array 1200 that includes 208 configurable nodes 1205 that are arranged in 13 rows and 16 columns. Each configurable node in a configurable node array is a configurable circuit that includes one or more configurable sub-circuits.

In some embodiments, some or all configurable nodes in the array have the same or similar circuit structure. For instance, in some embodiments, some or all the nodes have the exact same circuit elements (e.g., have the same set of logic gates and circuit blocks and/or same interconnect circuits), where one or more of these identical elements are configurable elements. One such example would be a set of nodes positioned in an array, where each node is formed by a particular set of logic and interconnects circuits. Having nodes with the same circuit elements simplifies the process for designing and fabricating the IC, as it allows the same circuit designs and mask patterns to be repetitively used to design and fabricate the IC.

In some embodiments, the similar configurable nodes not only have the same circuit elements but also have the same exact internal wiring between their circuit elements. For instance, in some embodiments, a particular set of logic and interconnects circuits that are wired in a particular manner forms each node in a set of nodes in the array. Having such nodes further simplifies the design and fabrication processes as it further simplifies the design and mask making processes.

In some embodiments, each configurable node in a configurable node array is a simple or complex configurable logic circuit. In some embodiments, each configurable node in a configurable node array is a configurable interconnect circuit. In such an array, a configurable node (i.e., a configurable interconnect circuit) can connect to one or more logic circuits. In turn, such logic circuits in some embodiments might be arranged in terms of another configurable logic-circuit array that is interspersed among the configurable interconnect-circuit array.

Also, some embodiments use a circuit array that includes numerous configurable and non-configurable circuits that are placed in multiple rows and columns. In addition, within the above described circuit arrays and/or configurable node arrays, some embodiments disperse other circuits (e.g., memory blocks, processors, macro blocks, IP blocks, SERDES controllers, clock management units, etc.).

Some embodiments might organize the configurable circuits in an arrangement that does not have all the circuits organized in an array with several aligned rows and columns. Accordingly, instead of referring to configurable circuit arrays, the discussion below refers to configurable circuit arrangements. Some arrangements may have configurable circuits arranged in one or more arrays, while other arrangements may not have the configurable circuits arranged in an array.

Several figures below illustrate several direct connections between circuits in a configurable circuit arrangement. A direct connection between two circuits in a configurable circuit arrangement is an electrical connection between the two circuits that is achieved by (1) a set of wire segments that traverse through a set of the wiring layers of the IC, and (2) a set of vias when two or more wiring layers are involved.

In some embodiments, a direct connection between two circuits in a configurable circuit arrangement might also include a set of buffer circuits. In other words, two circuits in a configurable circuit arrangement are connected in some embodiments by a set of wire segments that possibly traverse through a set of buffer circuits and a set of vias. Buffer circuits are not interconnect circuits or configurable logic circuits. In some embodiments, buffer circuits are part of some or all connections. Buffer circuits might be used to achieve one or more objectives (e.g., maintain the signal strength, reduce noise, alter signal delay, etc.) along the wire segments that establish the direct connections. Inverting buffer circuits may also allow an IC design to reconfigure logic circuits less frequently and/or use fewer types of logic circuits. In some embodiments, buffer circuits are formed by one or more inverters (e.g., two or more inverters that are connected in series).

Figure 13:
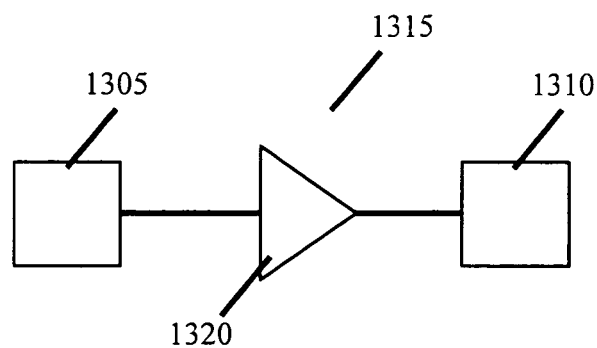
FIG. 13 illustrates an example of a connection between two nodes.
Figure 14:
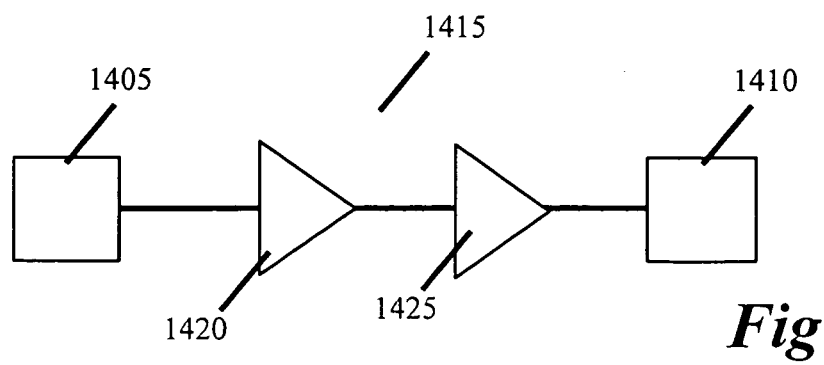
FIG. 14 illustrates an example of a connection between two circuits in a configurable circuit arrangement.

FIGS. 13 and 14 illustrate examples of two connections, each between two circuits in a configurable circuit arrangement. Each of these connections has one or more intervening buffer circuits. Specifically, FIG. 13 illustrates an example of a connection 1315 between two nodes 1305 and 1310. As shown in this figure, this connection has an intervening buffer circuit 1320. In some embodiments, the buffer circuit 1320 is an inverter. Accordingly, in these embodiments, the connection 1315 inverts a signal supplied by one of the nodes 1305 to the other node 1310.

FIG. 14 illustrates an example of a connection 1415 between two circuits 1405 and 1410 in a configurable circuit arrangement. As shown in this figure, this connection 1415 has two intervening buffer circuits 1420 and 1425. In some embodiments, the buffer circuits 1420 and 1425 are inverters. Hence, in these embodiments, the connection 1415 does not invert a signal supplied by one of the circuits 1405 to the other circuit 1410.

Alternatively, the intermediate buffer circuits between the logic and/or interconnect circuits can be viewed as a part of the devices illustrated in these figures. For instance, the inverters that can be placed between the circuits 1405 and 1410 can be viewed as being part of these circuits. Some embodiments use such inverters in order to allow an IC design to reconfigure logic circuits less frequently and/or use fewer types of logic circuits.

Several figures below "topologically" illustrate several direct connections between circuits in a configurable circuit arrangement. A topological illustration is an illustration that is only meant to show a direct connection between two circuits without specifying a particular geometric layout for the wire segments that establish the direct connection or a particular position of the two circuits.

II. Storage at the Interconnects

Some embodiments of the invention are configurable IC's that have (1) logic circuits, (2) interconnect circuits, and (3) storage elements for storing data computed by the logic circuits and routed between the logic circuits by the interconnect circuits. Some or all of the storage elements are located at the interconnect circuits in some embodiments. The interconnect circuits are the storage elements in some embodiments, while they contain the storage elements in other embodiments.

Having the storage elements at some or all of the interconnect circuits is highly advantageous. For instance, such storage elements obviate the need to route data computed by a first logic circuit to a second logic circuit that stores the computed data before routing the data to a third logic circuit that will use the data. Instead, such computed data can be stored at an interconnect circuit that is at an optimal location along the routing path between the first and third logic circuits. Such flexibility in routing data is highly advantageous in reconfigurable IC's that often need to pass data between logic circuits that operate in different configuration sub-cycles.

Instead of using registers for all of the storage elements, some embodiments use latches for some or all the storage elements. In some situations, latches have several advantages over registers. For instance, registers are edge triggered, i.e., their operation is driven by the rising or falling edge of a clock. This limitation on their operation imposes an arbitrary temporal restriction on when data can be passed between a register and another circuits. Latches, on the other hand, do not suffer from such arbitrary constraints as they can operate solely in response to an enable signal. Hence, they can typically operate asynchronously in response to asynchronous enable signals. This ability to operate asynchronously allows the operations of the latches to adjust flexibly to receive and output data whenever such data is provided or needed.

Figure 15:
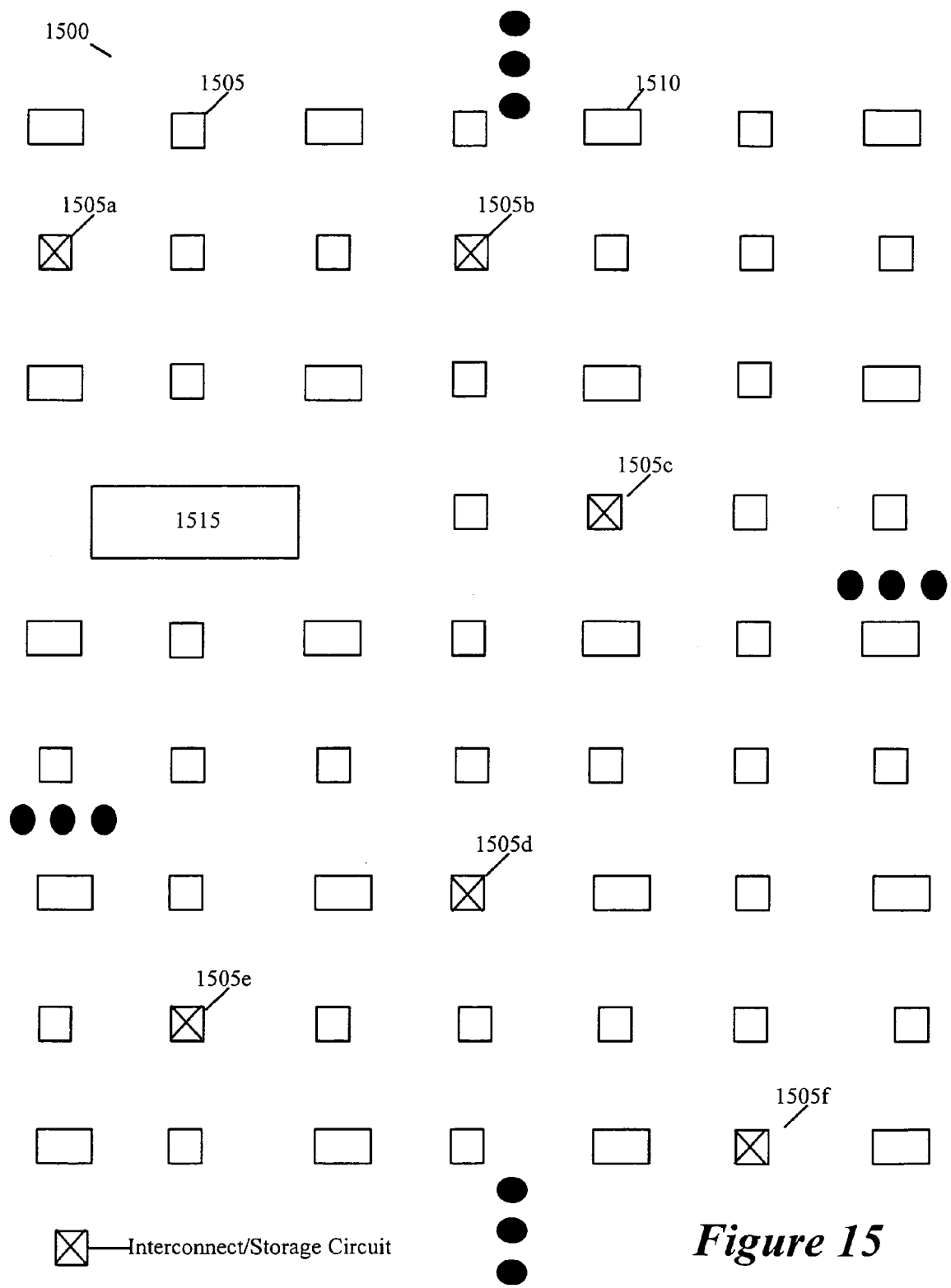
FIG. 15 illustrates a configurable node array formed by numerous configurable interconnect circuits arranged in numerous rows and columns.

FIGS. 15-21 illustrate examples of circuit array architectures that include several interconnect circuits with storage elements for storing computation data from logic circuits in route to other logic circuits. FIG. 15 illustrates a configurable node array 1500 formed by numerous configurable interconnect circuits 1505 arranged in numerous rows and columns. Dispersed within this array are numerous logic circuits 1510, which may or may not be configurable. Also, dispersed within this array is a non-logic, non-interconnect block 1515 (e.g., a memory array).

As shown in FIG. 15, certain configurable interconnect circuits 1505a-1505f can serve as storage circuits. In other words, each of these interconnect circuits 1505a-1505f can be configured to operate either as an interconnect circuit that passes data between other circuits, or as a storage circuit that stores data, such as computation data from one logic circuit in route to another logic circuit.

Different embodiments implement interconnect/storage circuits differently. For instance, as shown in FIG. 16, the interconnect circuit 1600 (which in this case is an eight-to-one multiplexer) itself can be configured as a latch by feeding back its output 1610 to one of its inputs 1615. Specifically, the select bits 1605 that are supplied to this multiplexer 1600 cause this multiplexer to select one of its inputs for output 1610. When these bits select the multiplexer input that is tied to this multiplexer's output, the multiplexer 1600 acts as a latch that holds its output. When the select bits are configuration bits stored in a storage structure, the multiplexer 1600 is a configurable multiplexer that can be configured to act as an interconnect circuit or a storage circuit by changing the value of the configuration bits.

The multiplexer 1600 can also be employed as a reconfigurable circuit that can be reconfigured multiple times during run time, as illustrated in FIG. 17. Specifically, FIG. 17 illustrates an interconnect circuit 1700 that includes the interconnect circuit 1600 and a multiplexer 1705. The multiplexer 1705 receives a two-bit reconfiguration signal 1715 that directs this multiplexer to select one of its four inputs for output. Each input of the multiplexer 1705 is three-bits wide and connects to three storage elements 1710 that store three configuration bits. The output of the multiplexer 1705 is also three-bits wide, and this output drives the three select lines of the multiplexer 1600. Accordingly, the selection of any input of the multiplexer 1705 causes this multiplexer to provide three configuration bits.

When these three configuration bits select the first input of the multiplexer 1600 for output, the multiplexer 1600 acts as a latch. On the other hand, the multiplexer 1600 serves as an interconnect circuit when the three configuration bits cause it to select any other input than its first input. By changing the reconfiguration signal, the operation of the multiplexer 1600 can be changed from a latching operation to an interconnect operation.

A latch can also be placed at an input or an output of an interconnect circuit. For example, FIG. 18 illustrates an interconnect circuit 1800 that is formed by a seven-to-one multiplexer 1805, a latch 1810, and a logic gate 1815. The latch receives the output 1830 of the multiplexer 1805 as its input. It also receives the output of the logic gate as its enable signal. The logic gate 1815 produces its output (i.e., produces the enable signal) based on the select bits 1820 that the multiplexer 1805 receives. Hence, for a particular set of select bits 1820, the logic circuit enables the latch so that the latch simply stores the output value of the multiplexer immediately before being enabled. On the other hand, for other sets of selects bits 1820, the logic circuit disables the latch so that it can pass through the output of the multiplexer 1805.

The interconnect circuit 1800 has slightly longer signal delay that the interconnect circuit 1600, because the circuit 1800 uses a separate latch 1810. However, this slight signal delay is relatively negligible. Moreover, unlike the interconnect circuit 1600 which might have to address signal glitch issues, the interconnect circuit 1800 does not have to address signal glitch issues, as the interconnect 1800 uses a separate latch 1810 that is not in a feedback path between the input terminals 1825 and the output terminal 1835 of the interconnect.

When the select bits 1820 are configuration bits stored in a storage structure, the multiplexer 1800 is a configurable circuit that can be configured to act as an interconnect circuit or a storage circuit by changing the value of the configuration bits. The latching structure of the interconnect circuit 1800 can also be employed in a reconfigurable interconnect circuit that can be reconfigured multiple times during run time, as illustrated in FIG. 19.

In particular, FIG. 19 illustrates an interconnect circuit 1900 that includes the multiplexer 1805 and latch 1810 of FIG. 18, as well as two reconfiguration multiplexers 1705 and 1905. The two multiplexers 1705 and 1905 receive a two-bit reconfiguration signal 1715. This reconfiguration signal directs the multiplexer 1705 to select one of its four inputs for output. Specifically, each input of the multiplexer 1705 is three-bits wide and connects to three storage elements 1710 that store three configuration bits. The output 1820 of the multiplexer 1705 is also three-bits wide, and this output drives the three select lines of the multiplexer 1805. Accordingly, the selection of any input of the multiplexer 1705 causes this multiplexer to provide three configuration bits to the multiplexer 1805, which, in turn, causes the multiplexer 1805 to output one of its inputs.

The two-bit reconfiguration signal 1715 also drives the two select lines of the multiplexer 1905, and thereby causes this multiplexer to select one of its four inputs for output. The output of the multiplexer 1905 then drives the enable signal of the latch 1810. Accordingly, depending on the value of the configuration bit (stored in cells 1910) that the multiplexer 1905 supplies to the latch 1810's enable signal, the latch 1810 can either pass through the output of the interconnect circuit 1805, or store this circuit's output right before its enable signal went active. Hence, by changing the reconfiguration signal, the operation of the interconnect circuit 1900 can be changed from an interconnect operation that passes through one of the inputs to multiplexer 1805, to a latching operation that stores one of the inputs to the multiplexer 1805.

Instead of the two-bit reconfiguration signal 1715 and the multiplexer logic 1705 and 1905 of FIGS. 17 and 19, some embodiments use alternative switching circuitry and clock distribution schemes for providing configuration data to configurable logic or interconnect circuits at certain desired rates. Several such embodiments are described further below.

Figure 20:
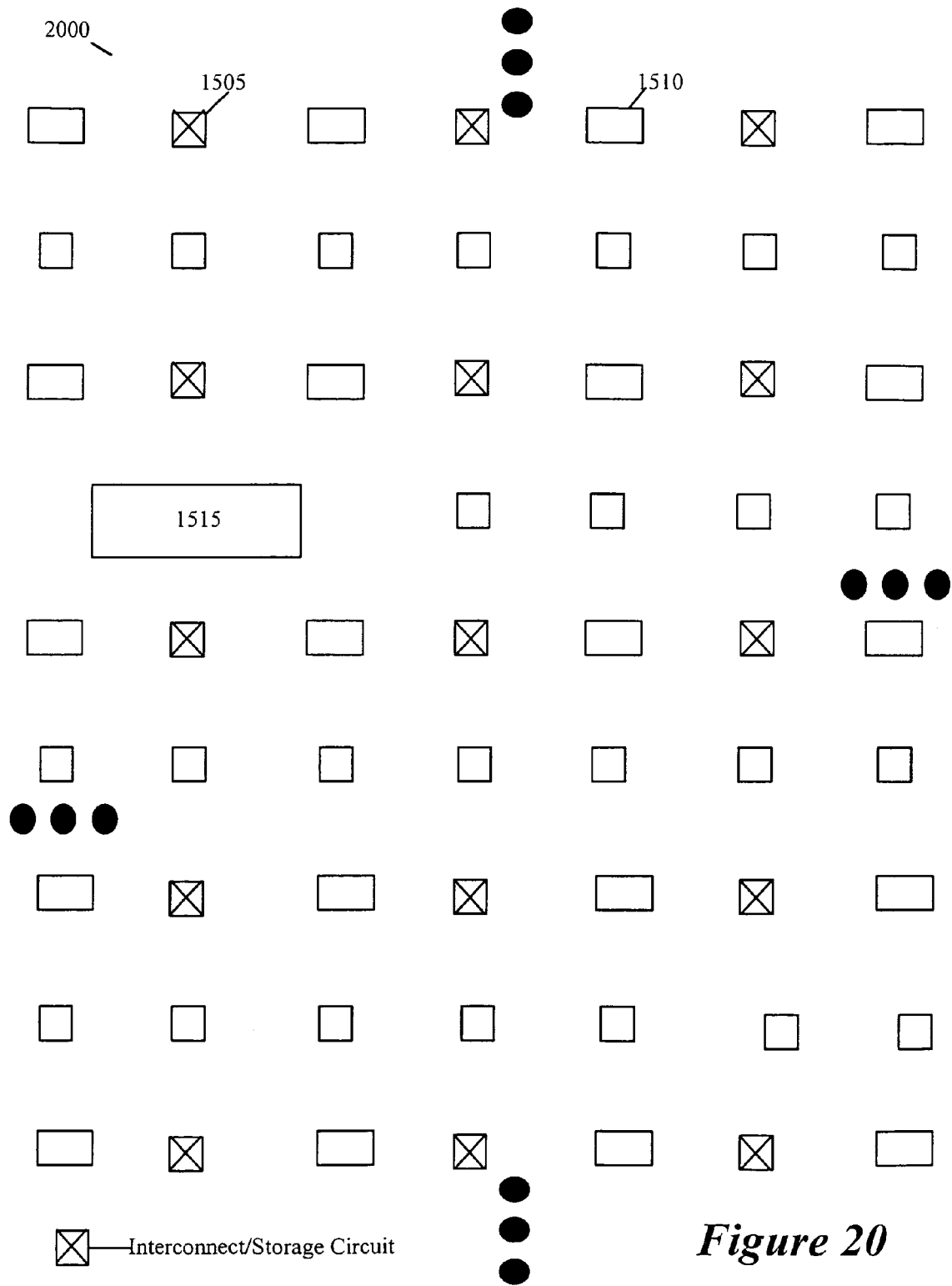
FIG. 20 illustrates a configurable node arrangement that has interconnect/storage circuits appearing throughout the arrangement according to a particular pattern.
Figure 21:
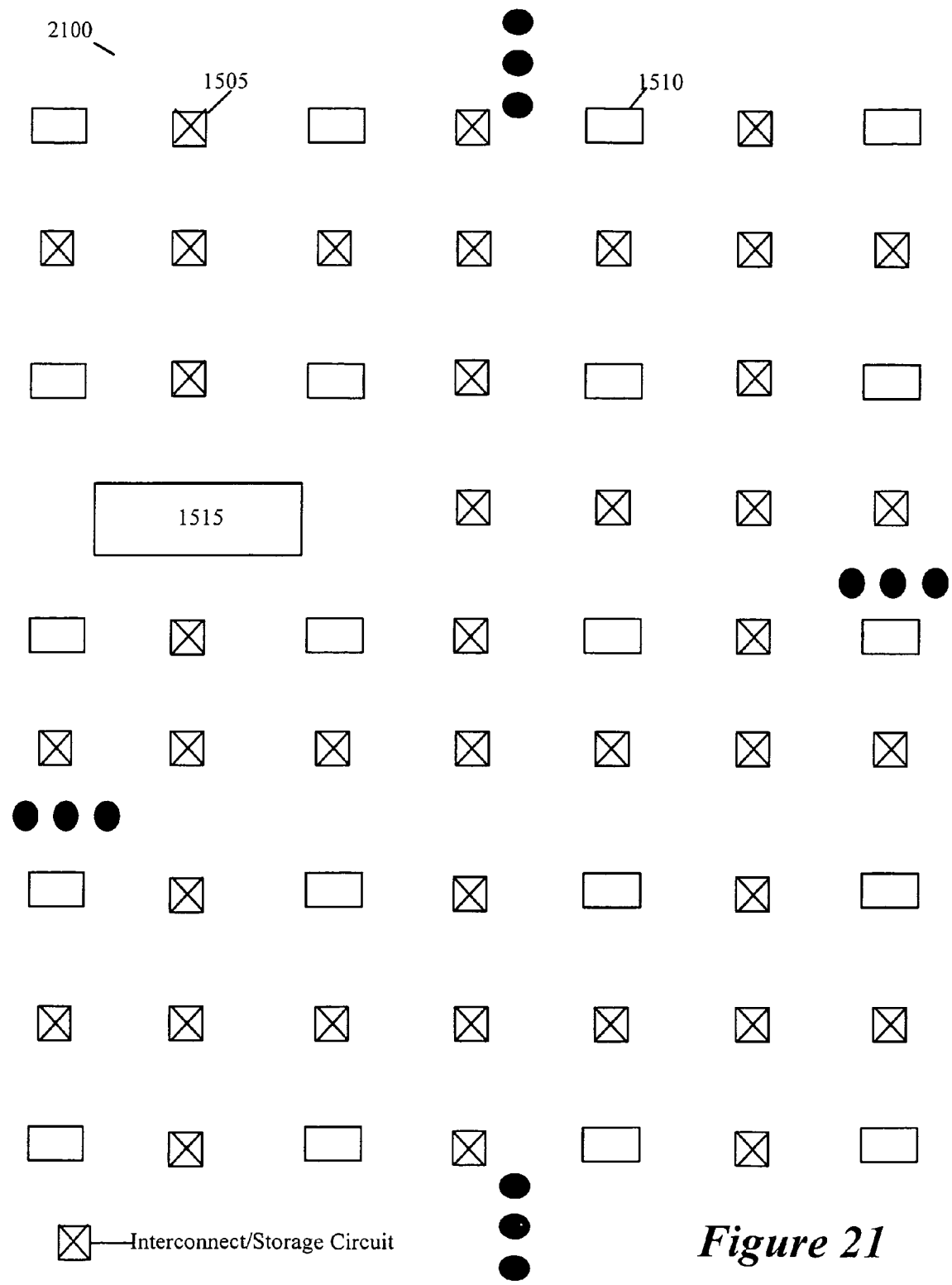
FIG. 21 illustrates another configuration circuit arrangement.

In the configurable node array 1500 of FIG. 15, the interconnect/storage circuits 1505a-1505f do not appear within the array according to any particular pattern. FIG. 20, on the other hand, illustrates a configurable node arrangement 2000 that has interconnect/storage circuits appearing throughout the arrangement according to a particular pattern. In this arrangement, the interconnect circuits that can also be configured to serve as storage circuits are the interconnect circuits that appear horizontally adjacent to one or two logic circuits. FIG. 21 illustrates another configuration node arrangement 2100 architecture. In this architecture, each interconnect circuit can be configured to be a storage circuit.

As mentioned above, the storage element in the interconnect/storage circuit 1600 of FIG. 16 is established by feeding back the output of this circuit as one of its inputs. On the other hand, the storage elements in the interconnect/storage circuits 1800 and 1900 of FIGS. 18 and 19 are latches 1810 separate from the interconnect circuit 1805.

Figure 22:
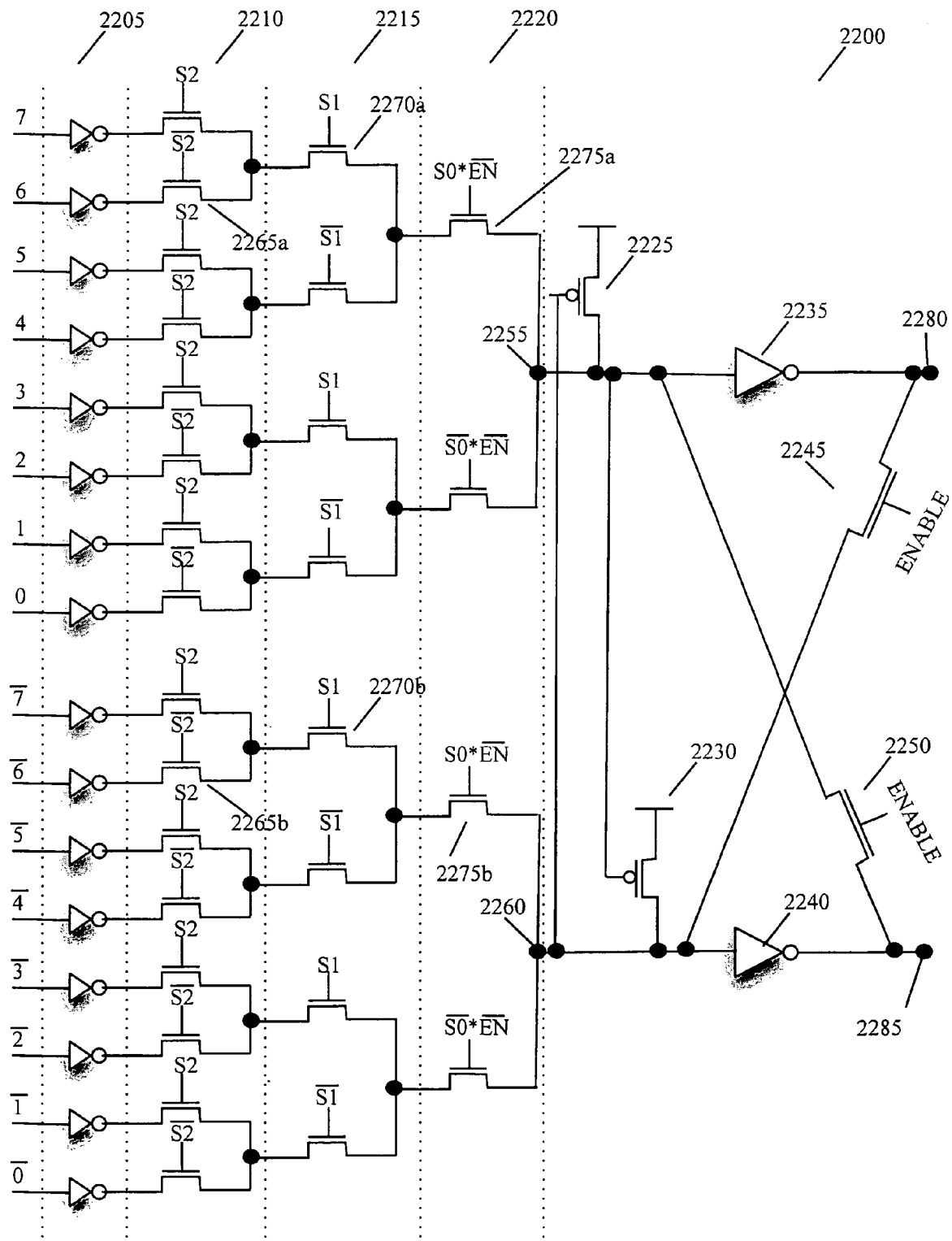
FIG. 22 illustrates another alternative implementation of an interconnect/storage circuit.

FIG. 22 illustrates yet another alternative implementation of an interconnect/storage circuit 2200. As shown in this figure, the circuit 2200 includes (1) one set of input buffers 2205, (2) three sets 2210, 2215, and 2220 of NMOS pass gate transistors, (3) two pull-up PMOS transistors 2225 and 2230, (4) two inverting output buffers 2235 and 2240, and (5) two cross-coupling transistors 2245 and 2250.

Figure 23:
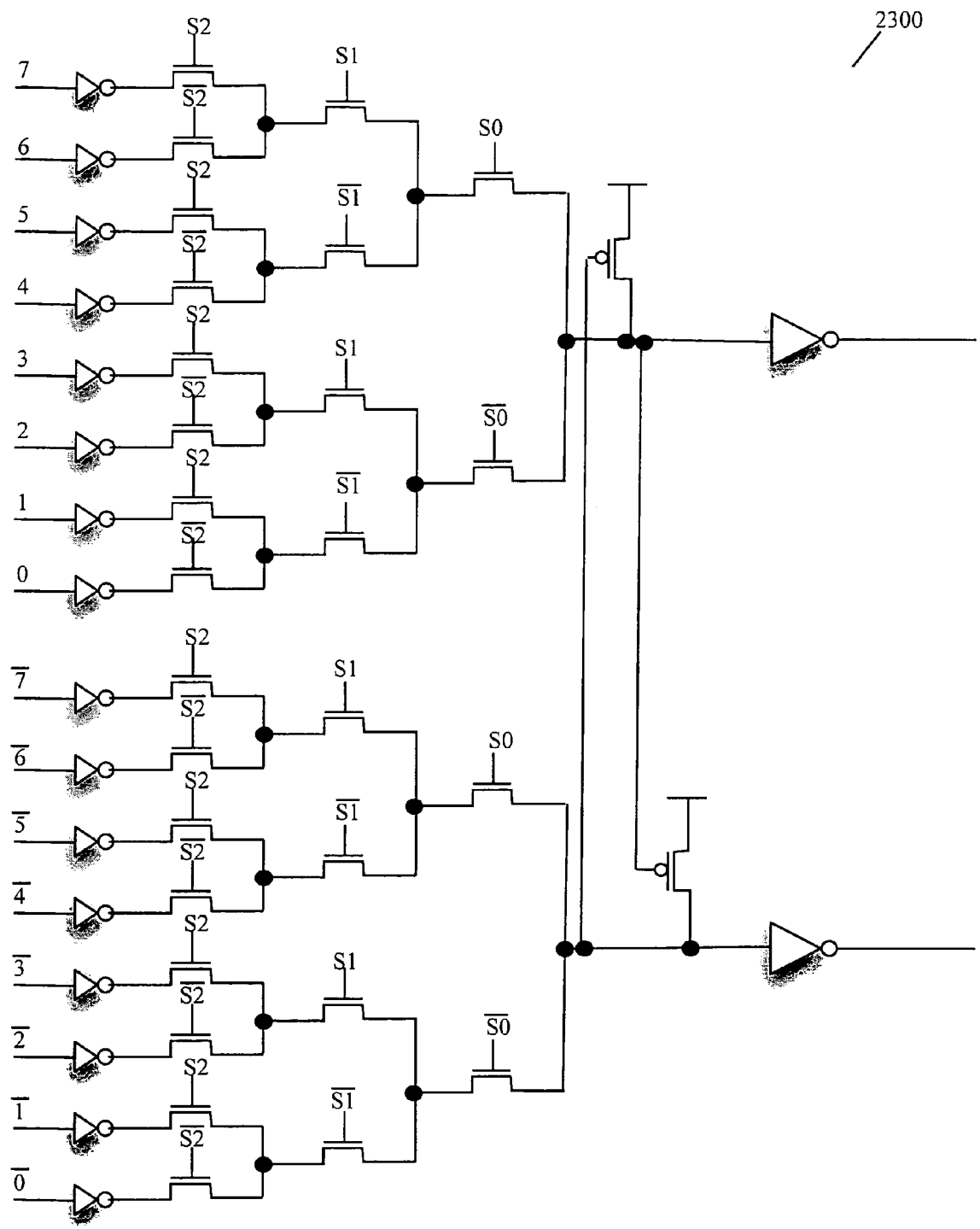
FIG. 23 illustrates a traditional complementary pass logic (CPL) implementation of an eight-to-one multiplexer.

The circuit 2200 is an eight-to-one multiplexer that can also serve as a latch. Specifically, with the exception of two differences, the implementation of the eight-to-one multiplexer 2200 is similar to a traditional complementary pass logic (CPL) implementation of an eight-to-one multiplexer 2300, which is illustrated in FIG. 23. The two differences are (1) the inclusions of the two transistors 2245 and 2250 that cross couple the two output buffers 2235 and 2230, and (2) the inclusion of the enable signal with a signal that drives the last set 2220 of the pass transistors of the eight-to-one multiplexer. These two inclusions allow the eight-to-one multiplexer 2200 to act as a storage element whenever the enable signal is active (which, in this case, means whenever the enable signal is high).

In a CPL implementation of a circuit, a complementary pair of signals represents each logic signal, where an empty circle at the input or output of a circuit denotes the complementary input or output of the circuit in the figures. In other words, the circuit receives true and complement sets of input signals and provides true and complement sets of output signals. Accordingly, in the multiplexer 2200 of FIG. 22, one subset of the input buffers 2205 receives eight input bits (0-7), while another subset of the input buffers 2205 receives the complement of the eight inputs bits (i.e., receives $\overline{\text{ENABLE}}$). These input buffers serve to buffer the first set 2210 of pass transistors.

The first set 2210 of pass transistors receive the third select bit S2 or the complement of this bit, while the second set 2215 of pass transistors receive the second select bit S1 or the complement of this bit. The third set 2220 of pass transistors receive the first select bit or its complement after this bit has been "AND'ed" by the complement of the enable signal. When the enable bit is not active (i.e., in this case, when the enable bit is low), the three select bits S2, S1, and S0 cause the pass transistors to operate to pass one of the input bits and the complement of this input bit to two intermediate output nodes 2255 and 2260 of the circuit 2200. For instance, when the enable signal is low, and the select bits are 011, the pass transistors 2265a, 2270a, 2275a, and 2265b, 2270b, and 2275b turn on to pass the 6 and $\overline{6}$ input signals to the intermediate output nodes 2255 and 2260.

The pull-up PMOS transistors 2225 and 2230 are used to pull-up quickly the intermediate output nodes 2255 and 2260, and to regenerate the voltage levels at the nodes that have been degenerated by the NMOS threshold drops, when these nodes need to be at a high voltage. In other words, these pull-up transistors are used because the NMOS pass transistors are slower than PMOS transistors in pulling a node to a high voltage. Thus, for instance, when the $6^{th}$ input signal is high, the enable signal is low, and the select bits are 011, the pass transistors 2265-2275 start to pull node 2255 high and to push node 2260 low. The low voltage on node 2260, in turn, turns on the pull-up transistor 2225, which, in turn, accelerates the pull-up of node 2255.

The output buffer inverters 2235 and 2240 are used to isolate the circuit 2200 from its load. These buffers are formed by more than one inverters in some embodiments, but the feedback is taken from an inverting node. The outputs of these buffers are the final output 2280 and 2285 of the multiplexer/latch circuit 2200. It should be noted that, in some embodiments, the output buffers 2235 and 2240 are followed by multiple inverters.

The output of each buffer 2235 or 2240 is cross-coupled to the input of the other buffer through a cross-coupling NMOS transistor 2245 or 2250. These NMOS transistors are driven by the enable signal. Whenever the enable signal is low, the cross-coupling transistors are off, and hence the output of each buffer 2235 or 2240 is not cross-coupled with the input of the other buffer. Alternatively, when the enable signal is high, the cross-coupling transistors are ON, which cause them to cross-couple the output of each buffer 2235 or 2240 to the input of the other buffer. This cross-coupling causes the output buffers 2235 and 2240 to hold the value at the output nodes 2280 and 2285 at their values right before the enable signal went active. Also, when the enable signal goes active, the signal that drives the third set 2220 of pass transistors (i.e., the "AND'ing" of the complement of the enable signal and the first select bit S0) goes low, which, in turn, turns off the third pass-transistor set 2220 and thereby turns off the multiplexing operation of the multiplexer/latch circuit 2200.

Figure 24:
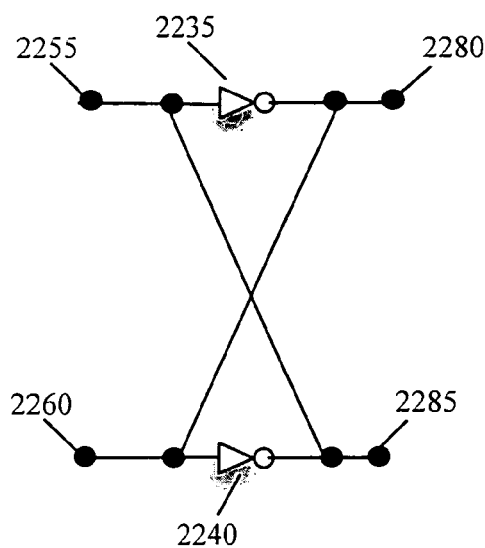
FIG. 24 illustrates an alternative implementation of an output stage of a multiplexer/latch.

Some embodiments do not use the cross-coupling transistors 2245 and 2250 at the output stage of the multiplexer/ latch 2200. For instance, FIG. 24 illustrates an alternative implementation of this output stage. In this implementation, the transistors 2245 and 2250 have been replaced by direct connections between intermediate output node 2255 and final output node 2285 and the intermediate output node 2260 and the final output node 2280. In this implementation, the output inverters 2235 and 2240 need to be weaker inverters so that they can be overdriven by the pass transistors 2210, 2215, and 2220 and/or the pull-up PMOS transistors 2225 and 2230. These output buffers, however, are followed by other output buffering inverters in some embodiments.

Figure 25:
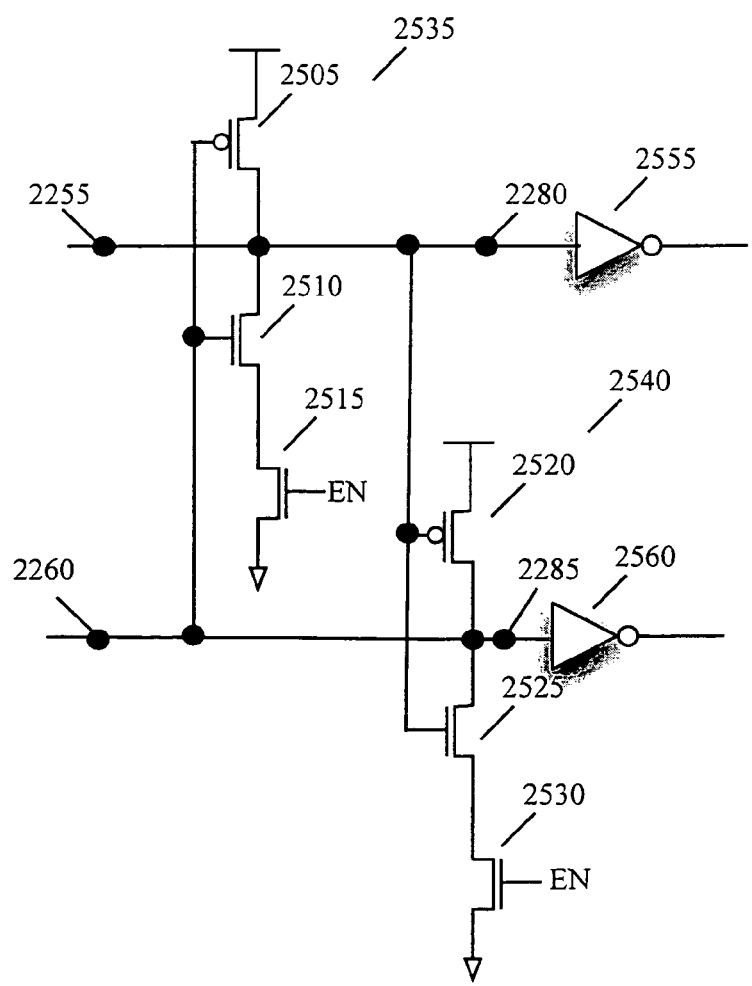
FIG. 25 illustrates yet another implementation of the output stage of the multiplexer/latch.

FIG. 25 illustrates yet another implementation of the output stage of the multiplexer/latch 2200. The cross-coupling transistors 2245 and 2250 have been eliminated in this implementation. In this implementation, the two output buffer inverters between the intermediate output nodes (2255 and 2260) and the final output nodes (2280 and 2285) are traditional CMOS inverters that are stacked on top of an NMOS transistor being driven by an enable signal.

Specifically, the output inverter 2535 is formed by PMOS transistor 2505 and NMOS transistor 2510 that have their outputs and inputs tied (in the traditional manner for forming a CMOS inverter), and by an NMOS transistor 2515 that is being driven by the enable signal. The output inverter 2540 is formed by PMOS transistor 2520 and NMOS transistor 2525 that have their outputs and inputs tied, and by an NMOS transistor 2530 that is being driven by the enable signal.

In addition, the input of each output inverter is tied to the output of the other inverter (i.e., the gates of transistors 2505 and 2510 are tied to the connected drains of PMOS transistor 2520 and NMOS transistor 2525, while the gates of transistors 2520 and 2525 are tied to the connected drains of PMOS transistor 2505 and NMOS transistor 2510). When enabled, this cross coupling establishes the latch. Specifically, when the enable signal is not active (i.e., is low in this case), the output inverters 2535 and 2540 are not operational. Alternatively, when the enable signal is high, the output inverters 2535 and 2540 operate to form a pair of cross-coupled inverters that hold and output the potential at nodes 2255 and 2260.

In some embodiments, these output inverters 2535 and 2540 are followed by other buffer inverters 2555 and 2560. Some embodiments that use the output buffers 2535 and 2540 eliminate the pull-up PMOS transistors 2225 and 2230 that are connected to nodes 2255 and 2260. Alternatively, some embodiments might add the stacked NMOS transistors 2510 and 2515 and NMOS transistors 2525 and 2530 to the pull-up PMOS transistors 2225 and 2230, instead of adding the transistors 2515 and 2530 to inverters 2235 and 2240.

Figure 26:
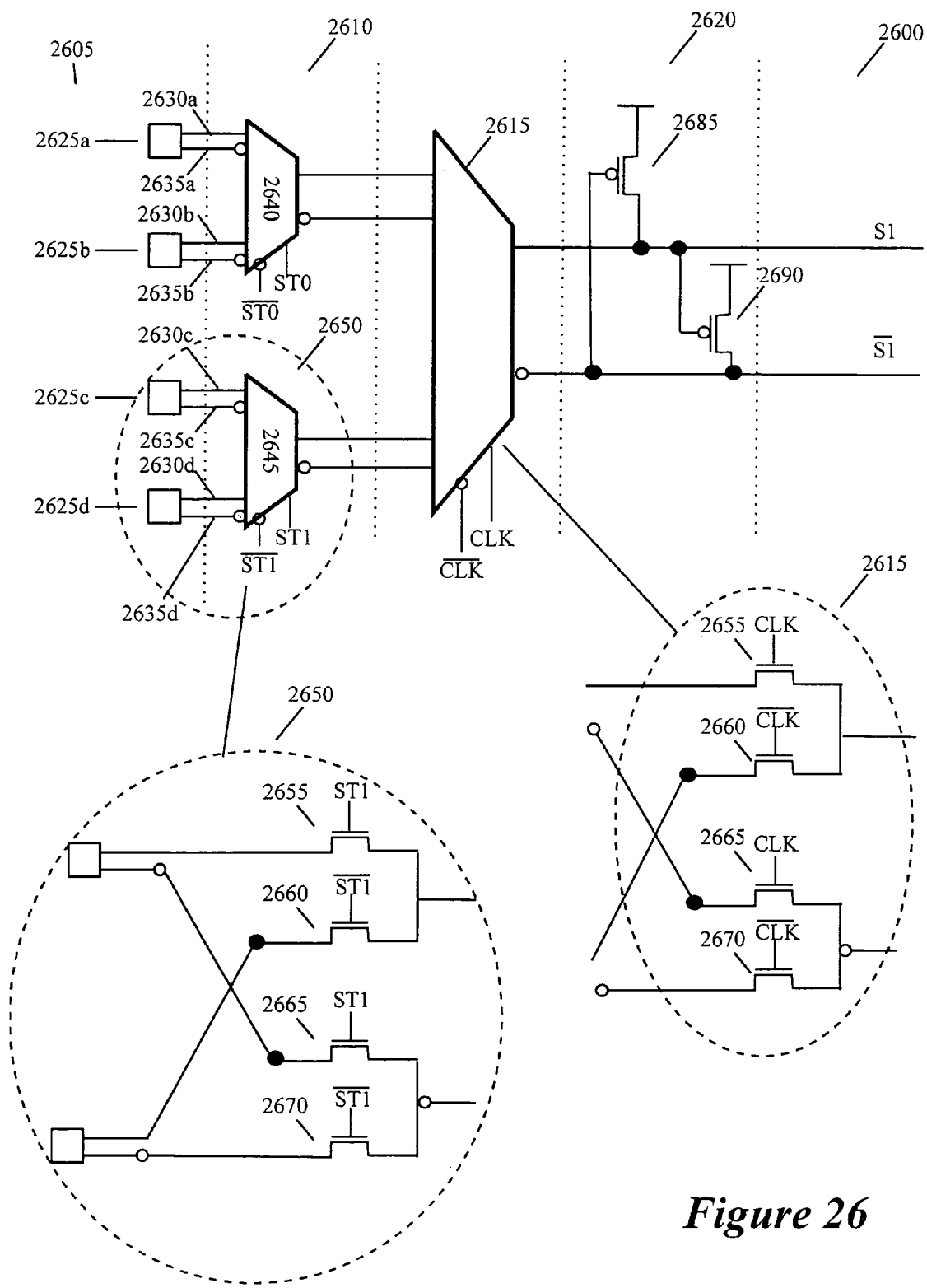
FIG. 26 illustrates a CPL implementation of a two tier multiplexer structure that generates a second signal and its complement
Figure 27:
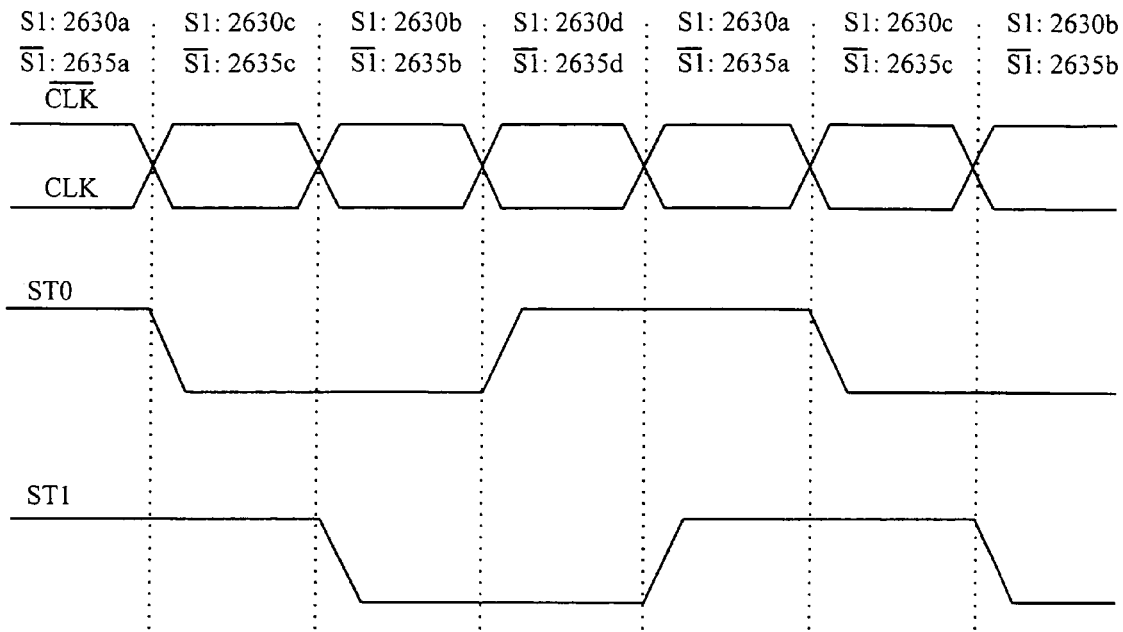
FIG. 27 illustrates an example of the signals CLK, ST0, and ST1.
Figure 28:
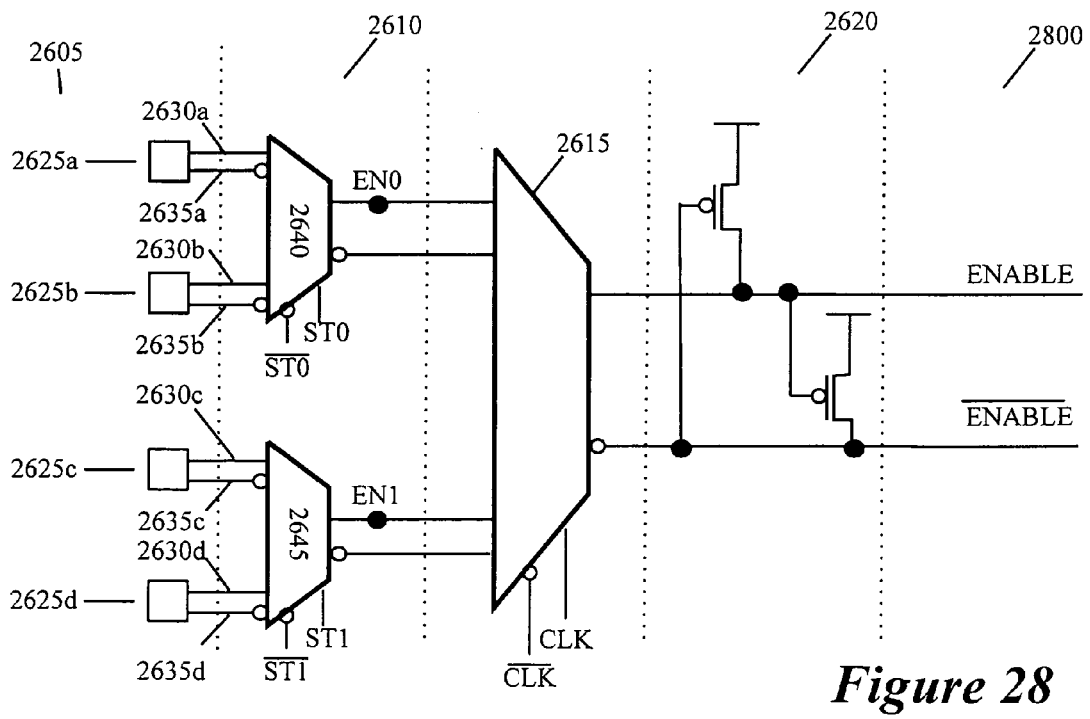
FIG. 28 illustrates a circuit that generates the ENABLE and $\overline{\text{ENABLE}}$ signals that are used to drive the cross-coupling transistors of the multiplexer of FIG. 22.

The multiplexer/storage circuit 2200 of FIG. 22 needs to receive several select and enable signals in order to operate. FIGS. 26-28 illustrate how some embodiments generate such signals. For instance, FIG. 26 illustrates a CPL implementation of a two tier multiplexer structure that generates the second signal S1 and its complement. The S1 select signal and its complement drive the pass transistor set 2215 in FIG. 22. An identical circuit can be used to generate the third select signal S2 and the complement of this signal.

As illustrated in FIG. 26, the select signal generation circuit 2600 can be divided into four sections, which are (1) storage element section 2605, (2) a first two-to-one multiplexer section 2610, (3) second two-to-one multiplexer section 2615, and (4) pull-up PMOS transistor sections 2620. The storage element section 2605 includes four storage elements 2625a-2625d (e.g., four SRAM cells) that store four configuration bits for four sub-cycles. In other words, each storage element provides a configuration bit 2630 and the complement of this bit 2635, where each such pair of bits provides the select bit signal S1 and its complement during a particular sub-cycle.

The second section includes two multiplexers 2640 and 2645 that are driven by two sub-cycle signals ST0 and ST1 that are offset by 90°, and the differential complement $\overline{ST0}$ and $\overline{ST1}$ of these signals. The third section is one two-to-one multiplexer 2615 that is driven by a clock signal CLK and its differential complement $\overline{CLK}$, which operates at twice the frequency of the signals ST0, $\overline{ST0}$, ST1, and $\overline{ST1}$. FIG. 27 illustrates an example of the signals CLK, ST0, and ST1. Some embodiments use the multiplexer/storage circuit 2200 and the select-signal generator 2600 in a configurable IC that implements a design that has a primary clock rate of X MHZ (e.g., 200 MHZ) through a four sub-cycle implementation that effectively operates at 4X MHZ. In some of these embodiments, the two sub-cycle signals ST0 and ST1 would operate at X MHZ, while the clock signal CLK would operate at 2X MHZ.

The fourth section 2620 includes two pull-up PMOS transistors 2685 and 2690, which are used to quickly pull-up the output of the multiplexer 2615 that is high. The two complementary outputs of the multiplexer 2615 provide the select signal S1 and its complement.

FIG. 26 illustrates one possible implementation 2650 of the multiplexer 2645 and the connections of this multiplexer 2645 and the storage elements 2625c and 2625d. As shown in this figure, the multiplexer 2645 can be implemented by four pass transistors, where two transistors 2655 and 2660 receive the true configuration bits 2630c and 2630d from the third and fourth storage elements 2625c and 2625d, while the other two transistors 2665 and 2670 receive the complement configuration bits 2635c and 2635d from the third and fourth storage elements. As further shown, transistors 2655 and 2665 are driven by clock ST1, while transistors 2660 and 2670 are driven by the complement $\overline{ST1}$ of clock ST1. A similar implementation can be used for multiplexer 2640. However, the pass transistors 2655-2670 of the multiplexer 2640 would be driven by the signal ST0 and its complement $\overline{ST0}$.

FIG. 26 also illustrates one possible implementation of the two-to-one multiplexer 2615. This implementation is similar to the implementation 2650 of the multiplexer 2645. However, instead of the signal ST1, the pass transistors 2655-2670 of the multiplexer 2615 are driven by the CLK and $\overline{CLK}$ signals. Also, these transistors receive a different set of input signals. Specifically, the transistors 2655 and 2665 of the multiplexer 2615 receive the true and complement outputs of the multiplexer 2640, while the transistors 2660 and 2670 of the multiplexer 2615 receive the true and complement outputs of the multiplexer 2645.

The transistors 2655 and 2665 of the multiplexer 2645 (1) output the true and complement configuration bits stored in the storage elements 2625c when the clock ST1 is high, and (2) output the true and complement configuration bits stored in the storage elements 2625d when the signal ST1 is low. Similarly, the transistors 2655 and 2665 of the multiplexer 2640 (1) output the true and complement configuration bits stored in the storage elements 2625a when the clock ST0 is high, and (2) output the true and complement configuration bits stored in the storage elements 2625b when the signal ST0 is low. Finally, the transistors 2655 and 2665 of the multiplexer 2615 (1) output the true and complement output bits of the multiplexer 2640 when the clock CLK is high, and (2) output the true and complement output bits of the multiplexer 2645 when the clock signal CLK is low.

Given the above-described operations of multiplexers 2640, 2645, and 2615, and given the 90° offset between signals ST0 and ST1 and the faster frequency of the clock signal CLK, FIG. 27 illustrates the value of the select signal S1 and its complement that the circuit 2600 generates during each half-cycle of the clock signal CLK. This clocking scheme hides all the timing of the selection of the configuration bits from the storage elements 2625 behind the two-to-one multiplexer 2615. For instance, while the multiplexer 2640 is switching between outputting the configuration bits stored in cell 2625a and the bits stored in cell 2625b, the clocking scheme directs the multiplexer 2615 to output the configuration bits previously selected by the multiplexer 2645 (i.e., the configuration bits stored in cell 2625c). Similarly, while the multiplexer 2645 is switching between outputting the configuration bits stored in cell 2625c and the bits stored in cell 2625d, the clocking scheme directs the multiplexer 2615 to output the configuration bits previously selected by the multiplexer 2640 (i.e., the configuration bits stored in cell 2625b).

In some embodiments, the two signals ST0 and ST1 operate at X MHZ, while the clock signal CLK would operate at 2X MHZ, as mentioned above. Hence, when implementing a design that has a primary clock rate of X MHZ through a four sub-cycle implementation that effectively operates at 4X MHZ, this clocking scheme allows the configuration bits to be read from the storage elements at an effective rate of 4X MHZ without the need for a 4X MHZ clock. Some embodiments globally distribute the differential pair of CLK and $\overline{CLK}$ signals, while locally generating the differential signals STO, $\overline{STO}$, ST1, and $\overline{ST1}$. Examples of such distribution and generation are further described in Section IV.

FIG. 28 illustrates a circuit 2800 that generates the ENABLE and $\overline{ENABLE}$ signals that are used to drive the cross-coupling transistors 2245 and 2250 of the multiplexer 2200 of FIG. 22. The circuit 2800 is identical to the circuit 2600 of FIG. 26, with the exception that the storage elements 2625 in circuit 2800 do not store configuration bits for defining a select signal. Instead, these storage elements store configuration bits for defining the value of the ENABLE signal and its complement during different sub-cycles.

Figure 29:
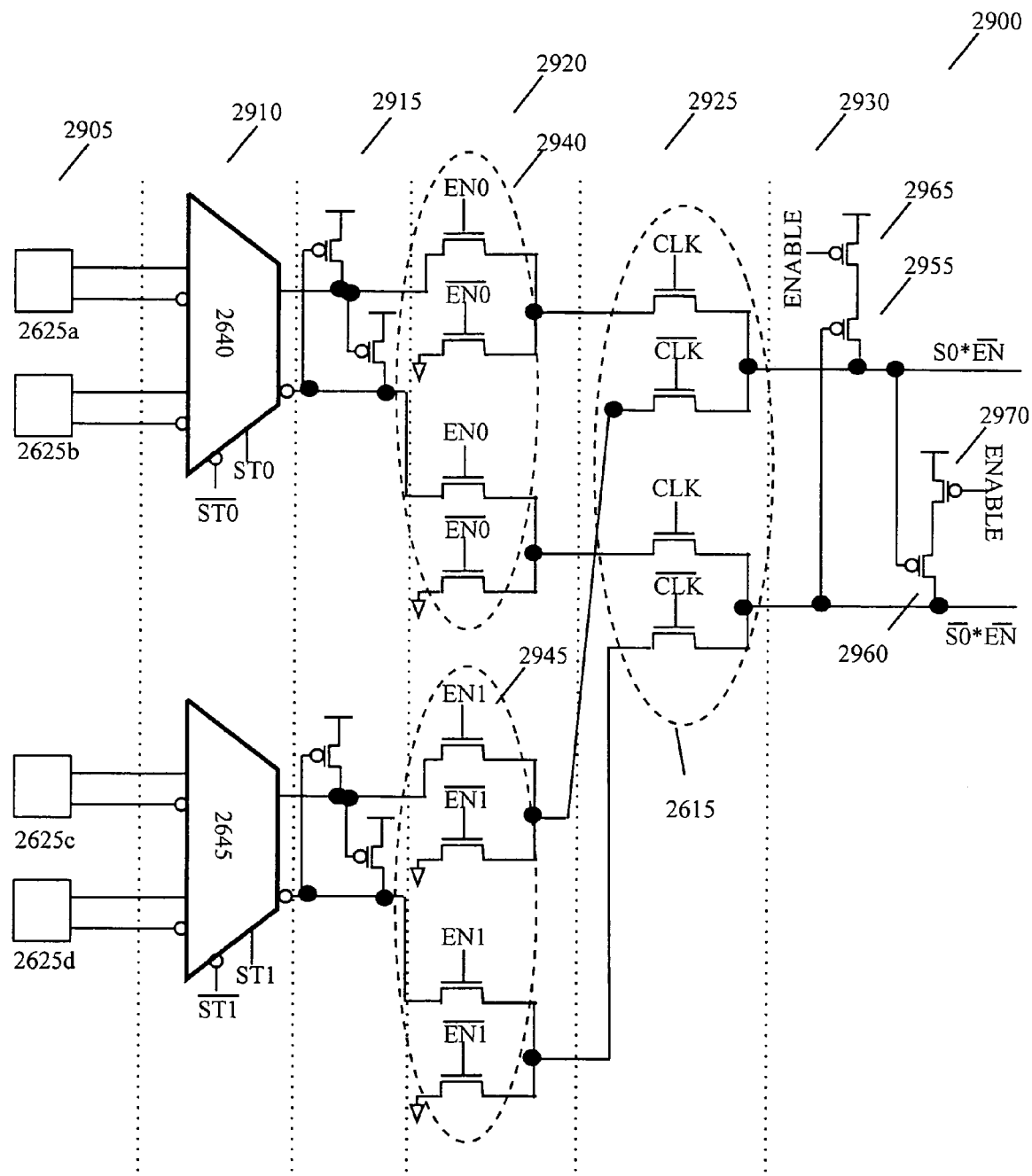
FIG. 29 illustrates a CPL implementation of how some embodiments generate the signals that drive the third-set pass transistors in FIG. 22.

FIG. 29 illustrates a CPL implementation of how some embodiments generate the signals that drive the third-set pass transistors 2220 in FIG. 22. As mentioned above, these signals are produced by "AND'ing" the first select bit S0 or its complement with the complement of the enable signal. The circuit 2900 illustrated in FIG. 29 can be divided into six sections, which are (1) storage element section 2905, (2) first two-to-one multiplexer stage 2910, (3) a first pull-up transistor stage 2915, (4) a second two-to-one multiplexer stage 2920, (5) a third two-to-one multiplexer section 2925, and (6) a second pull-up transistor stage 2930.

The storage element section 2905 is identical to the storage element section 2605 of the circuit 2600 of FIG. 26, with the exception that the storage elements in FIG. 29 store configuration bits for the first select signal S0, instead of storing configuration bits for the second select signal S1. In other words, each storage element 2625 provides a configuration bit 2630 and the complement of this bit 2635, where each such pair of bits provides the select bit signal S0 and its complement during a particular sub-cycle.

The second section 2910 includes two multiplexers 2640 and 2645 that are identical to the two multiplexers 2640 and 2645 of the circuit 2600 of FIG. 26. As in circuit 2600, the multiplexers 2640 and 2645 are for outputting the configuration bits from cells 2625a, 2625b, 2625c, and 2625d. The third section 2915 includes four pull-up PMOS transistors, which are used to quickly pull-up the outputs of the multiplexers 2640 and 2645 that are high. Some embodiments might not include these pull-up PMOS transistors.

The fourth section 2920 include two two-to-one multiplexers 2940 and 2945 that "AND" the output of the multiplexers 2640 and 2645 with the enable-related signals EN0 and EN1. The enable-related signals EN0 and EN1 are generated at the outputs of the multiplexers 2640 and 2645 of the circuit 2800, as shown in FIG. 28.

The fifth section 2925 is one two-to-one multiplexer 2615 that is driven by a clock signal CLK, which operates at twice the frequency of the signals ST0 and ST1. The signals ST0, ST1, and CLK are illustrated in FIG. 27, as described above. Also, as mentioned above, the use the two-to-one multiplexer 2615 and the clocking signals CLK, ST0, and ST1 and their differential complements, hides all the timing of the selection of the configuration bits from the storage elements 2625 behind the two-to-one multiplexer 2615.

The sixth section 2930 includes two pull-up transistors 2955 and 2960 that are respectively connected in series with two other PMOS transistors 2965 and 2970, which are controlled by the ENABLE signal generated by the circuit 2800 of FIG. 28. When the ENABLE signal is low, the cross-coupling transistors 2245 and 2250 of the circuit 2200 are OFF, and hence the multiplexer/storage circuit 2200 is not latching its output but instead is providing the output of the multiplexer 2200. During this period, the low ENABLE signal turns on the pull-up transistors stacks formed by transistors 2955 and 2965 and transistors 2960 and 2970, so that they can quickly pull up the high output of the two-to-one multiplexer 2615.

On the other hand, when the ENABLE signal is high, the cross-coupling transistors 2245 and 2250 of the circuit 2200 are ON. This, in turn, causes the circuit 2200 to latch its output. During this period, the high ENABLE signal turns off the transistors 2965 and 2970, which disables the pull-up functionality of the pull-up transistors of the sixth section 2930.

FIG. 30 illustrates a block diagram representation of the interconnect/storage circuit 2200 of FIG. 22. This block diagram represents this circuit in terms of an interconnect circuit 3010 and a latch 3005 that is built in the output stage of the interconnect circuit 3010. FIG. 30 illustrates the latch to be driven by a latch enable signal.

III. Alternative Architectures

FIGS. 15, 20, and 21 illustrated several configurable circuit architectures that included the invention's circuits (e.g., the invention's interconnect/storage circuits). Other embodiments, however, use the invention's circuits in other architectures. One such architecture is illustrated in FIGS. 31-36.

Figure 31:
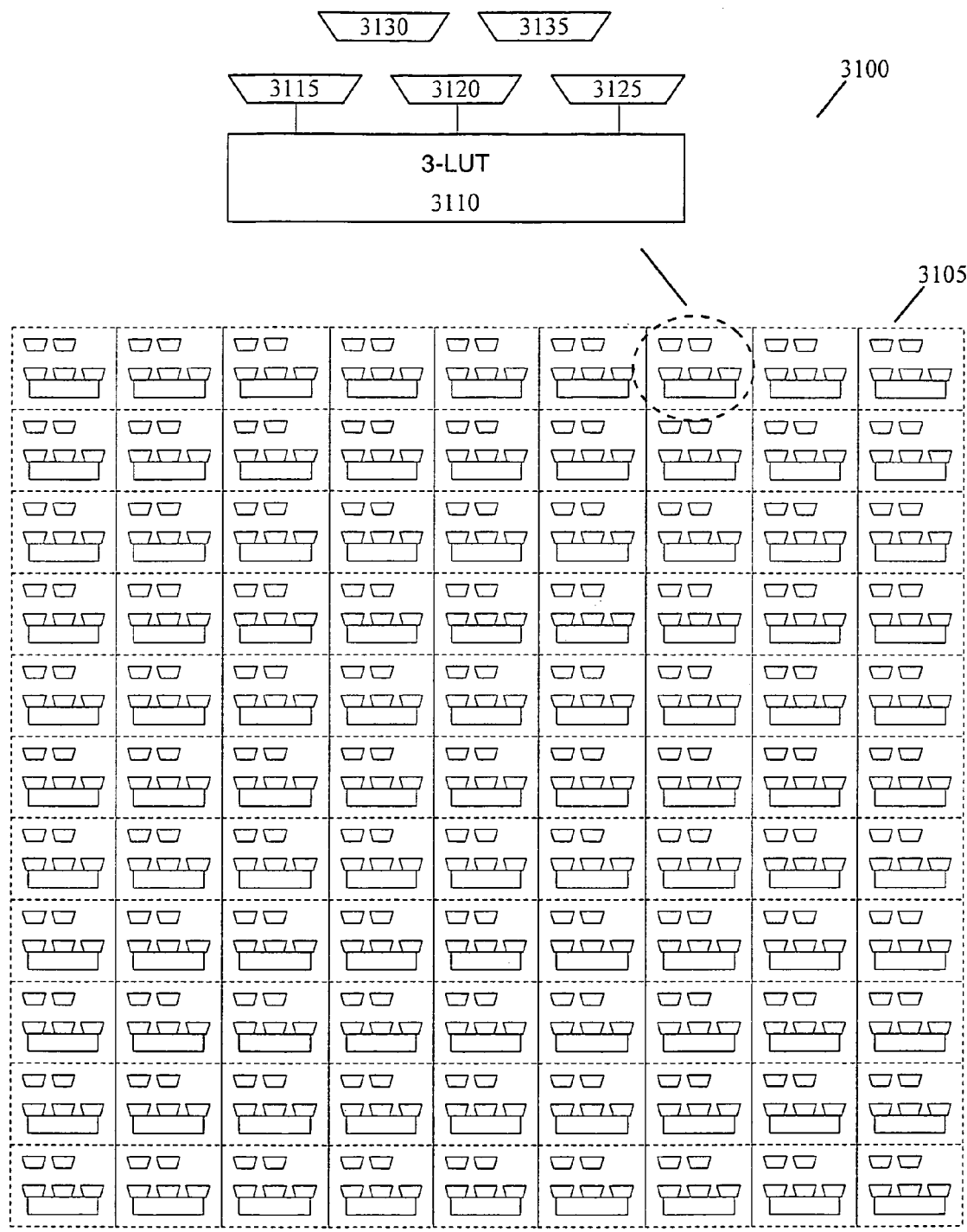
FIGS. 31-36 illustrate a configurable circuit architecture that is formed by numerous configurable tiles that are arranged in an array with multiple rows and columns.
Figure 32:
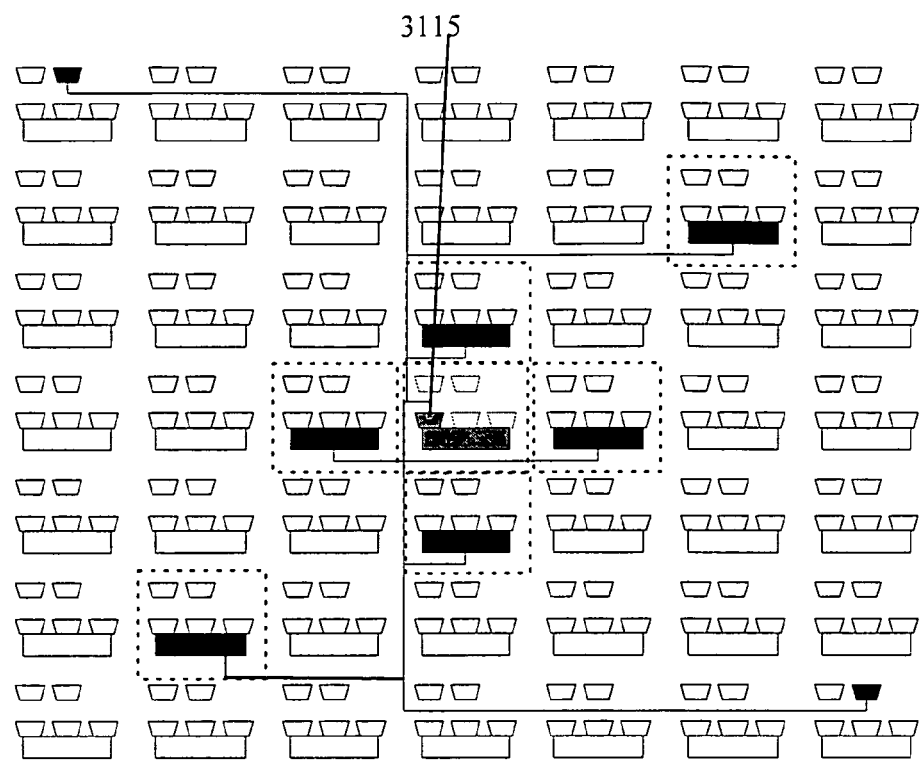
Figure 33:
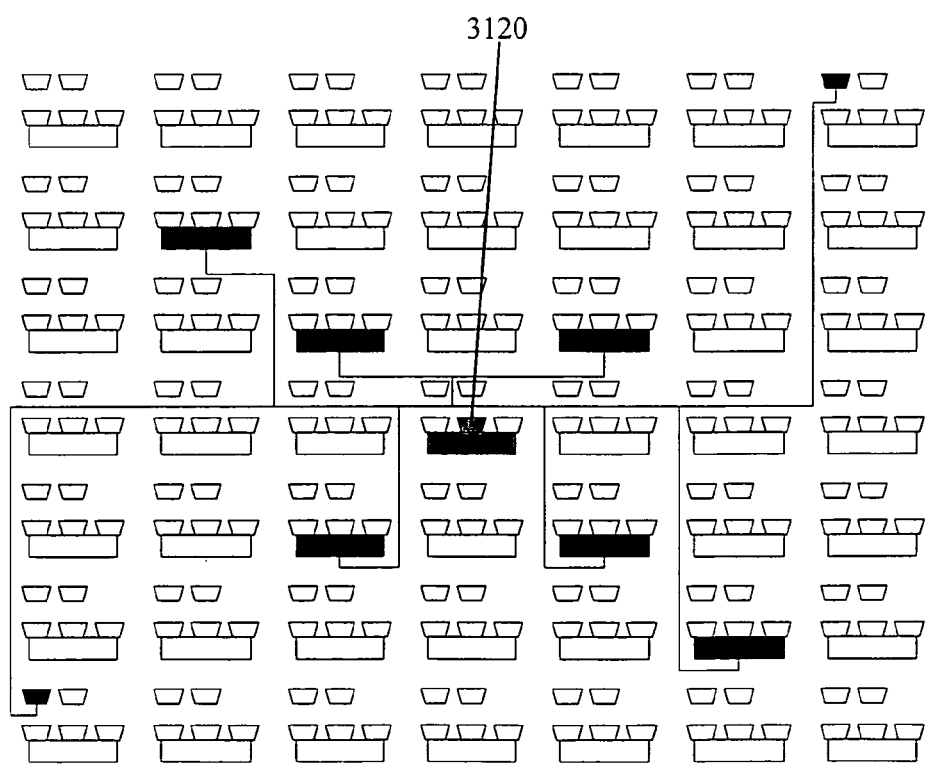
Figure 34:
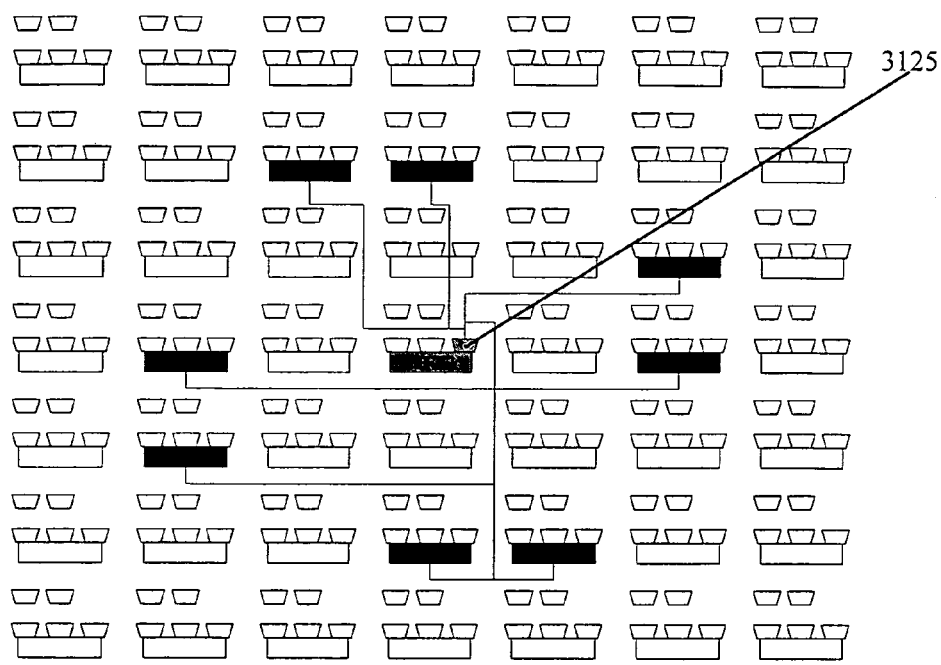
Figure 35:
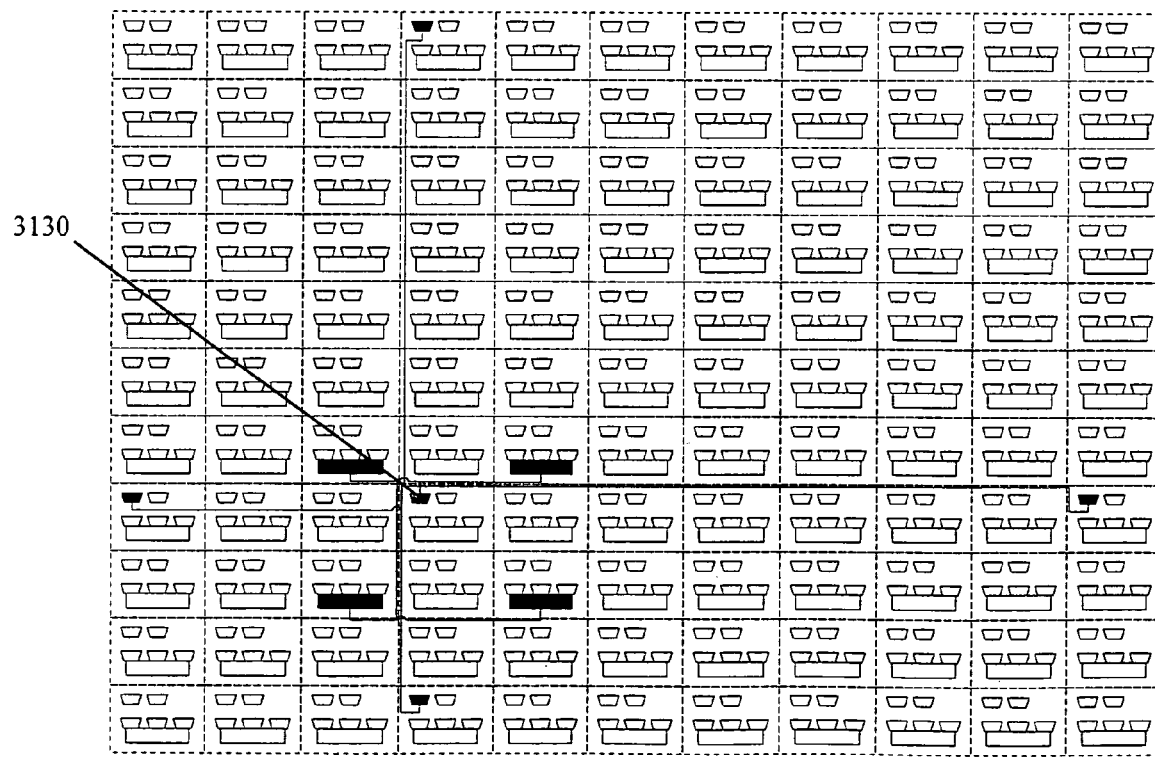
Figure 36:
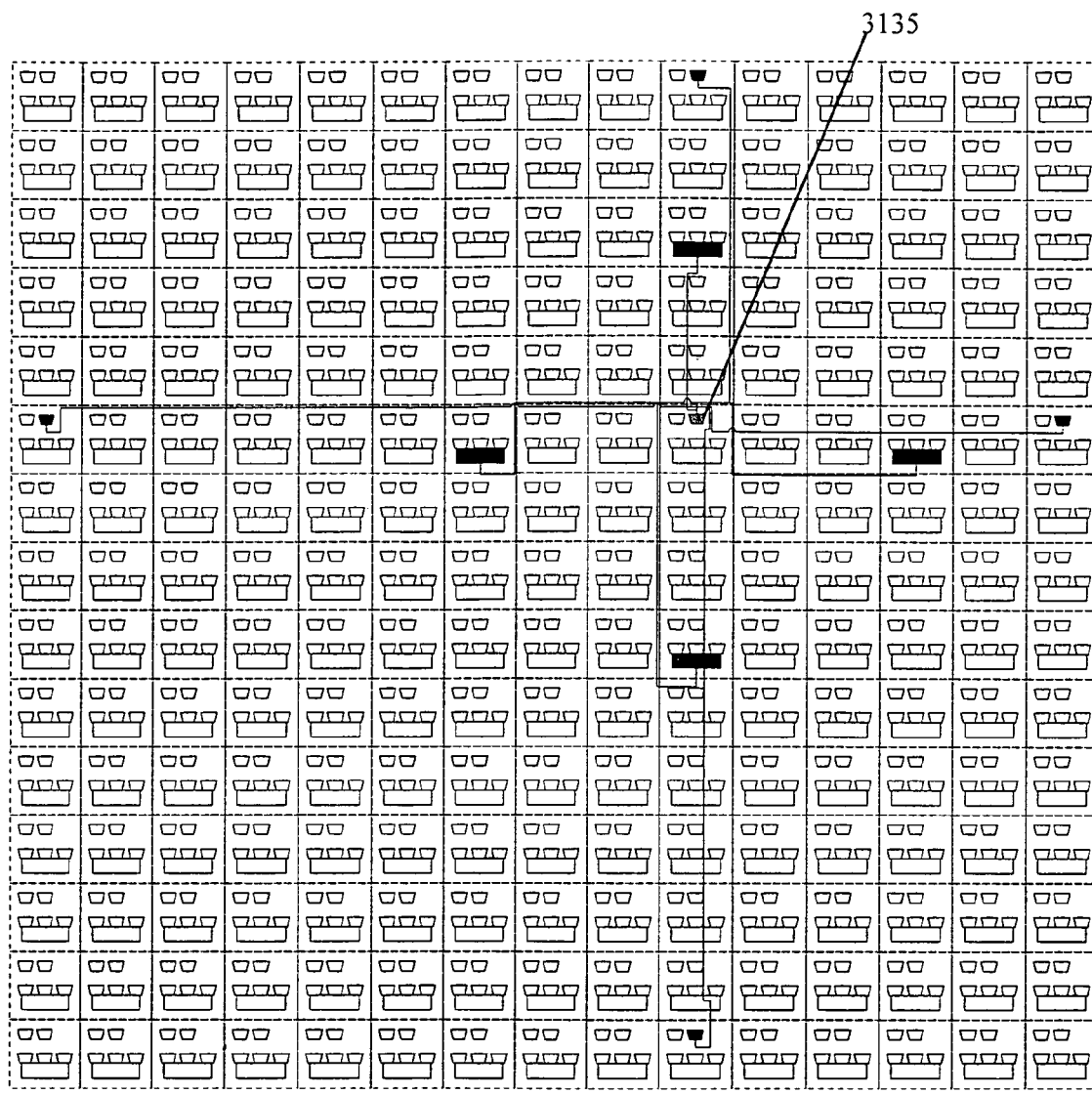

As shown in FIG. 31, this architecture is formed by numerous configurable tiles 3105 that are arranged in an array with multiple rows and columns. In FIGS. 31-36, each configurable tile includes a sub-cycle reconfigurable three-input LUT 3110, three sub-cycle reconfigurable input-select multiplexers 3115, 3120, and 3125, and two sub-cycle reconfigurable routing multiplexers 3130 and 3135. Other configurable tiles can include other types of circuits, such as memory arrays instead of logic circuits.

In FIGS. 31-36, an input-select multiplexer is an interconnect circuit associated with the LUT 3110 that is in the same tile as the input select multiplexer. One such input select multiplexer receives several input signals for its associated LUT and passes one of these input signals to its associated LUT.

In FIGS. 31-36, a routing multiplexer is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to other interconnect circuits.

FIGS. 32-36 illustrate the connection scheme used to connect the multiplexers of one tile with the LUT's and multiplexers of other tiles. This connection scheme is further described in U.S. Application entitled "Configurable IC with Routing Circuits with Offset Connections", filed concurrently with this application with the Ser. No. 11/082,193. This application is incorporated herein by reference.

In the architecture illustrated in FIGS. 31-36, each tile includes one three-input LUT, three input-select multiplexers, and two routing multiplexers. Other embodiments, however, might have a different number of LUT's in each tile, different number of inputs for each LUT, different number of input-select multiplexers, and/or different number of routing multiplexers. For instance, some embodiments might employ an architecture that has in each tile: one three-input LUT, three input-select multiplexers, and eight routing multiplexers. Several such architectures are further described in the above-incorporated patent application.

Figure 37:
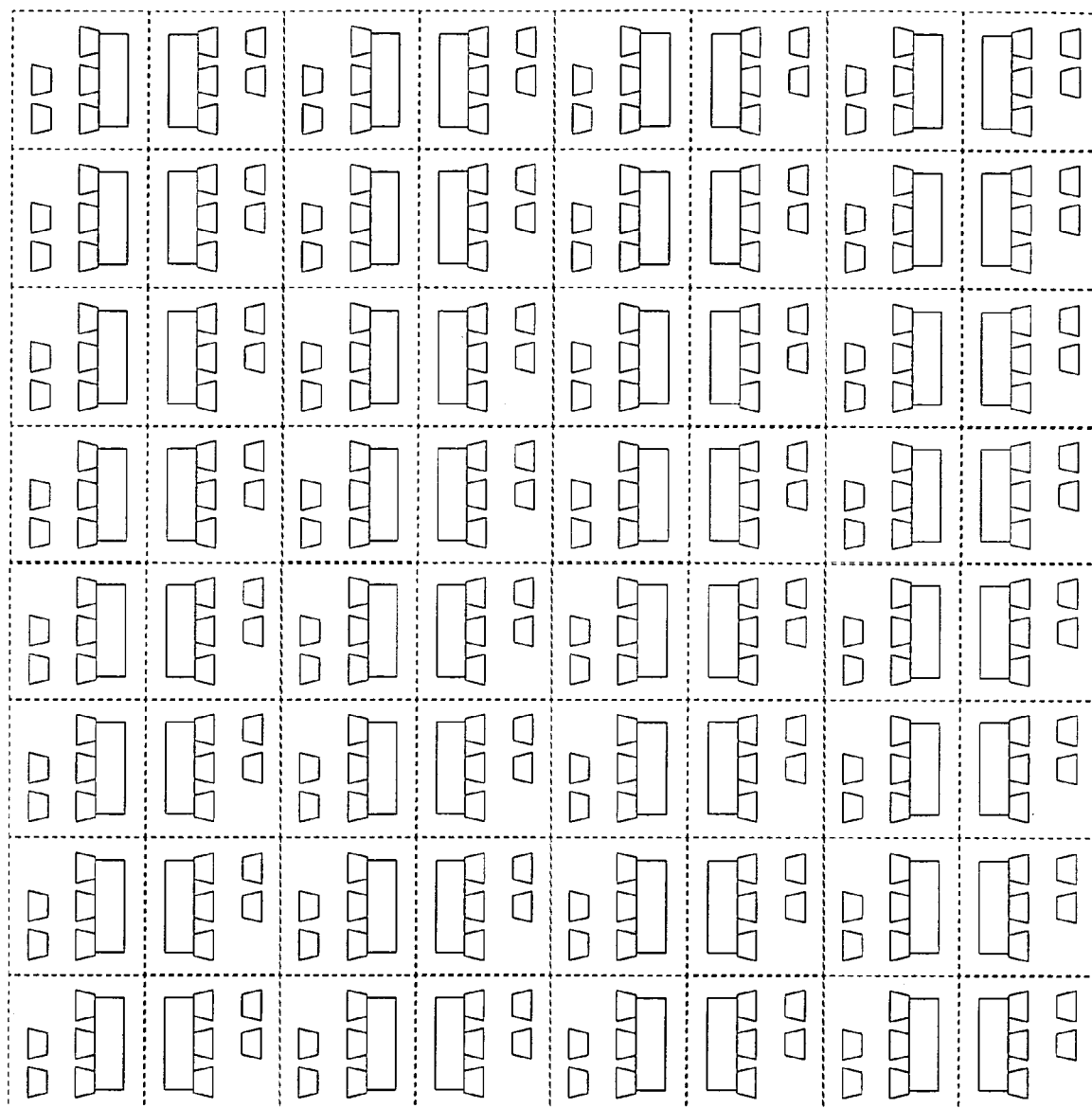
FIG. 37 provides one possible physical architecture of the configurable IC illustrated in FIG. 31.

In some embodiments, the examples illustrated in FIGS. 31-36 represent the actual physical architecture of a configurable IC. However, in other embodiments, the examples illustrated in FIGS. 31-36 topologically illustrate the architecture of a configurable IC (i.e., they show connections between circuits in the configurable IC, without specifying (1) a particular geometric layout for the wire segments that establish the connection, or even (2) a particular position of the circuits). In some embodiments, the position and orientation of the circuits in the actual physical architecture of a configurable IC is different from the position and orientation of the circuits in the topological architecture of the configurable IC. Accordingly, in these embodiments, the IC's physical architecture appears quite different from its topological architecture. For example, FIG. 37 provides one possible physical architecture of the configurable IC 3100 illustrated in FIG. 31. This and other architectures are further described in the above-incorporated patent application.

IV. Clock Distribution and Sub-Cycle Signal Generation Schemes

Several embodiments were described above by reference to examples of sub-cycle reconfigurable circuits that operate based on four different sets of configuration data. In some of these examples, a reconfigurable circuit receives its four different configuration data sets sequentially in an order that loops from the last configuration data set to the first configuration data set. Such a sequential reconfiguration scheme is referred to as a 4 "loopered" scheme.

Figure 38:
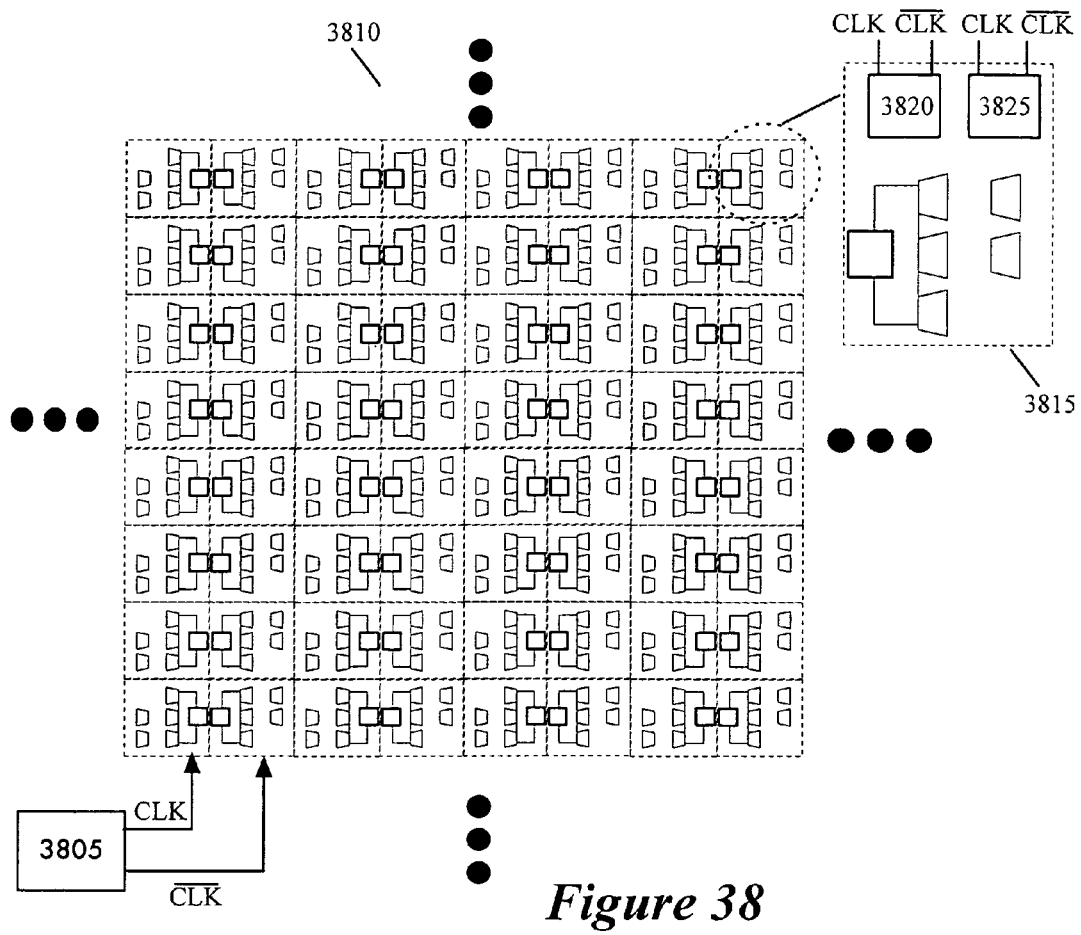
FIG. 38 illustrates an example of how the differential pairs of clock signals CLK and $\overline{\text{CLK}}$ are distributed by some embodiments

To facilitate this 4 loopered scheme, some embodiments use a tiered multiplexer structure that uses the clocks signals CLK, ST0, and ST1, as described above. Some of these embodiments globally distribute the differential pair of CLK and $\overline{CLK}$ signals, while locally generating the differential signals ST0, $\overline{ST0}$, ST1, and $\overline{ST1}$. FIG. 38 illustrates an example of how the differential pairs of clock signals CLK and $\overline{CLK}$ are distributed by some embodiments. As shown in this figure, some embodiments use a global clock generator 3805 to generate the differential clock signals CLK and $\overline{CLK}$.

In the example illustrated in FIG. 38, the global clock generator 3805 is outside of the configurable tile arrangement 3810 (e.g., the generator 3805 might be on a different circuit than the IC that includes the configurable tile arrangement 3810, or it might be partially or completely on the IC that includes the arrangement 3810 but positioned outside of the arrangement). However, in other embodiments, this global clock generator can be placed within the configurable tile arrangement 3810.

Through clock distribution tree structure, the differential clock signals generated by the generator 3805 are routed to the configurable logic and interconnect circuits in the tile arrangement. In some embodiments, this tree structure is a combination of a recursive H tree structure that at its lowest leaf level becomes fishbone tree structures. Other embodiments might use other well known clock distribution architectures.

In some embodiments, the globally distributed differential clock signals CLK and $\overline{CLK}$ are received by two local sub-cycle signal generators 3820 and 3825 in each tile, as illustrated in the enlarged view 3815 of a tile in FIG. 38. The local generator 3825 in each tile provides the differential clock pair ST0 and $\overline{ST0}$, and pair ST1 and $\overline{ST1}$, for the tiered multiplexer structures that retrieve and provide configuration data sets to the routing multiplexers of the tile. The local generates 3820 in each tile provides the differential signal pair ST0 and $\overline{ST0}$, and pair ST1 and $\overline{ST1}$, for the tiered multiplexer structures that retrieve and provide configuration data sets to the input select multiplexers and three-input LUT's of the tile.

Having different local sub-cycle signal generators for different tiles allows the embodiments illustrated in FIG. 38 to have different tiles operate on different clock domains (i.e., on different global clock signals that are based on different clock domains). Specifically, some embodiments include one global clock generator for each clock domain that the reconfigurable IC can handle. For instance, an IC design might require the IC to interface with two bus interfaces that operate at two different rates and to implement a particular design that operates at yet another rate. In such a situation, the reconfigurable IC might include three global clock generators, two for generating the clock signals associate with the two bus interfaces and one for receiving the design clock signal, as illustrated in FIG. 39.

Figure 39:
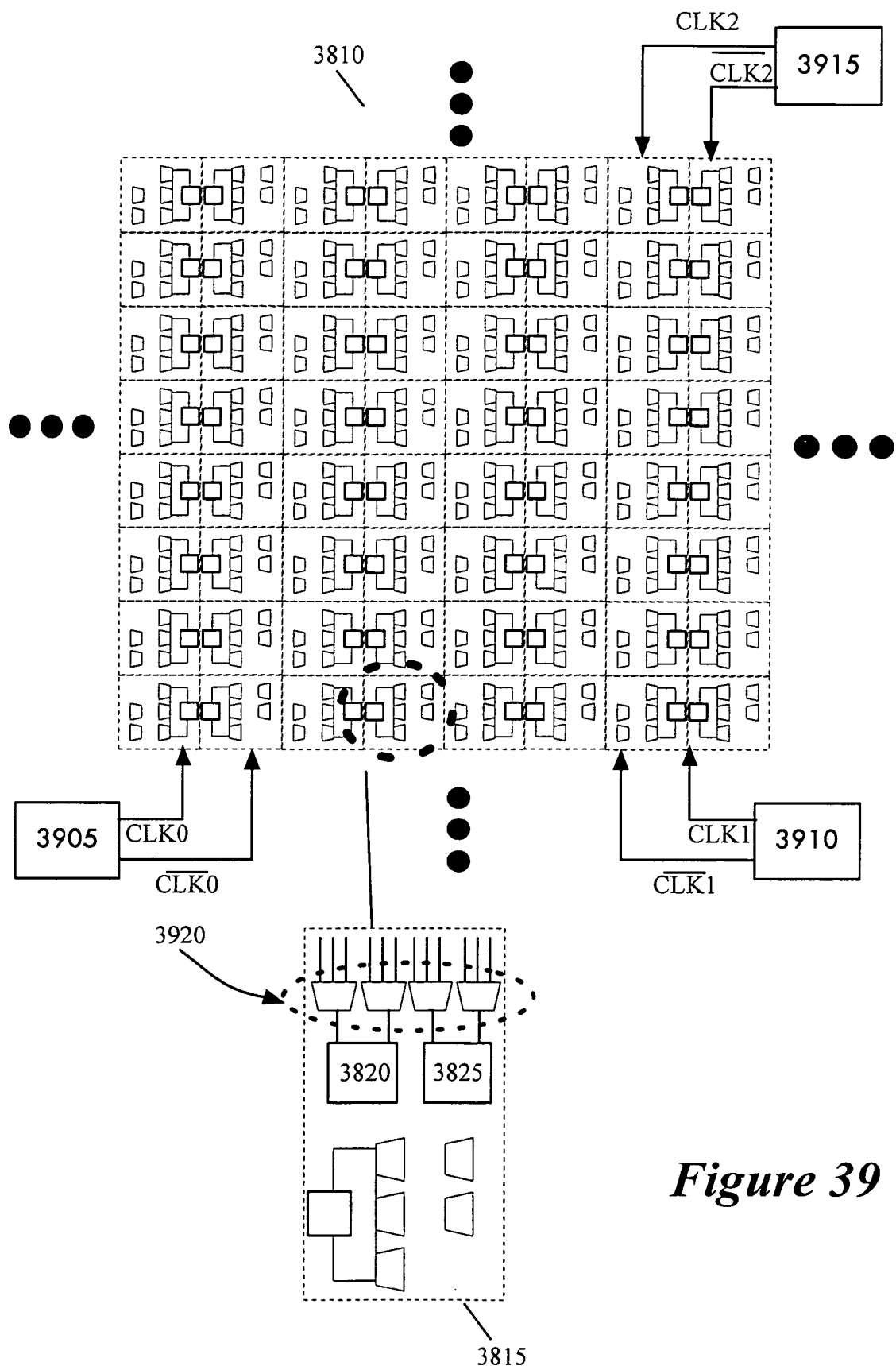
FIG. 39 illustrates a reconfigurable IC that includes three global clock generators, two for generating the clock signals associate with the two bus interfaces and one for receiving the design clock signal.

In some embodiments, the three global clock generators 3905, 3910, and 3915 in FIG. 39 are on the configurable IC and generate their three clocks based on three clocks signals that they received from outside of the IC. As shown in FIG. 39, the local sub-cycle signal generators within a configurable tile are preceded by a set of multiplexers 3920 that route one of the globally distributed clocks and its complement to each local sub-cycle signal generator. The local sub-cycle signal generators in the tiles then generate their local clocks ST0 and ST1 based on the received global clocks CLK. For instance, in the example mentioned above, the local sub-cycle signal generators of the set tiles that implement one bus interface receive the global clock signal for that bus interface and generate the local sub-cycle signals that are needed to achieve the operational rate for implementing the particular bus interface.

Having two different local sub-cycle signal generators 3820 and 3825 for each tile allows the embodiments illustrated in FIG. 38 to have the routing multiplexers of a tile operate on different clock domains than the input select multiplexers and the LUT of the tile. This is beneficial for allowing the routing multiplexers of a tile to be used to route signals that belong to different clock domains than the logic circuits of the tile.

Figure 40:
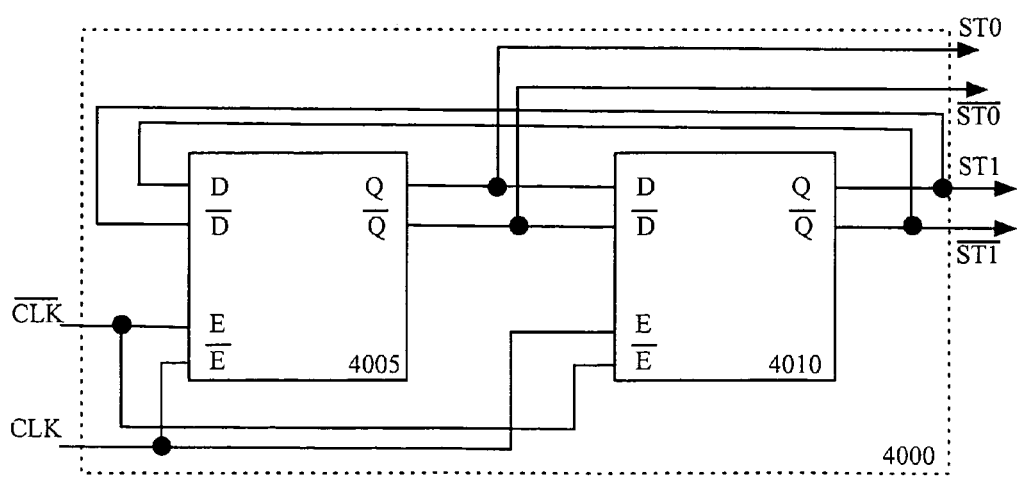
FIG. 40 illustrates a CPL-implementation of a local sub-cycle signal generator of some embodiments.

FIG. 40 illustrates a CPL-implementation of a local sub-cycle signal generator 4000 of some embodiments. This local sub-cycle signal generator is formed by two latches 4005 and 4010 that are connected in a looped master-slave arrangement. Given that the output of the second latch 4010 is fed back in a cross-coupled manner to the input of the first latch 4005, either of the latches can be viewed as the master latch, and the other latch can be viewed as the slave latch.

The latches 4005 and 4010 are either active high latches or active low latches. Also, as shown in FIG. 40, the enable inputs of the latches are driven by the CLK signal and its complement. Given these enable signals and the fact that the latches are either active high or active low, the looped master-slave latch arrangement of the generator 4000 can be used to generate two offset clocks signals ST0 and ST1 that operate at half the rate of the clock signal CLK. In other words, as shown in FIG. 40, the outputs of the latches 4005 and 4010 provide the signals ST0 and ST1 and their complements, where the signals ST0 and ST1 are offset by 90°.

V. Eight and Six "Loopered" Architectures

Several embodiments were described above by reference to examples of four loopered, sub-cycle reconfigurable circuits. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set. Several examples of six and eight loopered circuits and clock distribution will now be described.

A. Eight "Loopered" Architecture

To implement an eight loopered reconfigurable IC, some embodiments use an architecture that is a slightly modified version of the architectures described above. Specifically, in the eight loopered architecture, these embodiments (1) store eight configuration data sets for each sub-cycle configurable circuit, (2) use modified multi-tiered multiplexer structures for supplying configuration data sets to the configurable circuits, and (3) use a different clocking scheme to control the modified multi-tiered multiplexer structure.

Figure 41:
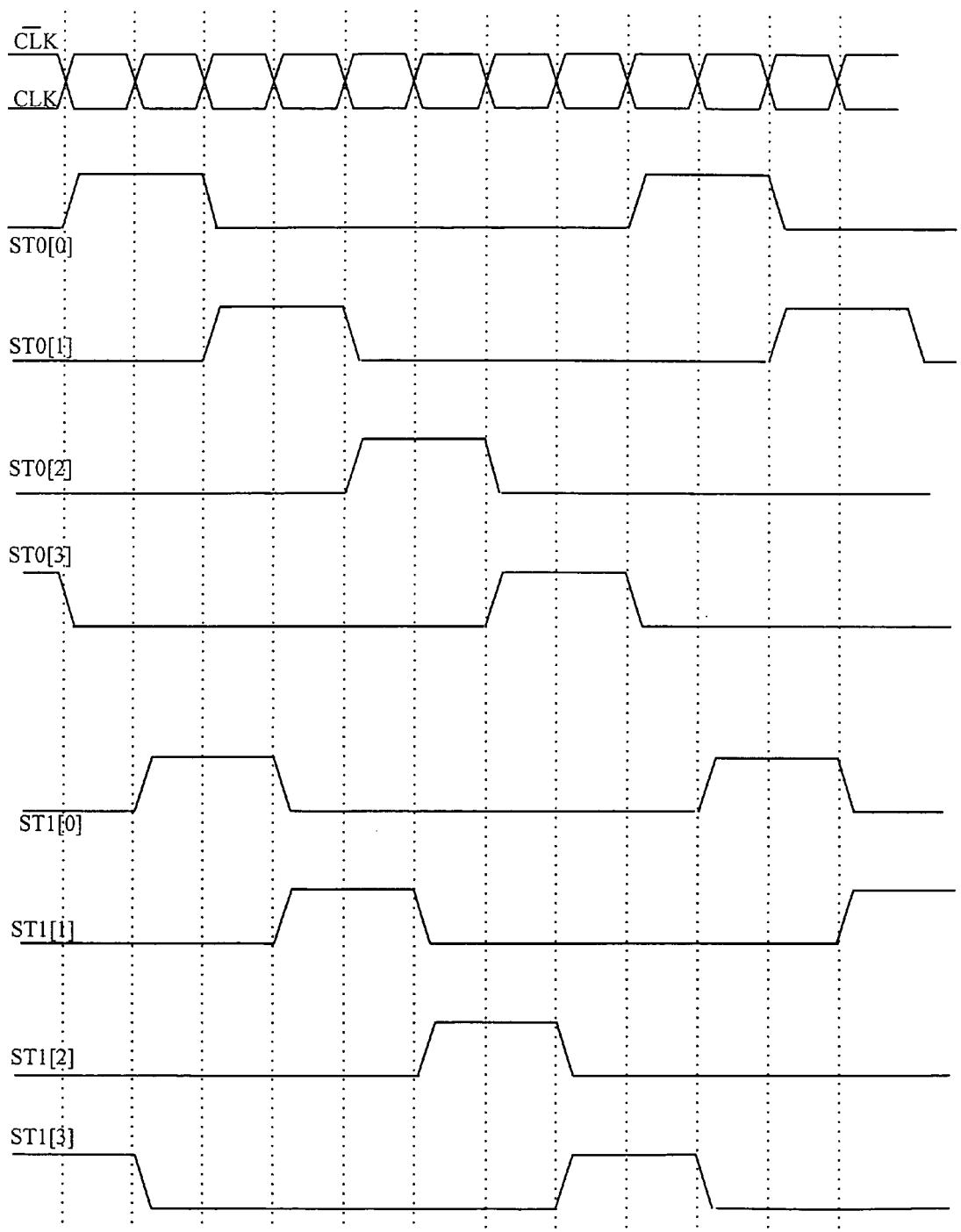
FIG. 41 illustrates the timing between the CLK signals and the two sets of four one-hot signals.

As mentioned above, some embodiments implement a four loopered design by using four storage elements 2605, two multiplexers 2640 and 2645, and two 90°-offset signals ST0 and ST1, to provide a configuration bit to a configurable circuit. To provide a configuration bit to a configurable circuit in an eight loopered architecture, some embodiments use (1) eight storage elements instead of four, (2) two multiplexers different than the multiplexers 2640 and 2645, and (3) two sets of four "one-hot" signals, ST0[0], ST0[1], ST0[2], ST0[3], ST1[0], ST1[1], ST1[2], and ST1[3], instead of two signals ST0 and ST1. Four one-hot signals are four signals that at most have only one signal active (e.g., high) at any given time. FIG. 41 illustrates an example of two sets of one-hot signals.

Figure 42:
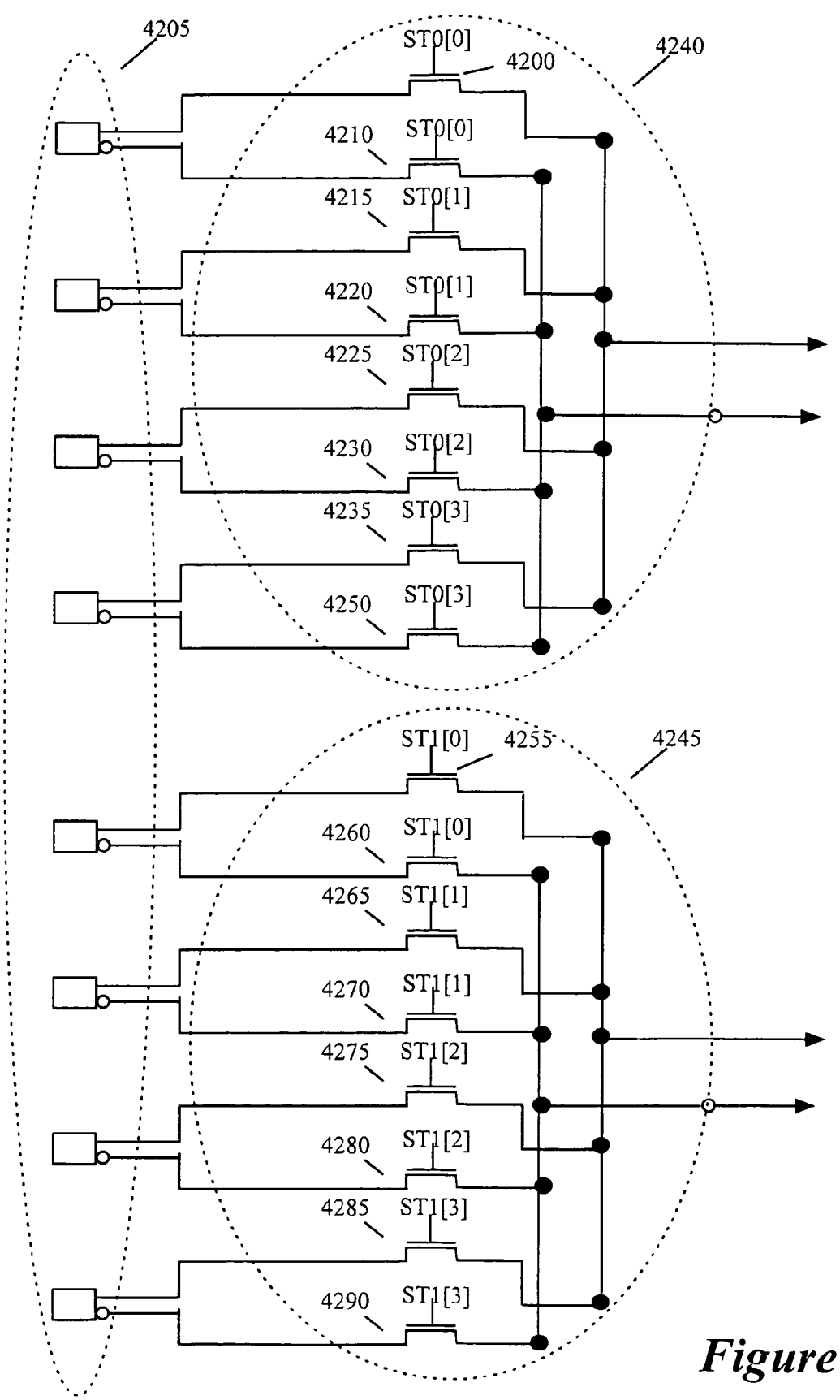
FIG. 42 illustrates an example of a CPL-implementation of eight storage elements and two modified multiplexers, which are driven by two sets of four "one-hot" signals.

FIG. 42 illustrates an example of a CPL-implementation of eight storage elements 4205 and two modified multiplexers 4240 and 4245, which are driven by two sets of four "one-hot" signals ST0[0], ST0[1], ST0[2], ST0[3], ST1[0], ST1[1], ST1[2], and ST1[3]. In an eight loopered architecture of some embodiments, these eight storage elements 4205 and two modified multiplexers 4240 and 4245 replace the four storage elements 2605 and two multiplexers 2640 and 2645, in each of the circuits illustrated in FIGS. 26, 28, and 29.

As shown in FIG. 42, the modified multiplexers 4240 and 4245 are each formed by four pairs of NMOS transistors. The drains of the eight pairs of transistors connect to the outputs of the storage cells. In multiplexer 4240, each pair of transistors is driven by one of the four ST0 signals. In multiplexer 4245, each pair of transistors is driven by one of the four ST1 signals. In each multiplexer 4240 or 4245, the sources of one transistor from each pair of transistors are tied together, while the sources of the other transistors in each pair are also tied together.

Given the timing diagram of the ST0 and ST1 signals that is illustrated in FIG. 41, the modified multiplexers 4240 and 4245 operate in a time interleaved manner that provides the configuration bits stored in the storage cells. Specifically, given that the timing signals ST0 and ST1 are offset by 90°, one multiplexer always is providing a stable output of the contents of a storage cell, while the other multiplexer is switching between the contents of a pair of its storage cells. When the eight loopered circuitry illustrated in FIG. 42 is used in the multi-tiered circuitry of FIGS. 26, 28, and 29, the interleaved outputting and switching operations are behind another multiplexer 2615 that is driven by signal CLK and its complement.

FIG. 41 illustrates the timing between the CLK signals and the two sets of four one-hot signals. Given this timing relationship, the multiplexer 2615 hides the switching operations of the multiplexers 4240 and 4245 by outputting, in each half CLK cycle, its input signal that comes from the multiplexer 4240 or 4245 that is providing the stable signal for that half cycle.

Figure 43:
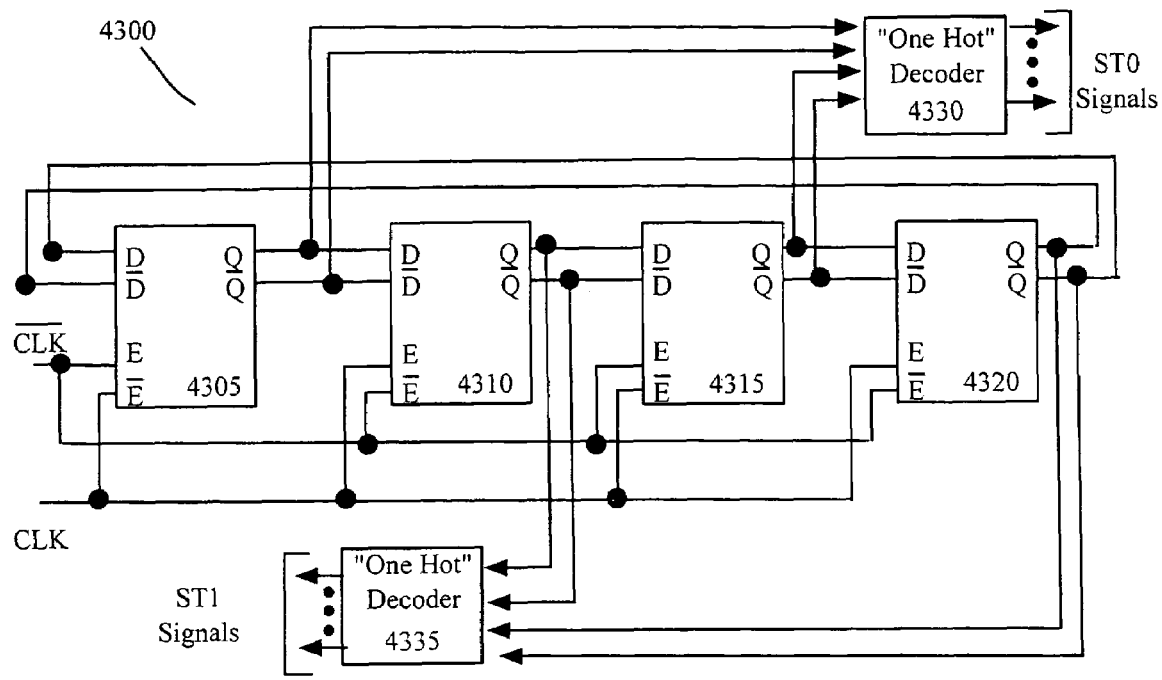
FIG. 43 illustrates an example of a CPL-implementation of a local sub-cycle signal generator that is used by some embodiments to generate the two sets of four one-hot signals.

FIG. 43 illustrates an example of a CPL-implementation of a local sub-cycle signal generator 4300 that is used by some embodiments to generate the two sets of four one-hot signals ST0 and ST1. This local sub-cycle signal generator is formed by four latches 4305-4320 that are connected as a pair of series connected master-slave latches. Given that the output of the fourth latch 4320 is fed back in a cross-coupled manner to the input of the first latch 4305, either latch in the master-slave arrangement can be viewed as the master latch, while the other latch can be viewed as the slave latch.

The latches 4305-4320 are either active high latches or active low latches. Also, as shown in FIG. 43, the true enable inputs of latches 4305 and 4315, and the complement enable inputs of latches 4310 and 4320, are driven by the $\overline{\text{CLK}}$ signal. The complement enable inputs of latches 4305 and 4315, and the true enable inputs of latches 4310 and 4320, are driven by the CLK signal.

As shown in FIG. 43, the outputs of latches 4305 and 4315 are supplied to the two-to-four one-hot decoder 4330, while the outputs of latches 4310 and 4320 are supplied to the two-to-four one-hot decoder 4335. In the CPL implementation illustrated in FIG. 43, each two-to-four decoder receives four input signals (representing two logical signals)

and produces eight output signals (representing four logical signals). As the two output signals of the two latches sequentially step through the values 00, 10, 11, 01, the one-hot decoder 4330 sequentially generates the four ST0 signals. Similarly, as the two output signals of the two latches sequentially step through the values 00, 10, 11, 01, the one-hot decoder 4335 sequentially generates the four ST1 signals. The signals ST0 and ST1 are offset by 90° as their inputs are offset by 90°.

B. Six "Loopered" Architecture

To implement a six loopered reconfigurable IC, some embodiments use an architecture that is a slightly modified version of the architectures described above for the four and eight loopered architectures. Specifically, in the six loopered architecture, these embodiments (1) store six configuration data sets for each sub-cycle configurable circuit, (2) use modified multi-tiered multiplexer structures for supplying configuration data sets to the configurable circuits, and (3) use a different clocking scheme to control the modified multi-tiered multiplexer structure.

Figure 44:
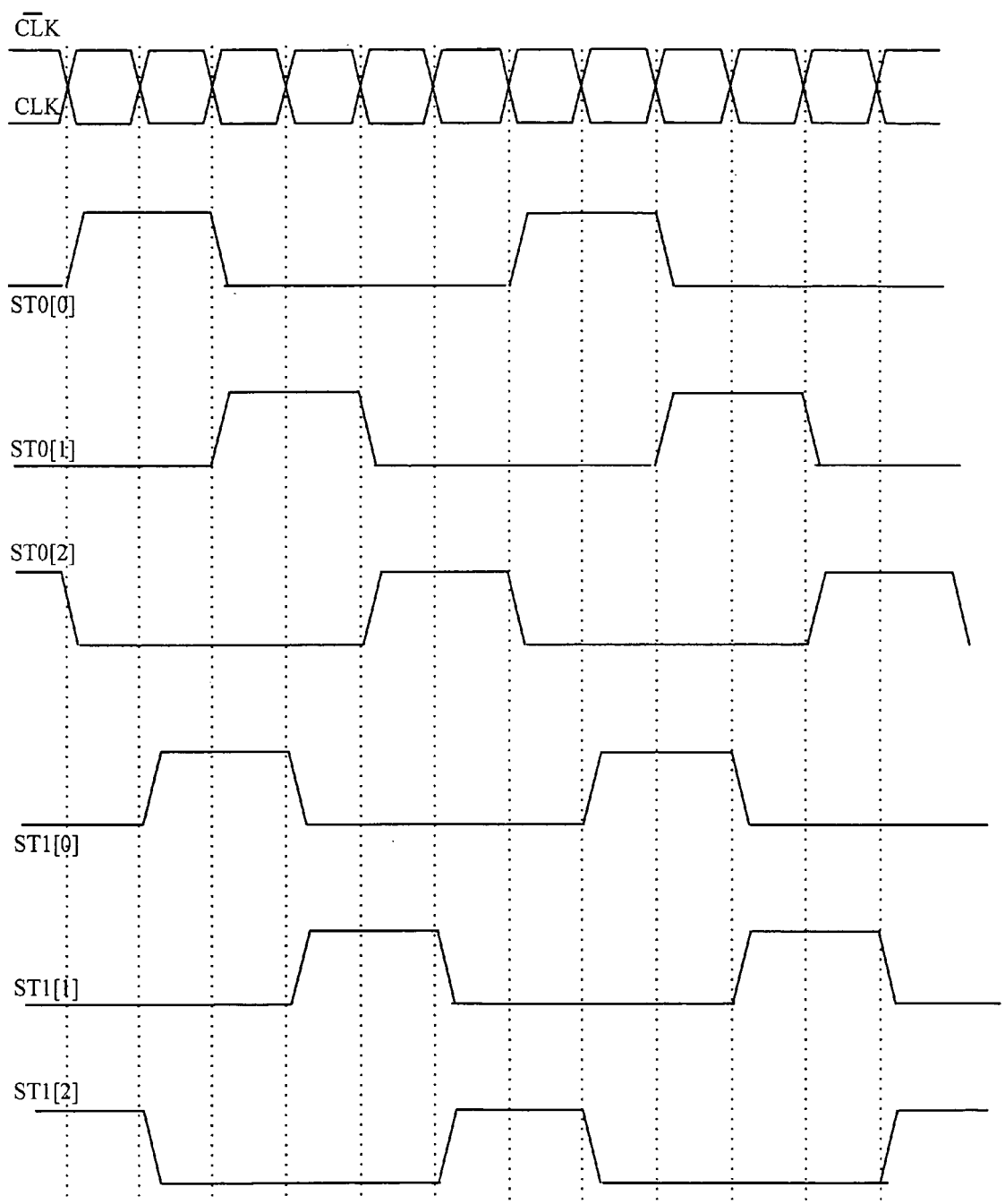
FIG. 44 illustrates the timing between the CLK signals and the two sets of three one-hot signals.

As mentioned above, some embodiments implement a four loopered design by using four storage elements 2605, two multiplexers 2640 and 2645, and two 90°-offset signals ST0 and ST1, to provide a configuration bit to a configurable circuit. To provide a configuration bit to a configurable circuit in a six loopered architecture, some embodiments use (1) six storage elements instead of four, (2) two multiplexers different than the multiplexers 2640 and 2645, and (3) two sets of three "one-hot" signals, ST0[0], ST0[1], ST0[2], ST1[0], ST1[1], and ST1[2], instead of two signals ST0 and ST1. Three one-hot signals are three signals that at most have only one signal active (e.g., high) at any given time. FIG. 44 illustrates an example of two sets of one-hot signals.

Figure 45:
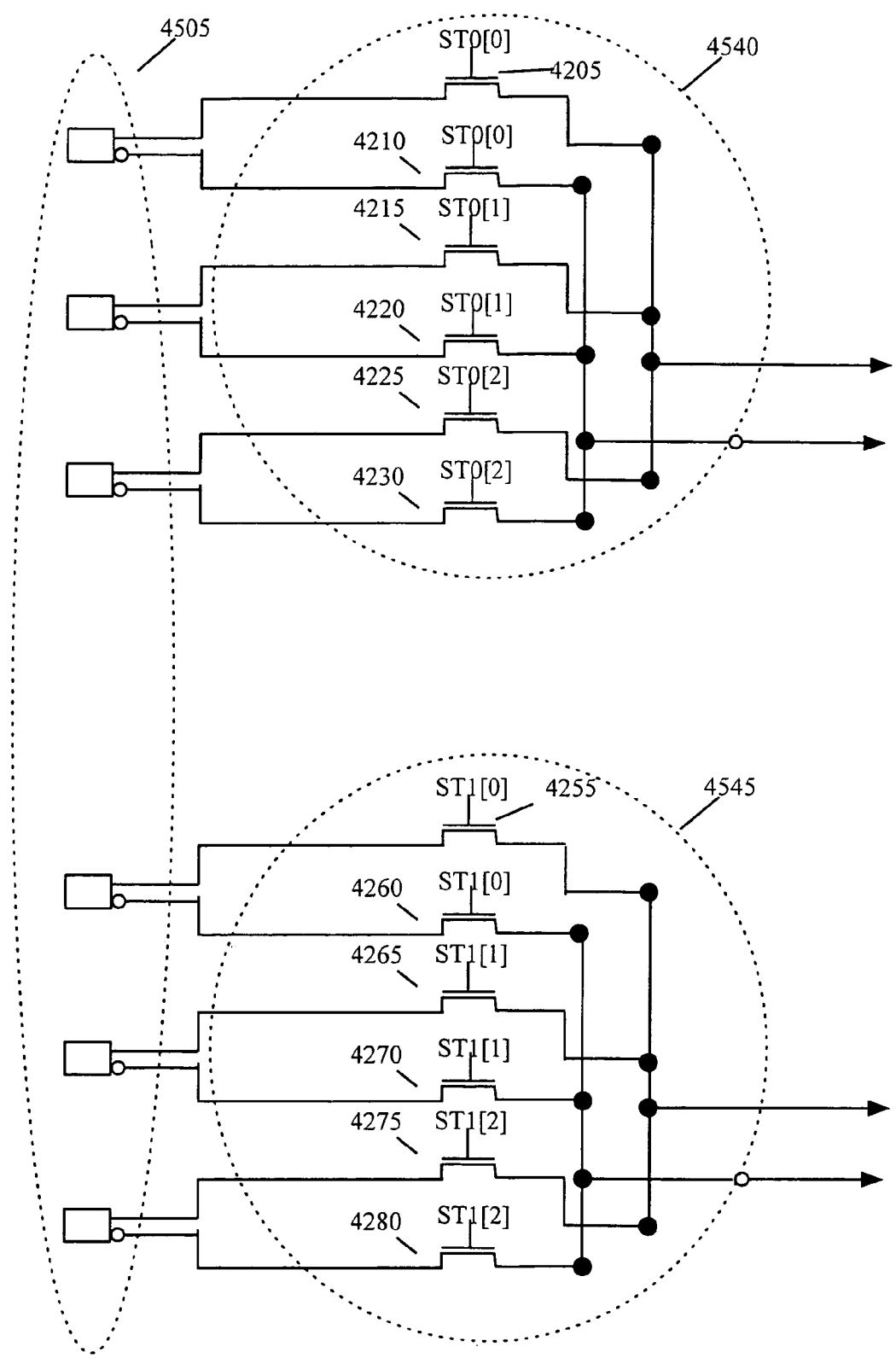
FIG. 45 illustrates an example of a CPL-implementation of six storage elements and two modified multiplexers and, which are driven by two sets of three "one-hot" signals.

FIG. 45 illustrates an example of a CPL-implementation of six storage elements 4505 and two modified multiplexers 4540 and 4545, which are driven by two sets of three "one-hot" signals ST0[0], ST0[1], ST0[2], ST1[0], ST1[1], and ST1[2]. In a six loopered architecture of some embodiments, these six storage elements 4505 and two modified multiplexers 4540 and 4545 replace the four storage elements 2605 and two multiplexers 2640 and 2645, in each of the circuits illustrated in FIGS. 26, 28, and 29.

The modified multiplexers 4540 and 4545 of FIG. 45 are similar to the modified multiplexers 4240 and 4245 of FIG. 42, except that each multiplexer 4540 or 4545 only includes three pairs of transistors, instead of four. Given the timing diagram of the ST0 and ST1 signals that is illustrated in FIG. 44, the modified multiplexers 4540 and 4545 operate in a time interleaved manner that provides the configuration bits stored in the storage cells. Specifically, given that the timing signals ST0 and ST1 are offset by 90°, one multiplexer always is providing a stable output of the contents of a storage cell, while the other multiplexer is switching between the contents of a pair of its storage cells. When the six loopered circuitry illustrated in FIG. 45 is used in the multi-tiered circuitry of FIGS. 26, 28, and 29, the interleaved outputting and switching operations are behind another multiplexer 2615 that is driven by signal CLK and its complement.

FIG. 44 illustrates the timing between the CLK signals and the two sets of three one-hot signals. Given this timing relationship, the multiplexer 2615 hides the switching operations of the multiplexers 4540 and 4545 by outputting, in each half CLK cycle, its input signal that comes from the multiplexer 4540 or 4545 that is providing the stable signal for that half cycle.

Figure 46:
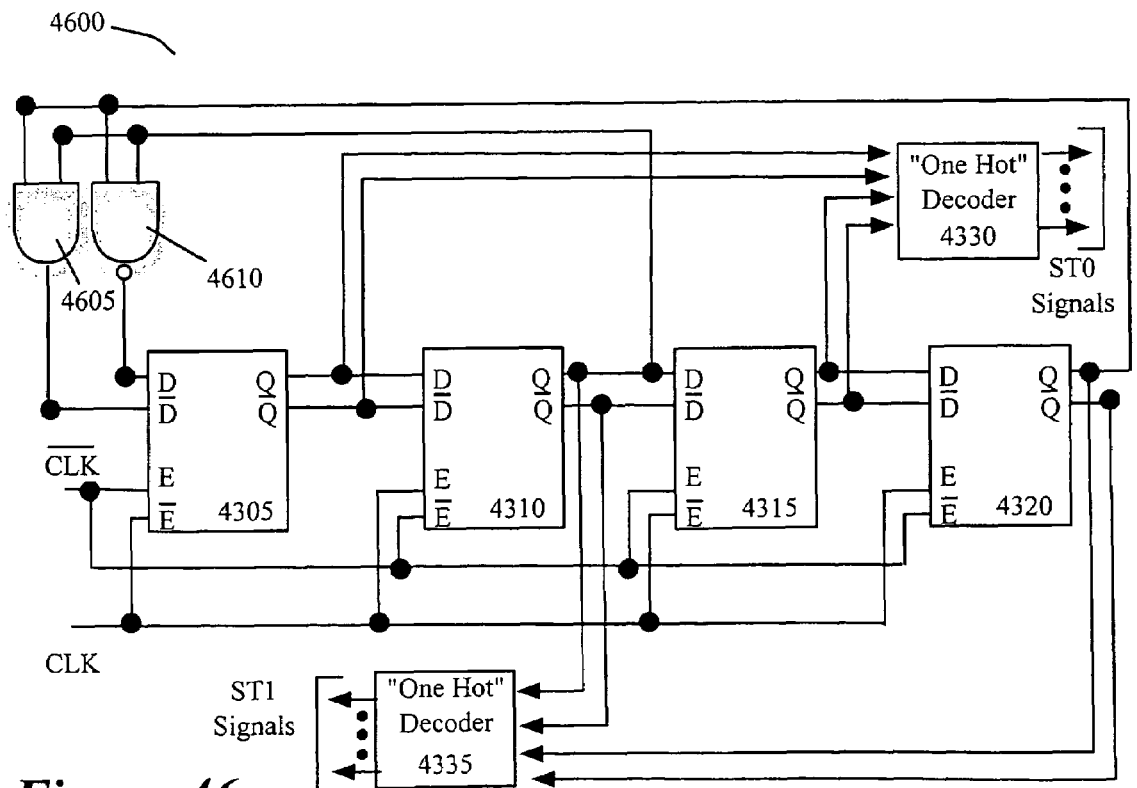
FIG. 46 illustrates an example of a CPL-implementation of a local sub-cycle signal generator that is used by some embodiments to generate the two sets of three one-hot signals.

FIG. 46 illustrates an example of a CPL-implementation of a local sub-cycle signal generator 4600 that is used by some embodiments to generate the two sets of three one-hot signals ST0 and ST1. This local sub-cycle signal generator 4600 is similar to the local sub-cycle signal generator 4300 of FIG. 43, except that it includes an AND gate 4605 and a NAND gate 4610.

The AND and NAND gates 4605 and 4610 each receives the Q outputs of the latches 4310 and 4320. Although not shown in FIG. 46, these output are regenerated from CPL-levels to full CMOS-levels before being supplied to these gates. The output of the AND and NAND gates 4605 and 4610 serve as a complementary signal pair, where the output of the AND gate is the true signal and the output of the NAND gate is the complement signal. This complementary signal pair is fed to the D-input of the first latch 4305 in an inverted manner. In particular, the AND gate 4605 output is fed to the $\overline{D}$ input of the first latch 4305, while the NAND gate 4610 output is fed to the D input of the first latch 4305.

The "AND'ing" and "NAND'ing" operation of gates 4605 and 4610 causes the output of the latches 4305 and 4315, and the input of the decoder 4330, to only cycle through the bit pair values 11, 01, and 10. It also causes the output of the latches 4310 and 4320, and the input of the decoder 4335, to only cycle through these three sets of values. These more restricted set of inputs to the decoders 4330 and 4335 cause these decoders to generate two sets of three one-hot signals, which are illustrated in FIG. 44.

C. Eight "Loopered" Architecture that can Run in Eight or Six Loopered Mode

Some embodiments provide an eight loopered architecture that can run in either an eight loopered mode or a six loopered mode. For instance, some embodiments employ an eight loopered architecture that uses the eight storage cells 4205 and the two multiplexers 4240 and 4245 of FIG. 42 to deliver each configuration bit to a configurable circuit. However, to provide the ability to run either in an eight loopered mode or a six loopered mode, these embodiments use variably configurable local sub-cycle signal generators that can generate either the four one-hot signals necessary for the eight loopered mode, or the three one-hot signals necessary for the six loopered mode.

Figure 47:
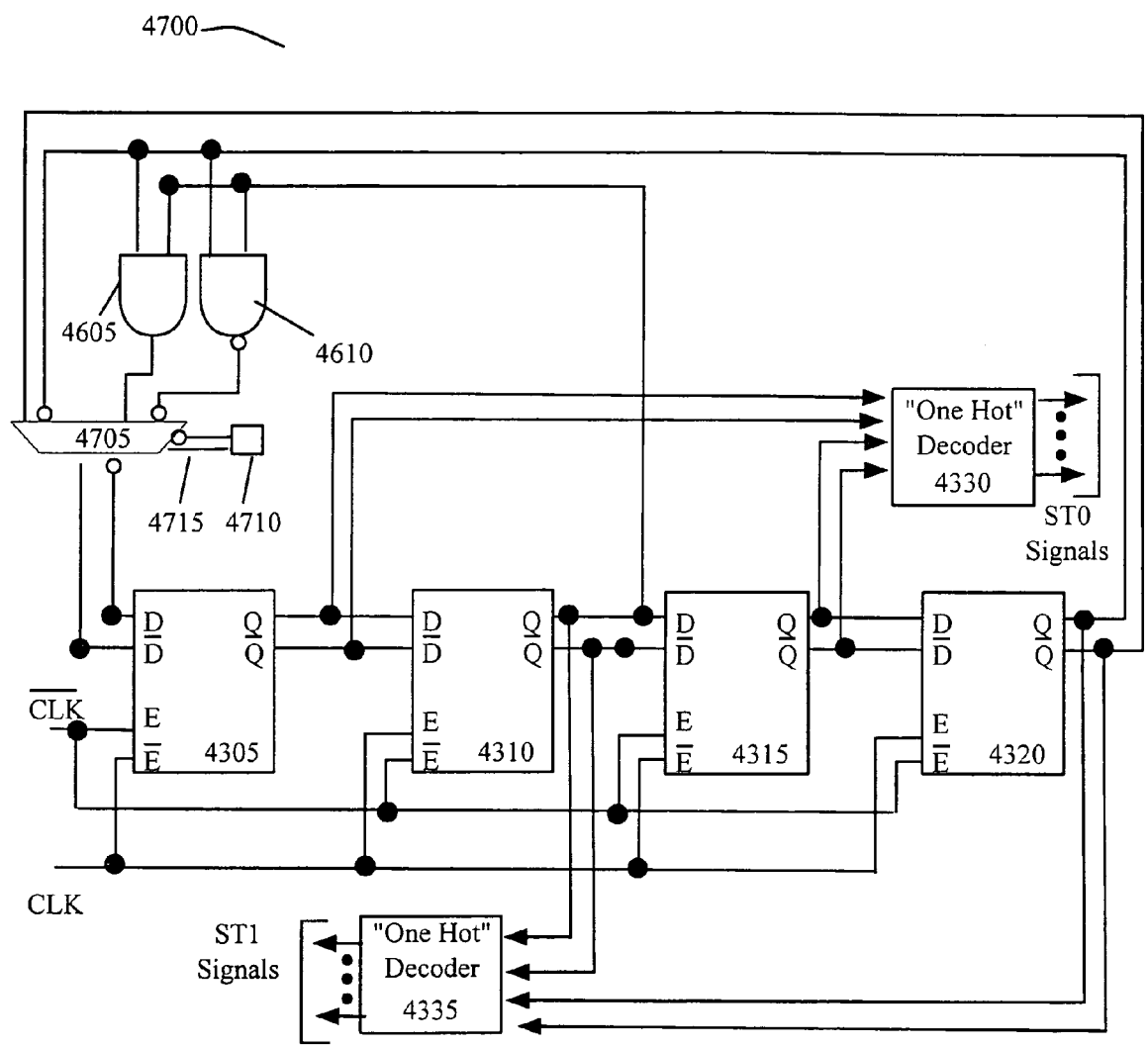
FIG. 47 illustrates an example of one such variable local sub-cycle signal generator of some embodiments of the invention.

FIG. 47 illustrates an example of one such variable local sub-cycle signal generator 4700 of some embodiments of the invention. The variable local signal generator 4700 is similar to the local sub-cycle signal generator 4600 of FIG. 46, except that it also includes a configurable two-to-one multiplexer 4705 in the feedback paths between the outputs of the latches 4310 and 4320 and the input of the first latch 4305. This two-to-one multiplexer 4705 allows the local sub-cycle signal generator 4700 to act either as the local sub-cycle signal generator 4300 for an eight loopered operation, or as the local sub-cycle signal generator 4600 for a six loopered operation.

Specifically, the select line 4715 of the multiplexer 4705 is tied to the output of the storage cells 4710, which stores the configuration of the multiplexer. When the configuration value is 0, the multiplexer 4705 connects the output of the fourth latch 4320 to the input of the first latch 4305 in a cross coupled manner. This results in the clock generator 4700 operating like the clock generator 4300, and producing two sets of four one-hot signals that allow the multiplexers 4240 and 4245 to operate in an eight loopered mode (i.e., to allow these multiplexers to loop through all eight storage elements 4205).

On the other hand, when the configuration value is 0, the multiplexer 4705 connects the output of the AND/NAND gates 4605 and 4610 to the input of the first latch 4305. This results in the clock generator 4700 operating like the clock generator 4600, and producing two sets of three one-hot signals that allow the multiplexers 4240 and 4245 to operate in a six loopered mode. In other words, the two sets of three one-hot signals cause the multiplexers 4240 and 4245 to loop through all six of the eight storage elements 4205. When these multiplexers are operating in the six loopered mode, some embodiments set the signals that drive the fourth pairs of transistors in these multiplexers to values that turn off these transistors (i.e., set the ST0[3] and ST1[3] to low).

A slight modification to the local sub-cycle signal generator 4700 would also allow this generator to generate sub-cycle signals ST0 and ST1 of FIG. 27, which, in turn, would allow the multiplexers 4240 and 4245 to operate in a four loopered mode (i.e., to allow these multiplexers to loop through four of the eight storage elements 4205). This modification entails (1) replacing the two-to-one multiplexer 4705 with a three-to-one multiplexer that also receives the inverted output of latch 4310, and (2) adding a circuit (e.g., an AND gate or a multiplexer) that can selectively feed a constant low signal into the latches 4315, to power down this latch and the latch 4320 during a four-loopered operation.

Figure 48:
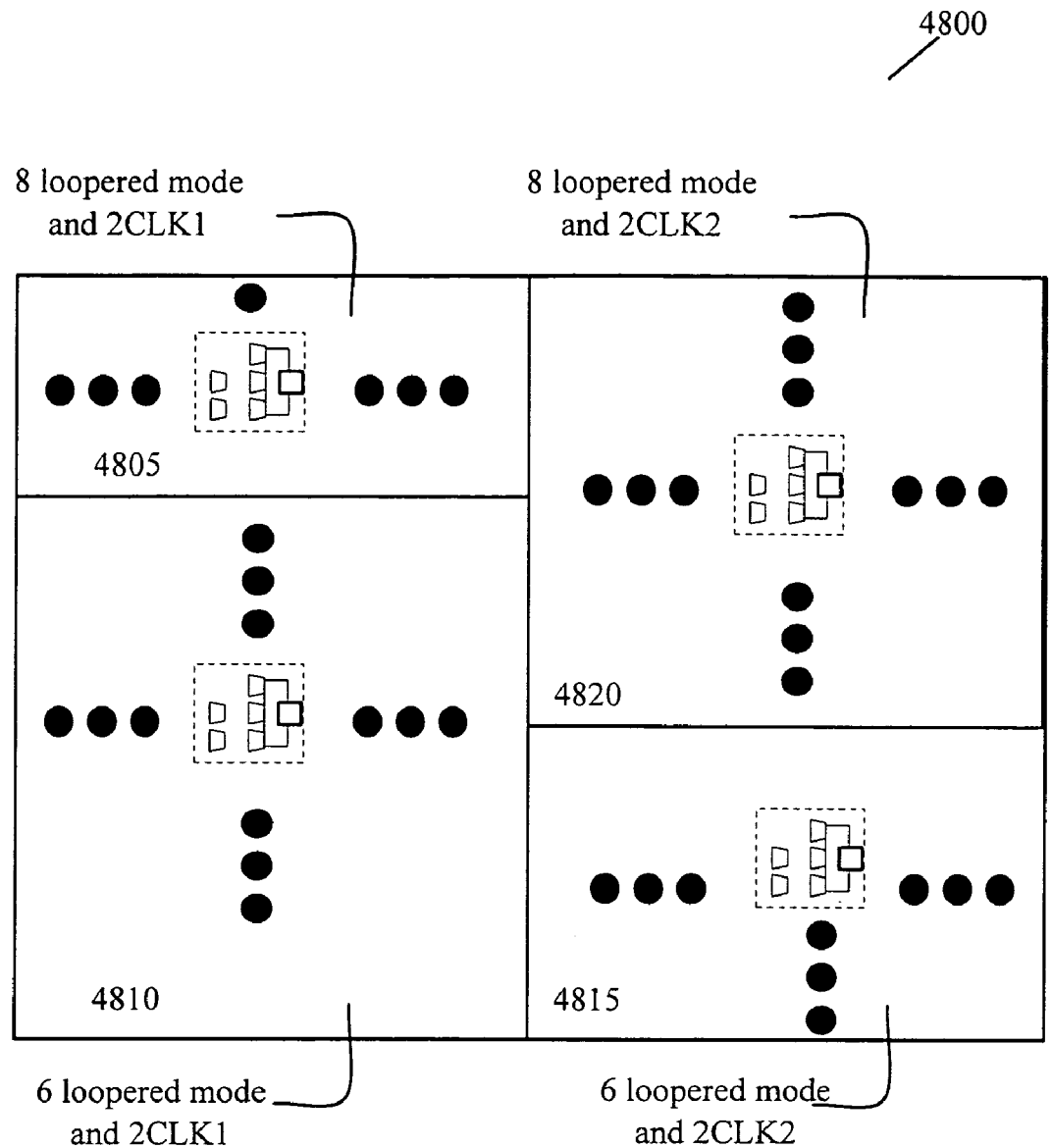
FIG. 48 illustrates the configurable IC of some embodiments that takes advantage of the variable local sub-cycle signal generator.

FIG. 48 illustrates the configurable IC 4800 of some embodiments that takes advantage of the variable local sub-cycle signal generator 4700. As shown in FIG. 48, the configurable IC 4800 has four sections 4805, 4810, 4815, and 4820 that operate in different loopered modes and different clock rates.

In some embodiments, each section of the configurable IC 4800 (1) includes eight storage elements 4205 for storing up to eight configuration values for each configuration bit supplied to a configurable circuit, and (2) two multiplexers 4240 and 4245 for reading each set of eight storage elements. Each tile in each section also includes two variably configurable local sub-cycle signal generators, like the clock generator 4700. Hence, by configuring the configurable local sub-cycle signal generators in each tile, each tile can be configured to operate in either a six loopered mode or an eight loopered mode.

As mentioned above by reference to FIG. 39, each local sub-cycle signal generator can base its operation on a different global clock signal. Accordingly, each tile can be configured to operate in different modes and different clock rates. For instance, FIG. 48 illustrates that (1) the tiles in section 4805 operate in an eight loopered mode that operates at a 2*CLK1 rate; (2) the tiles in section 4810 operate in a six loopered mode that operates at a 2*CLK1 rate; (3) the tiles in section 4815 operate in an eight loopered mode that operates at a 2*CLK2 rate; and (4) the tiles in section 4810 operate in a six loopered mode that operates at a 2*CLK2 rate. In this example, CLK1 has a frequency that is twice CLK2.

It is highly advantageous to have different sections of a reconfigurable IC operate at different reconfiguration rates through and/or through different reconfiguration sets. For instance, this ability allows the resources of the reconfigurable IC that implement a core user design to operate at a first rate and/or a first looperness mode, while the resources of the reconfigurable IC that implement the input/output interface of the design to operate at a second rate and/or a second looperness mode.

In some embodiments, the configurable IC that can operate in different loopered modes, has different number of storage elements for configurable circuits that are to operate in different loopered modes. For instance, when the configurable IC in these embodiments can operate in six and eight loopered modes, the configurable IC will have (1) a first set of tiles that have six storage elements for storing the configuration values for each configuration bit of the configurable circuits in the first set of tiles, and (2) a second set of tiles that have eight storage elements for storing the configuration values for each configuration bit of the configurable circuits in the second set of tiles.

VI. Alternative Two Tiered Structure for Retrieving Data

Several circuits described above utilize a two-tiered structure for retrieving data (e.g., configuration data, enable data, etc.) on a sub-cycle basis. Examples of such circuits are the circuits illustrated in FIGS. 26, 28, 29, 42, and 45. These circuits employ multiple storage elements 2625 that store multiple sets of data for multiple sub-cycles. They also include two tiers of multiplexers, where two two-to-one multiplexers (e.g., 2640 and 2645) form the first tier and one two-to-one multiplexer (e.g., 2615) forms the second tier. In different circuits, the two tiers of multiplexers might have intervening circuits between them, such as pull-up transistors, AND'ing transistors or gates, or even buffer circuits. The second-tier multiplexer runs at the clock rate CLK, while the first-tier multiplexers runs at half that rate. From the storage elements, these multiplexers together output data at a sub-cycle rate that is twice the clock rate CLK.

Figure 49:
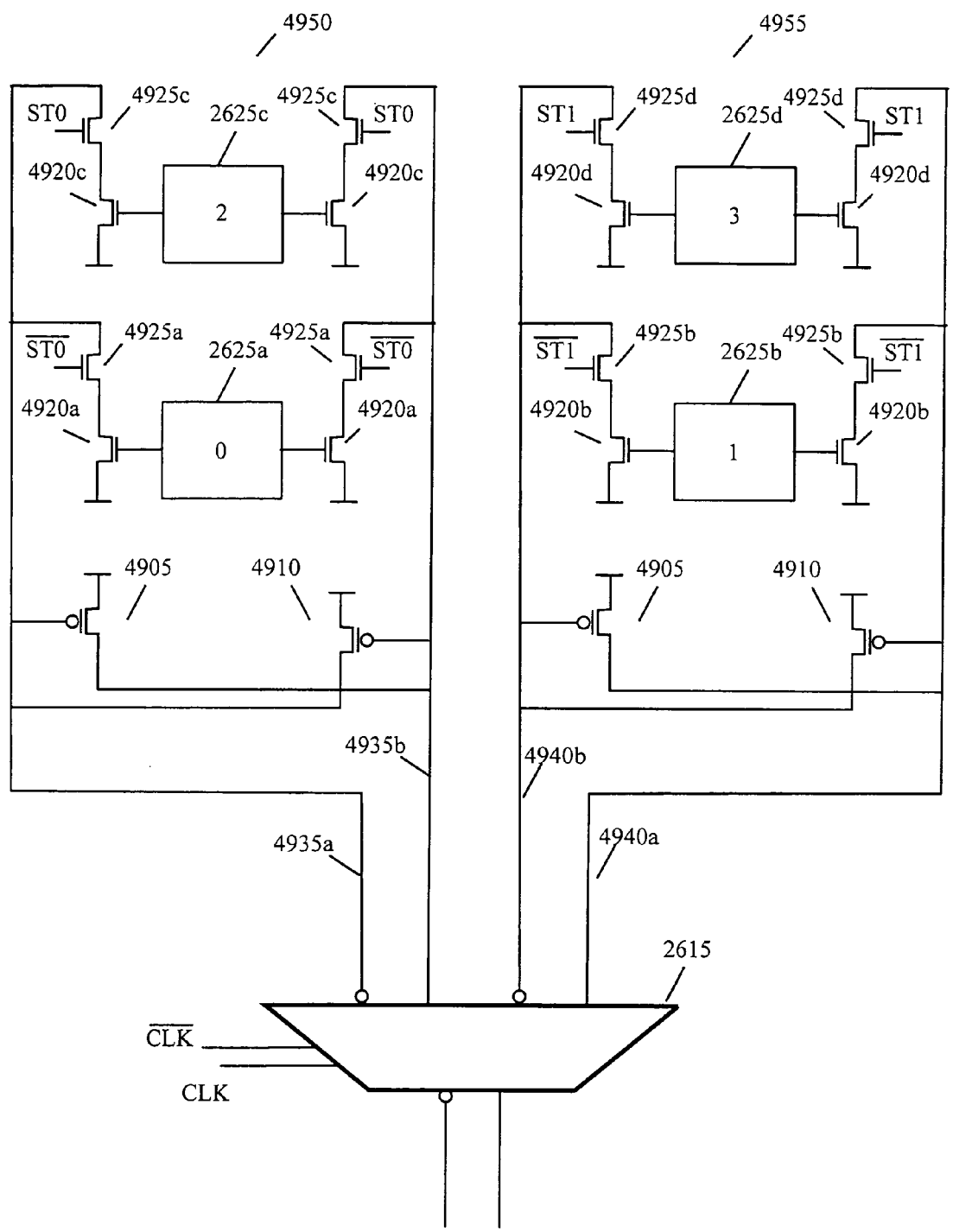
FIG. 49 illustrates an alternative two-tiered interconnect structure of the invention.

Some embodiments that use this two-tiered structure, build the first tier of multiplexers into the sensing circuitry of the storage elements 2625. FIG. 49 illustrates an example of such an approach. Specifically, this figure illustrates four storage elements 2625a-2625d that are arranged in two columns 4950 and 4955. Each storage element stores one logical bit of data in a complementary format. This data might be configuration data, enable data, or any other data that needs to be provided to the reconfigurable IC on a sub-cycle basis.

Each of the two complementary outputs of each storage element 2625 connects to a pair of stacked NMOS transistors 4920 and 4925. One transistor 4925 in each stacked pair of NMOS transistors is part of a first tier multiplexer structure. Specifically, in the two-tiered circuit structure 4900 illustrated in FIG. 49, the first tier multiplexer structure is formed by the eight transistors 4925, which receive the sub-cycle signals ST0, ST1, or the complements of these signals.

Through the sub-cycle signals ST0, ST1, $\overline{ST0}$, and $\overline{ST1}$, the multiplexer transistors 4925 selectively connect the NMOS transistors 4920 to the cross-coupled PMOS transistors 4905 and 4910. One pair of PMOS transistors 4905 and 4910 exists in each column and form part of the sensing amplifier for the storage elements in that column.

Specifically, when the NMOS transistors 4920 associated with one storage element 2625 connect the PMOS transistors 4905 and 4910, they form a level-converting sense amplifier. This amplifier then translates the signals stored in the storage element to the bit lines 4935 or 4940. The circuit 4900 provides the content of the storage elements through level-converting sense amplifiers, because, in some embodiments, the storage elements are storage cells that use a reduced voltage to store their data in order to conserve power. One such example of a reduced storage cell is provided in the United States Application entitled "Method and Apparatus for Reduced Power Cell," filed concurrently with the present application, with the Ser. No. 11/081,874.

The bit lines 4935 and 4940 connect to the two-to-one multiplexer 2615. As described above, this multiplexer is controlled through the clock signal CLK and its complement. Accordingly, when the clock signals CLK and $\overline{CLK}$, and the sub-cycle signals ST0, ST1, $\overline{ST0}$, and $\overline{ST1}$, have the timing relationship illustrated in FIG. 27, the first tier multiplexer (formed by the transistors 4925) and the second tier multiplexer 2615 operate to output data from the storage elements 2625 at a rate that is twice the rate of the clock signal CLK. This outputting is analogous to how the circuit 2600 outputs the S1 select signal on the sub-cycle basis that is illustrated in FIG. 27.

As mentioned above, the circuit 4900 of FIG. 49 can be used to provide any data on a sub-cycle basis, or any other reconfiguration cycle basis. By building the first multiplexer stage into the sense amplifier section of the storage elements, this circuit reduces signal path delay from the storage elements. Also, it operates with storage elements that have less power consumption. Furthermore, it reduces power consumption by using NMOS transistors 4920 that are not driven by full voltage levels, and sharing the PMOS transistors 4905 and 4910 that are necessary for level conversion between two storage elements.

The two-tiered structure of the circuit 4900 of FIG. 49 can be easily extended to six and eight loopered structures. For a six loopered structure, all that needs to be done is to stack another pair of storage elements above elements 2625c and 2625d, and to drive the transistors 4925 with the two sets of three one-hot signals illustrated in FIG. 44. Similarly, for an eight loopered structure, all that needs to be done is to stack two pairs of storage elements on top of elements 2625c and 2625d, and to drive the transistors 4925 with the two sets of four one-hot signals illustrated in FIG. 41.

One of ordinary skill will realize that other embodiments might implement the two tiered circuit 4900 differently. For instance, some embodiments might have one or more circuits between the multiplexer 2615 and the storage element section (i.e., the section with the storage elements 2625 and their sense amplifiers).

VII. Configurable IC and System

Some embodiments described above are implemented in configurable IC's that can compute configurable combinational digital logic functions on signals that are presented on the inputs of the configurable IC's. In some embodiments, such computations are state-less computations (i.e., do not depend on a previous state of a value). Some embodiments described above are implemented in configurable IC's that can perform a continuous function. In these embodiments, the configurable IC can receive a continuous function at its input, and in response, provide a continuous output at one of its outputs.

Figure 50:
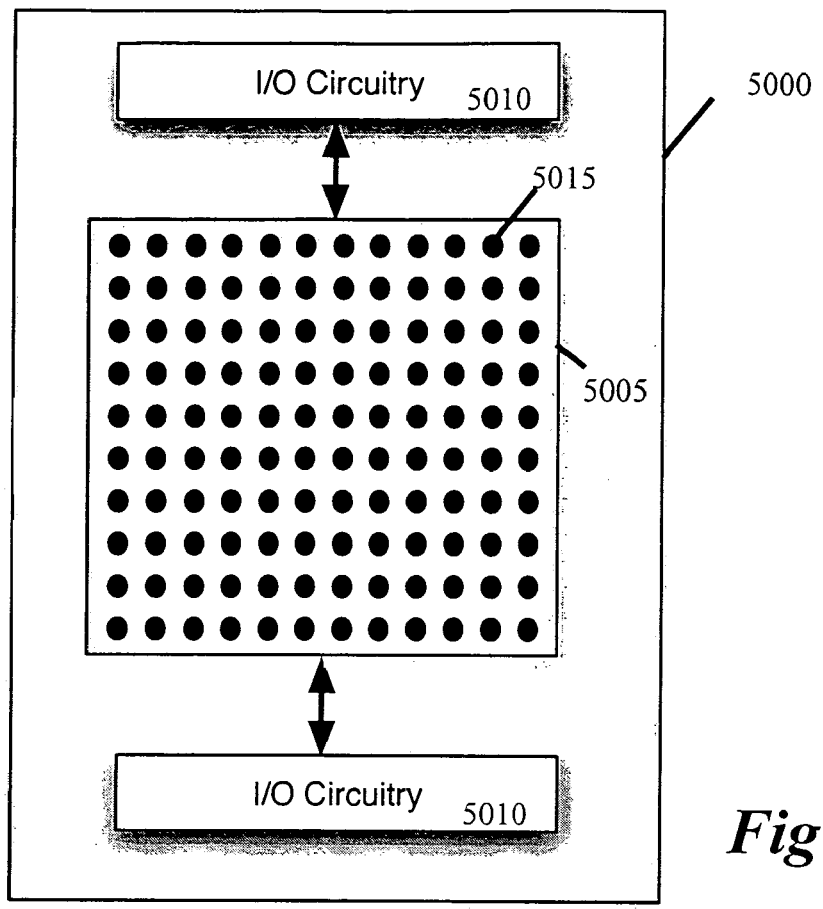
FIG. 50 illustrates a portion of a configurable IC of some embodiments of the invention.

FIG. 50 illustrates a portion of a configurable IC 5000 of some embodiments of the invention. As shown in this figure, this IC has a configurable circuit arrangement 5005 and I/O circuitry 5010. The configurable circuit arrangement 5005 can be any of the invention's configurable circuit arrangements that were described above. The I/O circuitry 5010 is responsible for routing data between the configurable nodes 5015 of the configurable circuit arrangement 5005 and circuits outside of this arrangement (i.e., circuits outside of the IC, or within the IC but outside of the configurable circuit arrangement 5005). As further described below, such data includes data that needs to be processed or passed along by the configurable nodes.

Figure 51:
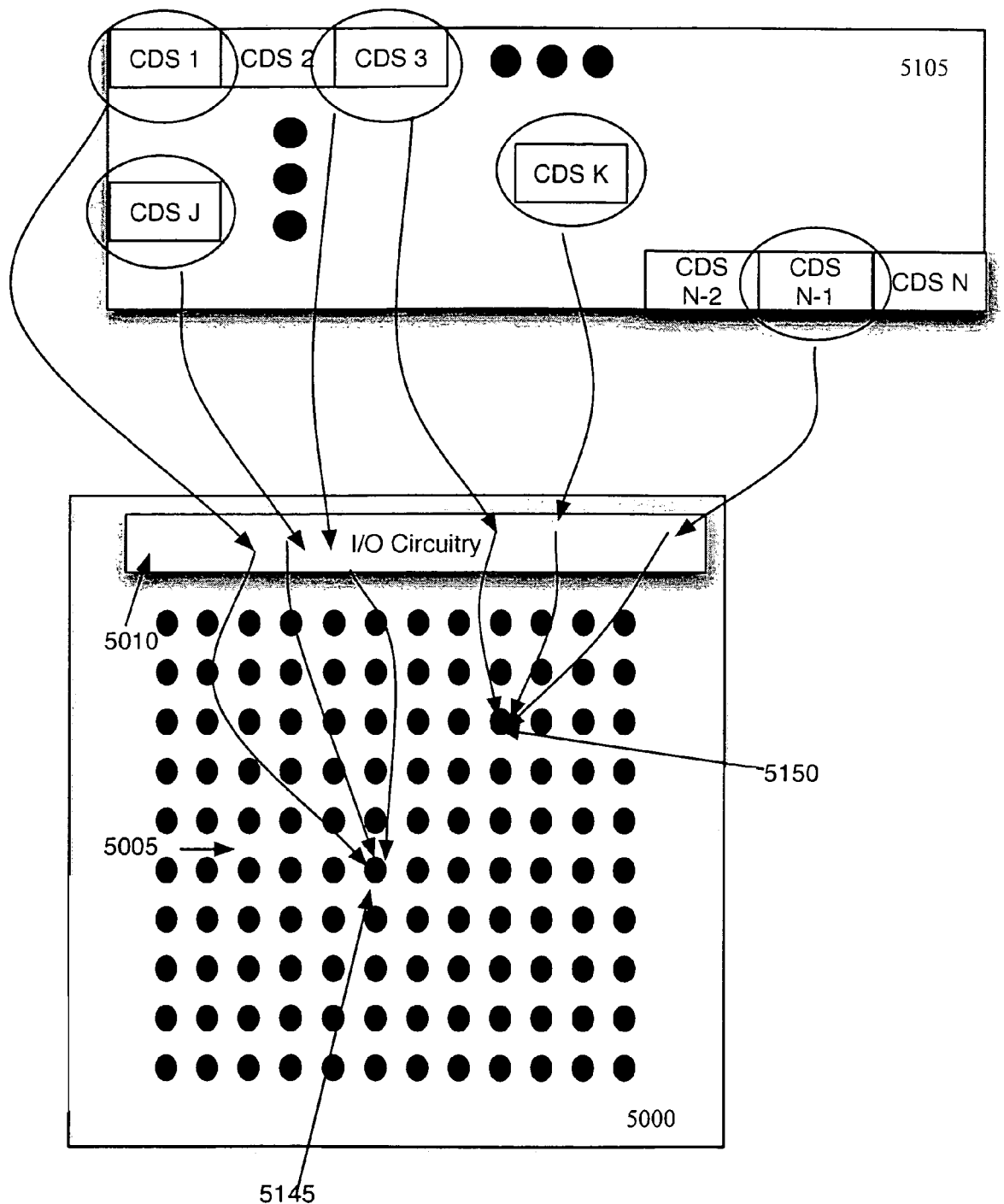
FIG. 51 illustrates a more detailed example of data between a configurable node and a configurable circuit arrangement that includes configuration data that configure the nodes to perform particular operations.

The data also includes in some embodiments configuration data that configure the nodes to perform particular operations. FIG. 51 illustrates a more detailed example of this. Specifically, this figure illustrates a configuration data pool 5105 for the configurable IC 5000. This pool includes N configuration data sets (CDS). As shown in FIG. 51, the input/output circuitry 5010 of the configurable IC 5000 routes different configuration data sets to different configurable nodes of the IC 5000. For instance, FIG. 51 illustrates configurable node 5145 receiving configuration data sets 1, 3, and J through the I/O circuitry, while configurable node 5150 receives configuration data sets 3, K, and N−1 through the I/O circuitry. In some embodiments, the configuration data sets are stored within each configurable node. Also, in some embodiments, a configurable node can store multiple configuration data sets so that it can reconfigure quickly by changing to another configuration data set. In some embodiments, some configurable nodes store only one configuration data set, while other configurable nodes store multiple such data sets.

Figure 52:
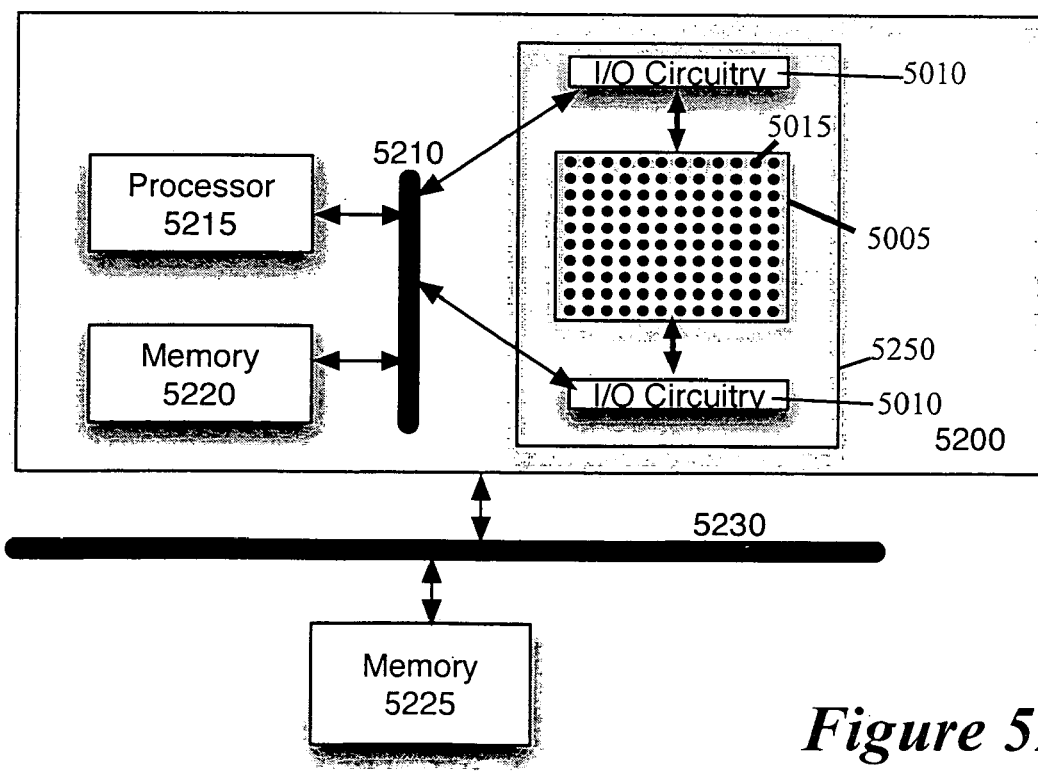
FIG. 52 illustrates a system on chip ("SoC") implementation of a configurable IC.

A configurable IC of the invention can also include circuits other than a configurable circuit arrangement and I/O circuitry. For instance, FIG. 52 illustrates a system on chip ("SoC") implementation of a configurable IC 5200. This IC has a configurable block 5250, which includes a configurable circuit arrangement 5105 and I/O circuitry 5110 for this arrangement. It also includes a processor 5215 outside of the configurable circuit arrangement, a memory 5220, and a bus 5210, which conceptually represents all conductive paths between the processor 5215, memory 5220, and the configurable block 5250. As shown in FIG. 52, the IC 5200 couples to a bus 5230, which communicatively couples the IC to other circuits, such as an off-chip memory 5225. Bus 5230 conceptually represents all conductive paths between the components of the IC 5200.

This processor 5215 can read and write instructions and/or data from an on-chip memory 5220 or an offchip memory 5225. The processor 5215 can also communicate with the configurable block 5250 through memory 5220 and/or 5225 through buses 5210 and/or 5230. Similarly, the configurable block can retrieve data from and supply data to memories 5220 and 5225 through buses 5210 and 5230.

Figure 53:
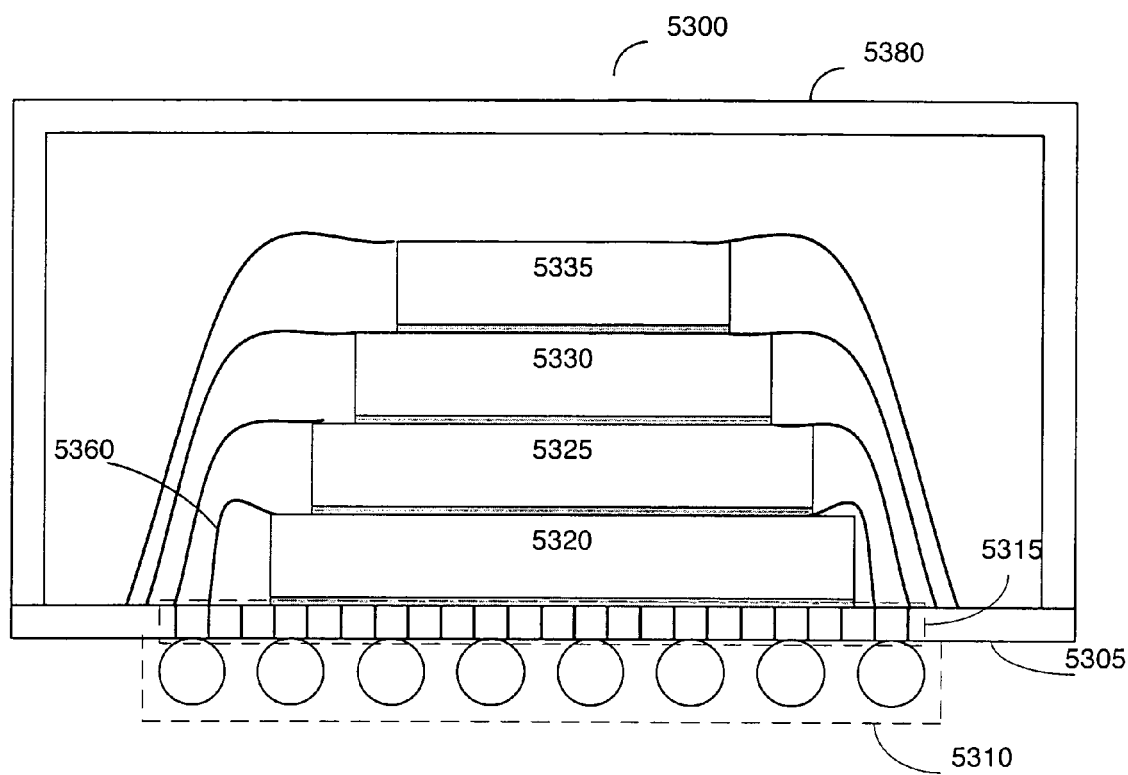
FIG. 53 illustrates an embodiment that employs a system in package ("SiP") implementation for a configurable IC.

Instead of, or in conjunction with, the system on chip ("SoC") implementation for a configurable IC, some embodiments might employ a system in package ("SiP") implementation for a configurable IC. FIG. 53 illustrates one such SiP 5300. As shown in this figure, SiP 5300 includes four IC's 5320, 5325, 5330, and 5335 that are stacked on top of each other on a substrate 5305. At least one of these IC's is a configurable IC that includes a configurable block, such as the configurable block 5250 of FIG. 52. Other IC's might be other circuits, such as processors, memory, etc.

As shown in FIG. 53, the IC communicatively connects to the substrate 5305 (e.g., through wire bondings 5360). These wire bondings allow the IC's 5320-5335 to communicate with each other without having to go outside of the SiP 5300. In some embodiments, the IC's 5320-5335 might be directly wire-bonded to each other in order to facilitate communication between these IC's. Instead of, or in conjunction with the wire bondings, some embodiments might use other mechanisms to communicatively couple the IC's 5320-5335 to each other.

As further shown in FIG. 53, the SiP includes a ball grid array ("BGA") 5310 and a set of vias 5315. The BGA 5310 is a set of solder balls that allows the SiP 5300 to be attached to a printed circuit board ("PCB"). Each via connects a solder ball in the BGA 5310 on the bottom of the substrate 5305, to a conductor on the top of the substrate 5305.

The conductors on the top of the substrate 5305 are electrically coupled to the IC's 5320-5335 through the wire bondings. Accordingly, the IC's 5320-5335 can send and receive signals to and from circuits outside of SiP 5300 through the wire bondings, the conductors on the top of the substrate 5305, the set of vias 5315, and BGA 5310. Instead of a BGA, other embodiments might employ other structures (e.g., a pin grid array) to connect a SiP to circuits outside of the SiP. As shown in FIG. 53, a housing 5380 encapsulates the substrate 5305, the BGA 5310, the set of vias 5315, the IC's 5320-5335, the wire bondings to form the SiP 5300. This and other SiP structures are further described in United States Patent Application entitled "Method for Manufacturing a Programmable System in Package," filed concurrently herewith with the Ser. No. 11/081,820.

Figure 54:
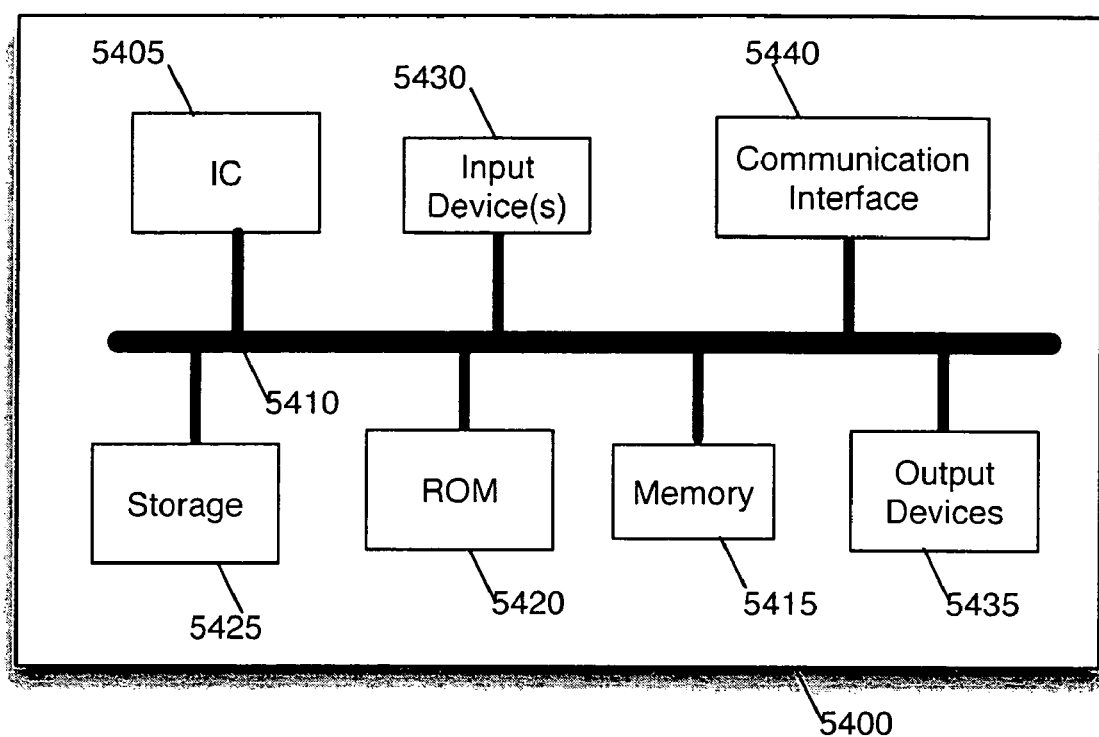
FIG. 54 conceptually illustrates a more detailed example of a computing system that has an IC, which includes one of the invention's configurable circuit arrangements.

FIG. 54 conceptually illustrates a more detailed example of a computing system 5400 that has an IC 5405, which includes one of the invention's configurable circuit arrangements that were described above. The system 5400 can be a stand-alone computing or communication device, or it can be part of another electronic device. As shown in FIG. 54, the system 5400 not only includes the IC 5405, but also includes a bus 5410, a system memory 5415, a read-only memory 5420, a storage device 5425, input devices 5430, output devices 5435, and communication interface 5440.

The bus 5410 collectively represents all system, peripheral, and chipset interconnects (including bus and non-bus interconnect structures) that communicatively connect the numerous internal devices of the system 5400. For instance, the bus 5410 communicatively connects the IC 5410 with the read-only memory 5420, the system memory 5415, and the permanent storage device 5425.

From these various memory units, the IC 5405 receives data for processing and configuration data for configuring the IC's configurable logic and/or interconnect circuits. When the IC 5405 has a processor, the IC also retrieves from the various memory units instructions to execute. The read-only-memory (ROM) 5420 stores static data and instructions that are needed by the IC 5410 and other modules of the system 5400. The storage device 5425, on the other hand, is read-and-write memory device. This device is a non-volatile memory unit that stores instruction and/or data even when the system 5400 is off. Like the storage device 5425, the system memory 5415 is a read-and-write memory device. However, unlike storage device 5425, the system memory is a volatile read-and-write memory, such as a random access memory. The system memory stores some of the instructions and/or data that the IC needs at runtime.

The bus 5410 also connects to the input and output devices 5430 and 5435. The input devices enable the user to enter information into the system 5400. The input devices 5430 can include touch-sensitive screens, keys, buttons, keyboards, cursor-controllers, microphone, etc. The output devices 5435 display the output of the system 5400.

Finally, as shown in FIG. 54, bus 5410 also couples system 5400 to other devices through a communication interface 5440. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

I claim:

1. A configurable integrated circuit (IC) comprising:
    a) a plurality of configurable circuits;
    b) a plurality of storage circuits, each storage circuit comprising (i) a plurality of storage elements for storing data for the configurable circuits and (ii) an output circuit for outputting data stored in the storage elements;
    c) said output circuit comprising a first set of interconnects for receiving at least a first repeating periodic signal and a set of sense amplifiers for sensing the data stored in the storage elements, said first set of interconnects further for periodically outputting data from at least two storage elements to the configurable circuits.

2. The configurable IC of claim 1 further comprising a second set of interconnects connected to the output circuit, said second set of interconnects for receiving at least a second repeating periodic signal.

3. The configurable IC of claim 2, wherein the first and second periodic signals have different frequencies.

4. The configurable IC of claim 2, wherein the first periodic signal has a first frequency and the second periodic signal has a second frequency, said first and second sets of interconnects for providing stored data from the storage elements to the configurable circuits at a third frequency.

5. The configurable IC of claim 2, wherein the second set of interconnects directly connects to the output circuit.

6. The configurable IC of claim 1, wherein each sense amplifier is a level converting sense amplifier.

7. The configurable IC of claim 6, wherein each sense amplifier is level converting because the storage elements store data at a reduced voltage level.

8. The configurable IC of claim 1, wherein at least one sense amplifier is for controllably sensing the data stored in a plurality of storage elements.

9. The configurable IC of claim 8, wherein each sense amplifier controllably connects to a storage element through the interconnects in the first set of interconnects.

10. The configurable IC of claim 8, wherein the set of sense amplifiers comprises a plurality of sense amplifiers.

11. The configurable IC of claim 1, wherein the data is configuration data for configuring the configurable circuits.

12. An electronic device comprising:
    a configurable integrated circuit (IC) comprising:
        a plurality of configurable circuits;
        a plurality of storage circuits, each storage circuit comprising (i) a plurality of storage elements for storing data for the configurable circuits and (ii) an output circuit for outputting data stored in the storage elements;
        said output circuit comprising a first set of interconnects for receiving at least a first repeating periodic signal and a set of sense amplifiers for sensing the data stored in the storage elements, said first set of interconnects further for periodically outputting data from at least two storage elements to the configurable circuits.

13. The electronic device of claim 12, wherein the configurable IC further comprises a second set of interconnects connected to the output circuit, said second set of interconnects for receiving at least a second repeating periodic signal.

14. The electronic device of claim 13, wherein the first and second periodic signals have different first and second frequencies.

15. The electronic device of claim 14, said first and second sets of interconnects for providing stored data from the storage elements to the configurable circuits at a third frequency.

16. The electronic device of claim 13, wherein the second set of interconnects directly connects to the output circuit.

17. The electronic device of claim 12, wherein at least one sense amplifier is for controllably sensing the data stored in a plurality of storage elements.

18. The electronic device of claim 17, wherein each sense amplifier controllably connects to a storage element through the interconnects in the first set of interconnects.

19. A configurable integrated circuit (IC) comprising:
   a) a plurality of configurable circuits;
   b) a plurality of storage circuits, each storage circuit comprising (i) a plurality of storage elements for storing data for the configurable circuits and (ii) a sense amplifier for outputting data stored in the storage elements;
   c) said sense amplifier comprising first set of a interconnects for receiving at least a first repeating periodic signal and for periodically outputting data from at least two storage elements to the configurable circuits.

20. The configurable IC of claim 19, wherein the data is configuration data for configuring the configurable circuits.

21. The configurable IC of claim 20, wherein the configurable IC is a reconfigurable IC, wherein a configurable circuit receives at least two different configuration data sets at a particular frequency related to the frequency of the first periodic signal.

22. A configurable integrated circuit (IC) comprising:
   a) a plurality of configurable circuits;
   b) a plurality of storage circuits, each storage circuit comprising (i) a plurality of storage elements for storing data for the configurable circuits and (ii) an output circuit for outputting data stored in the storage elements;
   c) said output circuit comprising a first set of interconnects for receiving at least a first repeating periodic signal and for periodically outputting data from at least two storage elements to the configurable circuits;
   d) a second set of interconnects connected to the output circuit, said second set of interconnects for receiving at least a second repeating periodic signal;
   e) a set of intervening circuits between the second set of interconnects and the output circuit.

23. The configurable IC of claim 22, wherein the first and second periodic signals have different first and second frequencies.

24. The configurable IC of claim 23, said first and second sets of interconnects for providing stored data from the storage elements to the configurable circuits at a third frequency.

25. The configurable IC of claim 22, wherein the intervening circuits include a set of sense amplifiers for sensing the data stored in the storage elements.

26. An electronic device comprising:
   a configurable integrated circuit (IC) comprising:
      a plurality of configurable circuits;
      a plurality of storage circuits, each storage circuit comprising (i) a plurality of storage elements for storing data for the configurable circuits and (ii) an output circuit for outputting data stored in the storage elements;
      said output circuit comprising a first set of interconnects for receiving at least a first repeating periodic signal and for periodically outputting data from at least two storage elements to the configurable circuits;
      a second set of interconnects connected to the output circuit, said second set of interconnects for receiving at least a second repeating periodic signal;
      a set of intervening circuits between the second set of interconnects and the output circuit.

27. The electronic device of claim 26, wherein the first and second periodic signals have different first and second frequencies, said first and second sets of interconnects for providing stored data from the storage elements to the configurable circuits at a third frequency.

28. An electronic device comprising:
   a configurable integrated circuit (IC) comprising:
      a plurality of configurable circuits;
      a plurality of storage circuits, each storage circuit comprising (i) a plurality of storage elements for storing data for the configurable circuits and (ii) a sense amplifier for outputting data stored in the storage elements;
      said sense amplifier comprising a first set of interconnects for receiving at least a repeating periodic signal and for periodically outputting data from at least two storage elements to the configurable circuits.

* * * * *